US010112198B2

(12) United States Patent
Chang et al.

(10) Patent No.: US 10,112,198 B2
(45) Date of Patent: Oct. 30, 2018

(54) COLLECTOR ARCHITECTURE LAYOUT DESIGN

(71) Applicant: Academia Sinica, Taipei (TW)

(72) Inventors: Ying-Chih Chang, Taipei (TW); Jr-Ming Lai, Taipei (TW); Jen-Chia Wu, Magong (TW)

(73) Assignee: Academia Sinica, Taipei (TW)

( * ) Notice: Subject to any disclaimer, the term of this patent is extended or adjusted under 35 U.S.C. 154(b) by 155 days.

(21) Appl. No.: 14/836,390

(22) Filed: Aug. 26, 2015

(65) Prior Publication Data

US 2016/0059234 A1 Mar. 3, 2016

Related U.S. Application Data

(60) Provisional application No. 62/042,079, filed on Aug. 26, 2014.

(51) Int. Cl.

*B81B 1/00* (2006.01)
*B01L 3/00* (2006.01)
*B01F 5/00* (2006.01)

(52) U.S. Cl.

CPC . *B01L 3/502753* (2013.01); *B01L 2200/0652* (2013.01); *B01L 2200/0668* (2013.01); *B01L 2300/08* (2013.01); *B01L 2300/0809* (2013.01); *B01L 2300/16* (2013.01); *B01L 2400/086* (2013.01)

(58) Field of Classification Search

CPC ..... B01L 2200/0652; B01L 2200/0668; B01L 2300/08; B01L 2300/0809; B01L 2300/16; B01L 2400/086; B01L 3/502753

See application file for complete search history.

(56) References Cited

U.S. PATENT DOCUMENTS

| | | | |
|---|---|---|---|
| 3,784,015 | A | 1/1974 | Kasten |
| 5,554,686 | A | 9/1996 | Frisch, Jr. et al. |
| 5,646,001 | A | 7/1997 | Terstappen et al. |
| 5,707,799 | A | 1/1998 | Hansmann et al. |
| 5,837,115 | A | 11/1998 | Austin et al. |
| 5,842,787 | A | 12/1998 | Kopf-Sill et al. |
| 5,885,470 | A | 3/1999 | Parce et al. |
| 5,952,173 | A | 9/1999 | Hansmann et al. |
| 6,039,897 | A | 3/2000 | Lochhead et al. |
| 6,046,295 | A | 4/2000 | Frisch, Jr. et al. |
| 6,153,113 | A | 11/2000 | Goodrich et al. |

(Continued)

FOREIGN PATENT DOCUMENTS

| | | | |
|---|---|---|---|
| CN | 1646912 | A | 7/2005 |
| CN | 101765762 | A | 6/2010 |

(Continued)

OTHER PUBLICATIONS

Ananthanarayanan, et al. Neural stem cell adhesion and proliferation on phospholipid bilayers functionalized with RGD peptides. Biomaterials, Elsevier Science Publishers BV., Barking GB, vol. 31, No. 33, Nov. 1, 2010, pp. 8706-8715.

(Continued)

*Primary Examiner* — Jennifer Wecker

(74) *Attorney, Agent, or Firm* — Wilson Sonsini Goodrich & Rosati

(57) ABSTRACT

The disclosure provides for compositions and methods for the collection of rare cells using an interspersed microstructure design.

24 Claims, 26 Drawing Sheets

Specification includes a Sequence Listing.

(56) References Cited

U.S. PATENT DOCUMENTS

| | | | |
|---|---|---|---|
| 6,271,309 | B1 | 8/2001 | Roberts et al. |
| 6,280,622 | B1 | 8/2001 | Goodrich et al. |
| 6,322,683 | B1 | 11/2001 | Wolk et al. |
| 6,361,749 | B1 | 3/2002 | Terstappen et al. |
| 6,365,362 | B1 | 4/2002 | Terstappen et al. |
| 6,372,542 | B1 | 4/2002 | Martin et al. |
| 6,562,616 | B1 | 5/2003 | Toner et al. |
| 6,613,525 | B2 | 9/2003 | Nelson et al. |
| 6,620,627 | B1 | 9/2003 | Liberti et al. |
| 6,623,982 | B1 | 9/2003 | Liberti et al. |
| 6,632,652 | B1 | 10/2003 | Austin et al. |
| 6,645,731 | B2 | 11/2003 | Terstappen et al. |
| 6,685,841 | B2 | 2/2004 | Lopez et al. |
| 6,699,952 | B2 | 3/2004 | Chaikof et al. |
| 6,790,366 | B2 | 9/2004 | Terstappen et al. |
| 6,844,028 | B2 | 1/2005 | Mao et al. |
| 6,887,578 | B2 | 5/2005 | Gleason et al. |
| 6,890,426 | B2 | 5/2005 | Terstappen et al. |
| 6,955,738 | B2 | 10/2005 | Derand et al. |
| 6,960,449 | B2 | 11/2005 | Wang et al. |
| 7,005,493 | B2 | 2/2006 | Huang et al. |
| 7,056,657 | B2 | 6/2006 | Terstappen et al. |
| 7,067,194 | B2 | 6/2006 | Mao et al. |
| 7,117,807 | B2 | 10/2006 | Bohn, Jr. et al. |
| 7,150,812 | B2 | 12/2006 | Huang et al. |
| 7,190,818 | B2 | 3/2007 | Ellis et al. |
| 7,229,760 | B2 | 6/2007 | Zohlnhofer et al. |
| 7,276,170 | B2 | 10/2007 | Oakey et al. |
| 7,282,350 | B2 | 10/2007 | Rao et al. |
| 7,318,902 | B2 | 1/2008 | Oakey et al. |
| 7,332,288 | B2 | 2/2008 | Terstappen et al. |
| 7,368,163 | B2 | 5/2008 | Huang et al. |
| 7,374,944 | B2 | 5/2008 | Thompson et al. |
| 7,428,325 | B2 | 9/2008 | Douglass et al. |
| 7,431,969 | B2 | 10/2008 | Gleason et al. |
| 7,442,515 | B2 | 10/2008 | Ratner et al. |
| 7,472,794 | B2 | 1/2009 | Oakey et al. |
| 7,485,343 | B1 | 2/2009 | Branson et al. |
| 7,501,157 | B2 | 3/2009 | Mao et al. |
| 7,531,120 | B2 | 5/2009 | Van et al. |
| 7,579,077 | B2 | 8/2009 | Dubrow et al. |
| 7,588,550 | B2 | 9/2009 | Leonard et al. |
| 7,629,029 | B2 | 12/2009 | Mao et al. |
| 7,687,241 | B2 | 3/2010 | Chen |
| 7,695,775 | B2 | 4/2010 | Kobrin et al. |
| 7,713,689 | B2 | 5/2010 | Chilkoti |
| 7,723,112 | B2 | 5/2010 | Clarke et al. |
| 7,727,399 | B2 | 6/2010 | Leonard et al. |
| 7,735,652 | B2 | 6/2010 | Inglis et al. |
| 7,736,891 | B2 | 6/2010 | Nelson et al. |
| 7,777,010 | B2 | 8/2010 | Logtenberg |
| 7,783,098 | B2 | 8/2010 | Douglass et al. |
| 7,785,810 | B2 | 8/2010 | Chen |
| RE41,762 | E | 9/2010 | Lopez et al. |
| 7,815,922 | B2 | 10/2010 | Chaney et al. |
| 7,846,393 | B2 | 12/2010 | Tai et al. |
| 7,846,445 | B2 | 12/2010 | Schellenberger et al. |
| 7,846,743 | B2 | 12/2010 | Tai et al. |
| 7,850,633 | B2 | 12/2010 | Leonard et al. |
| 7,855,068 | B2 | 12/2010 | Cao |
| 7,855,279 | B2 | 12/2010 | Schellenberger et al. |
| 7,863,012 | B2 | 1/2011 | Rao et al. |
| 7,879,444 | B2 | 2/2011 | Jiang et al. |
| RE42,249 | E | 3/2011 | Lopez et al. |
| 7,901,950 | B2 | 3/2011 | Connelly et al. |
| RE42,315 | E | 5/2011 | Lopez et al. |
| 7,955,704 | B2 | 6/2011 | Lowery et al. |
| 7,960,166 | B2 | 6/2011 | Vacanti et al. |
| 7,973,136 | B2 | 7/2011 | Lazar et al. |
| 7,981,688 | B2 | 7/2011 | Stayton et al. |
| 7,985,475 | B2 | 7/2011 | Dubrow |
| 7,988,840 | B2 | 8/2011 | Huang et al. |
| 7,993,821 | B2 | 8/2011 | Chiu et al. |
| 8,008,032 | B2 | 8/2011 | Forsyth et al. |
| 8,012,480 | B2 | 9/2011 | Lorence |
| 8,021,318 | B2 | 9/2011 | Leonard et al. |
| 8,021,614 | B2 | 9/2011 | Huang et al. |
| 8,025,854 | B2 | 9/2011 | Ohman et al. |
| 8,057,418 | B2 | 11/2011 | Korbling et al. |
| 8,063,187 | B2 | 11/2011 | Chu et al. |
| D650,091 | S | 12/2011 | Odeh |
| 8,069,782 | B2 | 12/2011 | Fragala et al. |
| 8,083,706 | B2 | 12/2011 | Leonard et al. |
| 8,092,684 | B2 | 1/2012 | Leonard et al. |
| 8,093,365 | B2 | 1/2012 | Wisniewski et al. |
| 8,097,153 | B2 | 1/2012 | Leonard et al. |
| 8,097,162 | B2 | 1/2012 | Leonard et al. |
| 8,101,720 | B2 | 1/2012 | Lazar et al. |
| 8,158,410 | B2 | 4/2012 | Tang et al. |
| 8,158,728 | B2 | 4/2012 | Desimone et al. |
| 8,178,602 | B2 | 5/2012 | Mao et al. |
| 8,186,913 | B2 | 5/2012 | Toner et al. |
| 8,282,799 | B2 | 10/2012 | Huang et al. |
| 8,288,116 | B2 | 10/2012 | Chen |
| 8,288,170 | B2 | 10/2012 | Tai et al. |
| 8,304,230 | B2 | 11/2012 | Toner et al. |
| 8,308,699 | B2 | 11/2012 | Zhang et al. |
| 8,333,934 | B2 | 12/2012 | Cao et al. |
| 8,343,440 | B2 | 1/2013 | Yoshioka |
| 8,357,528 | B2 | 1/2013 | Vacanti et al. |
| 8,367,314 | B2 | 2/2013 | Chilkoti |
| 8,372,579 | B2 | 2/2013 | Toner et al. |
| 8,414,806 | B2 | 4/2013 | Sun et al. |
| 8,445,225 | B2 | 5/2013 | Kuhn et al. |
| 8,481,336 | B2 | 7/2013 | Earhart et al. |
| 8,491,516 | B2 | 7/2013 | Leonard et al. |
| 8,507,283 | B2 | 8/2013 | Stayton et al. |
| 8,545,983 | B2 | 10/2013 | Jiang et al. |
| 8,557,528 | B2 | 10/2013 | Hauch et al. |
| 8,557,577 | B2 | 10/2013 | Hauch et al. |
| 8,574,660 | B2 | 11/2013 | Weaver et al. |
| 8,579,117 | B2 | 11/2013 | Sturm et al. |
| 8,632,838 | B2 | 1/2014 | Roth et al. |
| 8,663,625 | B2 | 3/2014 | Stroock et al. |
| 8,669,044 | B2 | 3/2014 | Chiu et al. |
| 8,796,184 | B2 | 8/2014 | Chilkoti et al. |
| 8,821,812 | B2 | 9/2014 | Ohman et al. |
| 8,822,231 | B2 | 9/2014 | Melin et al. |
| 8,835,144 | B2 | 9/2014 | Jiang et al. |
| 8,895,298 | B2 | 11/2014 | Toner et al. |
| 8,911,957 | B2 | 12/2014 | Irimia et al. |
| 8,921,102 | B2 | 12/2014 | Fuchs et al. |
| 8,980,568 | B2 | 3/2015 | Lin et al. |
| 8,986,966 | B2 | 3/2015 | Toner et al. |
| 8,986,988 | B2 | 3/2015 | Karnik et al. |
| 9,016,221 | B2 | 4/2015 | Brennan et al. |
| 9,056,318 | B2 | 6/2015 | Bergman et al. |
| 9,140,697 | B2 | 9/2015 | Tseng et al. |
| 9,174,222 | B2 | 11/2015 | Huang et al. |
| 9,494,500 | B2 | 11/2016 | Chang et al. |
| 9,541,480 | B2 | 1/2017 | Chang et al. |
| 2001/0031309 | A1 | 10/2001 | Lee et al. |
| 2001/0036556 | A1 | 11/2001 | Jen |
| 2002/0009759 | A1 | 1/2002 | Terstappen et al. |
| 2002/0055093 | A1 | 5/2002 | Abbott et al. |
| 2002/0098535 | A1 | 7/2002 | Wang et al. |
| 2002/0119482 | A1 | 8/2002 | Nelson et al. |
| 2002/0125192 | A1 | 9/2002 | Lopez et al. |
| 2002/0141913 | A1 | 10/2002 | Terstappen et al. |
| 2002/0160139 | A1 | 10/2002 | Huang et al. |
| 2002/0182633 | A1 | 12/2002 | Chen et al. |
| 2003/0022216 | A1 | 1/2003 | Mao et al. |
| 2003/0071525 | A1 * | 4/2003 | Tong ........................ H02K 1/20 310/65 |
| 2003/0087338 | A1 | 5/2003 | Messersmith et al. |
| 2003/0096226 | A1 | 5/2003 | Logtenberg |
| 2003/0129676 | A1 | 7/2003 | Terstappen et al. |
| 2003/0138645 | A1 | 7/2003 | Gleason et al. |
| 2003/0157054 | A1 | 8/2003 | Gillies et al. |
| 2003/0159999 | A1 | 8/2003 | Oakey et al. |
| 2003/0163084 | A1 | 8/2003 | Griffiths et al. |
| 2003/0206901 | A1 | 11/2003 | Chen |
| 2003/0213551 | A1 | 11/2003 | Derand et al. |
| 2003/0216534 | A1 | 11/2003 | Chaikof et al. |

(56) References Cited

U.S. PATENT DOCUMENTS

2004/0004043 A1 1/2004 Terstappen et al.
2004/0009471 A1 1/2004 Cao
2004/0028875 A1 2/2004 Van et al.
2004/0038339 A1 2/2004 Kufer et al.
2004/0053334 A1 3/2004 Ratner et al.
2004/0072269 A1 4/2004 Rao et al.
2004/0109853 A1 6/2004 McDaniel
2004/0115721 A1 6/2004 Mao et al.
2004/0118757 A1 6/2004 Terstappen et al.
2004/0175407 A1 9/2004 McDaniel
2004/0225249 A1 11/2004 Leonard et al.
2004/0254419 A1 12/2004 Wang et al.
2005/0025797 A1 2/2005 Wang et al.
2005/0042766 A1 2/2005 Ohman et al.
2005/0058576 A1 3/2005 Pranis et al.
2005/0079132 A1 4/2005 Wang et al.
2005/0100675 A1 5/2005 Mao et al.
2005/0107870 A1 5/2005 Wang et al.
2005/0147758 A1 7/2005 Mao et al.
2005/0153342 A1 7/2005 Chen
2005/0175501 A1 8/2005 Thompson et al.
2005/0178286 A1 8/2005 Bohn et al.
2005/0181195 A1 8/2005 Dubrow
2005/0181463 A1 8/2005 Rao et al.
2005/0186685 A1 8/2005 Kange et al.
2005/0215764 A1 9/2005 Tuszynski et al.
2005/0230272 A1 10/2005 Lee et al.
2005/0255327 A1 11/2005 Chaney et al.
2005/0265980 A1 12/2005 Chen et al.
2005/0267440 A1 12/2005 Herman et al.
2005/0288398 A1 12/2005 Messersmith et al.
2006/0002825 A1 1/2006 Derand et al.
2006/0009550 A1 1/2006 Messersmith et al.
2006/0014013 A1 1/2006 Saavedra et al.
2006/0057180 A1 3/2006 Chilkoti et al.
2006/0076295 A1 4/2006 Leonard et al.
2006/0079740 A1 4/2006 Silver et al.
2006/0088666 A1 4/2006 Kobrin et al.
2006/0093836 A1 5/2006 Huang et al.
2006/0134599 A1 6/2006 Toner et al.
2006/0137438 A1* 6/2006 Lenzing ................ G01F 1/6842 73/114.35
2006/0159916 A1 7/2006 Dubrow et al.
2006/0160066 A1 7/2006 Bhatia et al.
2006/0166183 A1 7/2006 Short et al.
2006/0169642 A1 8/2006 Oakey et al.
2006/0173394 A1 8/2006 Stroock et al.
2006/0194192 A1 8/2006 Rao et al.
2006/0237390 A1 10/2006 King et al.
2006/0251795 A1 11/2006 Kobrin et al.
2006/0252046 A1 11/2006 Short et al.
2006/0252054 A1 11/2006 Lin et al.
2006/0254972 A1 11/2006 Tai et al.
2006/0285996 A1 12/2006 Ohman et al.
2007/0003549 A1 1/2007 Ignatovich et al.
2007/0010702 A1 1/2007 Wang et al.
2007/0025883 A1 2/2007 Tai et al.
2007/0026381 A1 2/2007 Huang et al.
2007/0026416 A1 2/2007 Fuchs
2007/0026469 A1 2/2007 Fuchs et al.
2007/0032620 A1 2/2007 Gleason et al.
2007/0037173 A1 2/2007 Allard et al.
2007/0048859 A1 3/2007 Sears
2007/0059716 A1 3/2007 Balis et al.
2007/0071762 A1 3/2007 Ts'o et al.
2007/0072220 A1 3/2007 Chilkoti
2007/0077276 A1 4/2007 Haynie
2007/0122406 A1 5/2007 Chamberlain et al.
2007/0131622 A1 6/2007 Oakey et al.
2007/0154960 A1 7/2007 Connelly et al.
2007/0172903 A1 7/2007 Toner et al.
2007/0178133 A1 8/2007 Rolland
2007/0187250 A1 8/2007 Huang et al.
2007/0202536 A1 8/2007 Yamanishi et al.
2007/0231851 A1 10/2007 Toner et al.
2007/0259424 A1 11/2007 Toner et al.
2007/0264675 A1 11/2007 Toner et al.
2007/0266777 A1 11/2007 Bergman et al.
2007/0281353 A1 12/2007 Vacanti et al.
2008/0009780 A1 1/2008 Leonard et al.
2008/0023399 A1 1/2008 Inglis et al.
2008/0026486 A1 1/2008 Cooper et al.
2008/0090239 A1 4/2008 Shoemaker et al.
2008/0113350 A1 5/2008 Terstappen
2008/0114096 A1 5/2008 Qu et al.
2008/0131425 A1 6/2008 Garcia et al.
2008/0147178 A1 6/2008 Pacetti et al.
2008/0149566 A1 6/2008 Messersmith et al.
2008/0176271 A1 7/2008 Silver et al.
2008/0181861 A1 7/2008 Jiang et al.
2008/0188638 A1 8/2008 Breitenkamp et al.
2008/0206757 A1 8/2008 Lin et al.
2008/0207913 A1 8/2008 Breitenkamp et al.
2008/0213853 A1 9/2008 Garcia et al.
2008/0220531 A1 9/2008 Stayton et al.
2008/0241892 A1 10/2008 Roitman et al.
2008/0248499 A1 10/2008 Chiu et al.
2008/0255305 A1 10/2008 Brook et al.
2008/0274335 A1 11/2008 Bowman et al.
2008/0311182 A1 12/2008 Ferrari et al.
2008/0312356 A1 12/2008 Kobrin et al.
2009/0020431 A1 1/2009 Voccia et al.
2009/0029043 A1 1/2009 Rong et al.
2009/0036982 A1 2/2009 Aharoni et al.
2009/0060791 A1 3/2009 Hagiwara et al.
2009/0068760 A1 3/2009 Nelson et al.
2009/0093610 A1 4/2009 Textor et al.
2009/0098017 A1 4/2009 Celik-Butler et al.
2009/0105463 A1 4/2009 Berry et al.
2009/0114344 A1 5/2009 Barinov et al.
2009/0117574 A1 5/2009 Labgold et al.
2009/0136982 A1 5/2009 Tang et al.
2009/0139931 A1 6/2009 Leonard et al.
2009/0142772 A1 6/2009 Lau et al.
2009/0156460 A1 6/2009 Jiang et al.
2009/0181441 A1 7/2009 Jin et al.
2009/0203536 A1 8/2009 Vermette et al.
2009/0215088 A1 8/2009 Forsyth et al.
2009/0226499 A1 9/2009 Wisniewski et al.
2009/0247424 A1 10/2009 Chilkoti et al.
2009/0259015 A1 10/2009 Jiang et al.
2009/0259302 A1 10/2009 Trollsas et al.
2009/0263457 A1 10/2009 Trollsas et al.
2009/0264317 A1 10/2009 Ofir et al.
2009/0269323 A1 10/2009 Luk et al.
2009/0281250 A1 11/2009 Desimone et al.
2009/0285873 A1 11/2009 Lim et al.
2009/0292234 A1 11/2009 Leonard et al.
2009/0298067 A1 12/2009 Irimia et al.
2009/0311734 A1 12/2009 Greve et al.
2009/0317836 A1 12/2009 Kuhn et al.
2010/0004578 A1 1/2010 Leonard et al.
2010/0028526 A1 2/2010 Martin et al.
2010/0055733 A1 3/2010 Lutolf et al.
2010/0059414 A1 3/2010 Sturm et al.
2010/0061892 A1 3/2010 Flaim et al.
2010/0062156 A1 3/2010 Kurth et al.
2010/0063570 A1 3/2010 Pacetti et al.
2010/0081735 A1 4/2010 Mao et al.
2010/0092393 A1 4/2010 Haghgooie et al.
2010/0092491 A1 4/2010 Anastasi et al.
2010/0096327 A1 4/2010 Gin et al.
2010/0099160 A1 4/2010 Jiang et al.
2010/0099579 A1 4/2010 Chilkoti
2010/0112026 A1 5/2010 Karp et al.
2010/0118642 A1 5/2010 Ho et al.
2010/0137984 A1 6/2010 Lowery et al.
2010/0140160 A1 6/2010 Dubrow et al.
2010/0143438 A1 6/2010 Todd et al.
2010/0143741 A1 6/2010 Bell et al.
2010/0145286 A1 6/2010 Zhang et al.
2010/0151491 A1 6/2010 Himmelhaus et al.
2010/0152708 A1 6/2010 Li et al.
2010/0159462 A1 6/2010 Takayama et al.

(56) References Cited

U.S. PATENT DOCUMENTS

| | | | |
|---|---|---|---|
| 2010/0160645 | A1 | 6/2010 | Breitenkamp et al. |
| 2010/0169990 | A1 | 7/2010 | Clarke et al. |
| 2010/0173402 | A1 | 7/2010 | Chen |
| 2010/0198131 | A1 | 8/2010 | Leonard et al. |
| 2010/0209612 | A1 | 8/2010 | Rong et al. |
| 2010/0210745 | A1 | 8/2010 | McDaniel et al. |
| 2010/0226943 | A1 | 9/2010 | Brennan et al. |
| 2010/0233146 | A1 | 9/2010 | McDaniel |
| 2010/0233693 | A1 | 9/2010 | Kopf-Sill et al. |
| 2010/0233694 | A1 | 9/2010 | Kopf-Sill |
| 2010/0233812 | A1 | 9/2010 | Sun et al. |
| 2010/0247492 | A1 | 9/2010 | Kuhn et al. |
| 2010/0247760 | A1 | 9/2010 | Houben et al. |
| 2010/0248334 | A1 | 9/2010 | McDaniel |
| 2010/0248358 | A1 | 9/2010 | Yoshioka |
| 2010/0273991 | A1 | 10/2010 | Luk et al. |
| 2010/0278892 | A1 | 11/2010 | Krauland et al. |
| 2010/0279321 | A1 | 11/2010 | Chiu et al. |
| 2010/0280252 | A1 | 11/2010 | Breitenkamp et al. |
| 2010/0285581 | A1 | 11/2010 | Hauch et al. |
| 2010/0285972 | A1 | 11/2010 | Dubrow et al. |
| 2010/0294146 | A1 | 11/2010 | Fragala et al. |
| 2010/0304485 | A1 | 12/2010 | Karnik et al. |
| 2010/0311599 | A1 | 12/2010 | Wheeler et al. |
| 2010/0316842 | A1 | 12/2010 | Tuteja et al. |
| 2010/0323918 | A1 | 12/2010 | Huang et al. |
| 2010/0330025 | A1 | 12/2010 | Messersmith et al. |
| 2010/0331965 | A1 | 12/2010 | Dugas et al. |
| 2011/0005997 | A1 | 1/2011 | Kurth et al. |
| 2011/0008404 | A1 | 1/2011 | Lyon et al. |
| 2011/0027803 | A1 | 2/2011 | Moussavi et al. |
| 2011/0048947 | A1 | 3/2011 | Petronis et al. |
| 2011/0054347 | A1 | 3/2011 | Goss et al. |
| 2011/0056884 | A1 | 3/2011 | Leonard et al. |
| 2011/0059468 | A1 | 3/2011 | Earhart et al. |
| 2011/0062083 | A1 | 3/2011 | Leonard et al. |
| 2011/0066097 | A1 | 3/2011 | Leonard et al. |
| 2011/0091864 | A1 | 4/2011 | Karlsson et al. |
| 2011/0097277 | A1 | 4/2011 | Jiang et al. |
| 2011/0105712 | A1 | 5/2011 | Jiang et al. |
| 2011/0105982 | A1 | 5/2011 | Leonard et al. |
| 2011/0117674 | A1 | 5/2011 | Melin et al. |
| 2011/0143119 | A1 | 6/2011 | Bell et al. |
| 2011/0165161 | A1 | 7/2011 | Lin et al. |
| 2011/0165415 | A1 | 7/2011 | Ma et al. |
| 2011/0171663 | A1 | 7/2011 | Smith et al. |
| 2011/0192233 | A1 | 8/2011 | Aizenberg et al. |
| 2011/0195104 | A1 | 8/2011 | Jiang et al. |
| 2011/0212085 | A1 | 9/2011 | Joseloff et al. |
| 2011/0212297 | A1 | 9/2011 | Dhinojwala et al. |
| 2011/0212440 | A1 | 9/2011 | Viovy et al. |
| 2011/0217449 | A1 | 9/2011 | Lowery et al. |
| 2011/0224383 | A1 | 9/2011 | Sill et al. |
| 2011/0236904 | A1 | 9/2011 | Hauch et al. |
| 2011/0240064 | A1 | 10/2011 | Wales et al. |
| 2011/0240595 | A1 | 10/2011 | Dubrow |
| 2011/0250626 | A1 | 10/2011 | Williams et al. |
| 2011/0250679 | A1 | 10/2011 | Chang |
| 2011/0256619 | A1 | 10/2011 | Vacanti et al. |
| 2011/0266492 | A1 | 11/2011 | Stayton et al. |
| 2011/0275530 | A1 | 11/2011 | Walfish et al. |
| 2011/0282005 | A1 | 11/2011 | Jiang et al. |
| 2011/0294186 | A1 | 12/2011 | Fuchs et al. |
| 2011/0300551 | A1 | 12/2011 | Rao et al. |
| 2011/0300603 | A1 | 12/2011 | Forsyth et al. |
| 2011/0301442 | A1 | 12/2011 | Luecke et al. |
| 2011/0305660 | A1 | 12/2011 | Stayton et al. |
| 2011/0305872 | A1 | 12/2011 | Li et al. |
| 2011/0305881 | A1 | 12/2011 | Schultz et al. |
| 2011/0305895 | A1 | 12/2011 | Roth et al. |
| 2011/0305898 | A1 | 12/2011 | Zhang et al. |
| 2011/0305909 | A1 | 12/2011 | Weaver et al. |
| 2012/0003711 | A1 | 1/2012 | Tseng et al. |
| 2012/0006728 | A1 | 1/2012 | Huang et al. |
| 2012/0015146 | A1 | 1/2012 | Advincula et al. |
| 2012/0015835 | A1 | 1/2012 | Fuchs et al. |
| 2012/0021200 | A1 | 1/2012 | Koberstein et al. |
| 2012/0028342 | A1 | 2/2012 | Ismagilov et al. |
| 2012/0037544 | A1 | 2/2012 | Lane et al. |
| 2012/0045828 | A1 | 2/2012 | Davis et al. |
| 2012/0052415 | A1 | 3/2012 | Fragala et al. |
| 2012/0058302 | A1 | 3/2012 | Eggenspieler et al. |
| 2012/0058500 | A1 | 3/2012 | Mitchell et al. |
| 2012/0061304 | A1 | 3/2012 | Leonard et al. |
| 2012/0064150 | A1 | 3/2012 | Wisniewski et al. |
| 2012/0077246 | A1 | 3/2012 | Hong et al. |
| 2012/0114742 | A1 | 5/2012 | Martinez et al. |
| 2012/0178094 | A1 | 7/2012 | Kuhn |
| 2012/0196273 | A1 | 8/2012 | Huang et al. |
| 2012/0252022 | A1 | 10/2012 | Walfish et al. |
| 2012/0270209 | A1 | 10/2012 | Shah et al. |
| 2012/0301900 | A1 | 11/2012 | Kang et al. |
| 2013/0121895 | A1 | 5/2013 | Tang et al. |
| 2013/0143197 | A1 | 6/2013 | Heyneker |
| 2014/0017776 | A1 | 1/2014 | Kopf-Sill |
| 2016/0059234 | A1 | 3/2016 | Chang et al. |
| 2017/0199184 | A1 | 7/2017 | Chang et al. |
| 2017/0268967 | A1 | 9/2017 | Shao |

FOREIGN PATENT DOCUMENTS

| | | | | |
|---|---|---|---|---|
| CN | 102011193 A | 4/2011 | | |
| CN | 103261436 A | 8/2013 | | |
| CN | 103998932 A | 8/2014 | | |
| EP | 0783694 B1 | 11/2003 | | |
| EP | 2359689 A1 | 8/2011 | | |
| EP | 1569510 B1 | 11/2011 | | |
| EP | 2359689 B1 | 8/2015 | | |
| GB | 2427468 B | 3/2011 | | |
| GB | 2472927 B | 5/2011 | | |
| WO | WO-9823948 A1 | 6/1998 | | |
| WO | WO-9920649 A1 | 4/1999 | | |
| WO | WO-2007048459 A1 | 5/2007 | | |
| WO | WO-2007079229 A2 | 7/2007 | | |
| WO | WO-2007079250 A2 | 7/2007 | | |
| WO | WO-2008157257 A1 | 12/2008 | | |
| WO | WO-2007079250 A3 | 3/2009 | | |
| WO | WO-2009051734 A1 | 4/2009 | | |
| WO | WO-2009088933 A1 | 7/2009 | | |
| WO | WO-2009140326 A2 | 11/2009 | | |
| WO | WO-2010123608 A2 | 10/2010 | | |
| WO | WO-2010124227 A2 | 10/2010 | | |
| WO | WO-2010132795 A2 | 11/2010 | | |
| WO | WO-2012016136 A2 | 2/2012 | | |
| WO | WO-2012094642 A2 | 7/2012 | | |
| WO | WO-2012103025 A2 | 8/2012 | | |
| WO | WO-2012116073 A2 | 8/2012 | | |
| WO | WO-2013003624 A2 | 1/2013 | | |
| WO | WO 2013003624 A2 | 1/2013 | * | ............. C07K 16/30 |
| WO | WO-2013006828 A1 | 1/2013 | | |
| WO | WO-2013036620 A1 | 3/2013 | | |

OTHER PUBLICATIONS

"European search report dated Jan. 29, 2016 for EP 15182577.5".

Huang, et al. Type I Collagen-Functionalized Supported Lipid Bilayer as a Cell Culture Platform. Biomacromolecules, vol. 11, No. 5, May 10, 2010, pp. 1231-1240.

Kaladhar, et al. Cell mimetic lateral stabilization of outer cell mimetic bilayer on polymer surfaces by peptide bonding and their blood compatibility. J Biomed Mater Res A. Oct. 2006;79(1):23-35.

Lawrence, et al. Leukocytes roll on a selectin at physiologic flow rates: distinction from and prerequisite for adhesion through integrins. Cell. May 31, 1991;65(5):859-73.

Notice of allowance dated Jul. 7, 2016 for U.S. Appl. No. 14/065,265.

Notice of allowance dated Sep. 1, 2016 for U.S. Appl. No. 14/128,354.

Park, et al. Continuous focusing of microparticles using inertial lift force and vorticity via multi-orifice microfluidic channels. Lab on a Chip 9.7 (2009): 939-948.

Adams, et al. Highly efficient circulating tumor cell isolation from whole blood and label-free enumeration using polymer-based microfluid-

(56) References Cited

OTHER PUBLICATIONS ics with an integrated conductivity sensor. J Am Chem Soc. Jul. 9, 2008;130(27):8633-41. doi: 10.1021/ja8015022. Epub Jun. 17, 2008.
Adams, et al. Integrated acoustic and magnetic separation in microfluidic channels. Appl Phys Lett. Dec. 21, 2009;95(25):254103.
Alix-Panabieres, et al. Challenges in circulating tumour cell research. Nat Rev Cancer. Sep. 2014;14(9):623-31. doi: 10.1038/nrc3820. Epub Jul. 31, 2014.
Allard, et al. Tumor cells circulate in the peripheral blood of all major carcinomas but not in healthy subjects or patients with nonmalignant diseases. Clin Cancer Res. Oct. 15, 2004;10(20):6897-904.
Antolovic, et al. Heterogeneous detection of circulating tumor cells in patients with colorectal cancer by immunomagnetic enrichment using different EpCAM-specific antibodies. BMC Biotechnol. Apr. 28, 2010;10:35. doi: 10.1186/1472-6750-10-35.
Baeuerle, et al. EpCAM (CD326) finding its role in cancer. Br J Cancer. Feb. 12, 2007;96(3):417-23. Epub Jan. 9, 2007.
Balasubramanian, et al. Confocal images of circulating tumor cells obtained using a methodology and technology that removes normal cells. Mol Pharm. Sep.-Oct. 2009;6(5):1402-8. doi: 10.1021/mp9000519.
Balic, et al. Micrometastasis: detection methods and clinical importance. Cancer Biomarkers 9.1-6 (2011): 397-419.
Balzar, et al. Epidermal growth factor-like repeats mediate lateral and reciprocal interactions of Ep-CAM molecules in homophilic adhesions. Mol Cell Biol. Apr. 2001;21(7):2570-80.
Barkley, et al. Bubble-induced detachment of affinity-adsorbed erythrocytes. Biotechnol Appl Biochem. Oct. 2004;40(Pt 2):145-9.
Barradas, et al. Towards the biological understanding of CTC: capture technologies, definitions and potential to create metastasis. Cancers 5.4 (2013): 1619-1642.
Bhagat, et al. Continuous particle separation in spiral microchannels using Dean flows and differential migration. Lab Chip. Nov. 2008;8(11):1906-14. doi: 10.1039/b807107a. Epub Sep. 24, 2008.
Cao, et al. Detachment strategies for affinity-adsorbed cells. Enzyme and microbial technology. 2002; 31: 153-160.
Cavalli, et al. Micro- and nanobubbles: a versatile non-viral platform for gene delivery. Int J Pharm. Nov. 18, 2013;456(2):437-45. doi: 10.1016/j.ijpharm.2013.08.041. Epub Sep. 2, 2013.
Chaudry, et al. EpCAM an immunotherapeutic target for gastrointestinal malignancy: current experience and future challenges. Br J Cancer. Apr. 10, 2007;96(7):1013-9. Epub Feb. 27, 2007.
Chen, et al. Generation and characterization of monoclonal antibodies against dengue virus type 1 for epitope mapping and serological detection by epitope-based peptide antigens. Clin Vaccine Immunol. Apr. 2007;14(4):404-11. Epub Feb. 7, 2007.
Cima, et al. Label-free isolation of circulating tumor cells in microfluidic devices: Current research and perspectives. Biomicrofluidics. Jan. 24, 2013;7(1):11810. doi: 10.1063/1.4780062. eCollection 2013.
Cohen, et al. Relationship of circulating tumor cells to tumor response, progression-free survival, and overall survival in patients with metastatic colorectal cancer. J Clin Oncol. Jul. 1, 2008;26(19):3213-21. doi: 10.1200/JCO.2007.15.8923.
Co-pending U.S. Appl. No. 14/781,165, filed Sep. 29, 2015.
Co-pending U.S. Appl. No. 15/072,287, filed Mar. 16, 2016.
Co-pending U.S. Appl. No. 15/378,938, filed on Dec. 14, 2016.
Cornell, et al. A biosensor that uses ion-channel switches. Letters to Nauture. Jun. 5, 1997. vol. 387. p. 580-583.
Cremer, et al. Writing and erasing barriers to lateral mobility into fluid phospholipid bilayers. Langmuir 15.11 (1999): 3893-3896.
Dainiak, et al. Cell chromatography: separation of different microbial cells using IMAC supermacroporous monolithic columns. Biotechnol Prog. Mar.-Apr. 2005;21(2):644-9.
De Giorgi, et al. Application of a filtration- and isolation-by-size technique for the detection of circulating tumor cells in cutaneous melanoma. J Invest Dermatol. Oct. 2010;130(10):2440-7. doi: 10.1038/jid.2010.141. Epub Jun. 10, 2010.
Dharmasiri, et al. High-throughput selection, enumeration, electrokinetic manipulation, and molecular profiling of low-abundance circulating tumor cells using a microfluidic system. Anal Chem. Mar. 15, 2011;83(6):2301-9. doi: 10.1021/ac103172y. Epub Feb. 14, 2011.
Dickson, et al. Efficient capture of circulating tumor cells with a novel immunocytochemical microfluidic device. Biomicrofluidics. Sep. 2011;5(3):34119-3411915. doi: 10.1063/1.3623748. Epub Aug. 22, 2011.
European search report and written opinion dated May 2, 2015 for EP Application No. 12805303.0.
Fehm, et al. Cytogenetic evidence that circulating epithelial cells in patients with carcinoma are malignant. Clin Cancer Res. Jul. 2002;8(7):2073-84.
Fehm, et al. HER2 status of circulating tumor cells in patients with metastatic breast cancer: a prospective, multicenter trial. Breast Cancer Res Treat. Nov. 2010;124(2):403-12. doi: 10.1007/s10549-010-1163-x. Epub Sep. 22, 2010.
Garstecki, et al. Formation of droplets and bubbles in a microfluidic T-junction-scaling and mechanism of break-up. Lab Chip. Mar. 2006;6(3):437-46. Epub Jan. 25, 2006.
Geers, et al. Targeted liposome-loaded microbubbles for cell-specific ultrasound-triggered drug delivery. Small. Dec. 9, 2013;9(23):4027-35. doi: 10.1002/smll.201300161. Epub Jun. 5, 2013.
Gervais, Luc. Capillary Microfluidic Chips for Point-of-Care Testing: from Research Tools to Decentralized Medical Diagnostics. InfoScience. 2011. Thesis 5047. Available at http://infoscience.epfl.ch/record/165376/files/EPFL_TH5047.pdf.
Glasmastar, et al. Protein adsorption on supported phospholipid bilayers. J Colloid Interface Sci. Feb. 1, 2002;246(1):40-7.
Gomez-Suarez, et al. Analysis of bacterial detachment from substratum surfaces by the passage of air-liquid interfaces. Appl Environ Microbiol. Jun. 2001;67(6):2531-7.
Holmen, et al. Heterogeneity of human nasal vascular and sinusoidal endothelial cells from the inferior turbinate. Am J Respir Cell Mol Biol. Jan. 2005;32(1):18-27. Epub Oct. 21, 2004.
Hong, et al. Detecting circulating tumor cells: current challenges and new trends. Theranostics 3.6 (2013): 377-394.
"Hsiung, et al. A planar interdigitated ring electrode array via dielectrophoresis for uniform patterning of cells. Biosens Bioelectron. Dec. 1, 2008;24(4):869-875."
International search report and written opinion dated May 30, 2013 for PCT Application No. PCT/US2013/028667 with publication.
International search report and written opinion dated Dec. 10, 2012 for PCT/US2012/044701.
Ishihara, et al. Photoinduced graft polymerization of 2-methacryloyloxyethyl phosphorylcholine on polyethylene membrane surface for obtaining blood cell adhesion resistance. Colloids and Surfaces B: Biointerfaces, vol. 18, No. 3-4, Oct. 1, 2000, pp. 325-355.
Johnson, et al. Structure of an adsorbed dimyristoylphosphatidylcholine bilayer measured with specular reflection of neutrons. Biophys J. Feb. 1991;59(2):289-94.
Kahn, et al. Enumeration of circulating tumor cells in the blood of breast cancer patients after filtration enrichment: correlation with disease stage. Breast Cancer Res Treat. Aug. 2004;86(3):237-47.
Kaizuka, et al. Structure and dynamics of supported intermembrane junctions. Biophys J. Feb. 2004;86(2):905-12.
Kaladhar, et al. Supported cell mimetic monolayers and their interaction with blood. Langmuir. Dec. 7, 2004;20(25):11115-22.
Kang, et al. A combined micromagnetic-microfluidic device for rapid capture and culture of rare circulating tumor cells. Lab Chip. Jun. 21, 2012;12(12):2175-81. doi: 10.1039/c2lc40072c. Epub Mar. 28, 2012.
Kang, et al. Isomagnetophoresis to discriminate subtle difference in magnetic susceptibility. Journal of the American Chemical Society 130.2 (2008): 396-397.
Karabacak, et al. Microfluidic, marker-free isolation of circulating tumor cells from blood samples. Nat Protoc. Mar. 2014;9(3):694-710. doi: 10.1038/nprot.2014.044. Epub Feb. 27, 2014.
Krivacic, et al. A rare-cell detector for cancer. Proc Natl Acad Sci U S A. Jul. 20, 2004;101(29):10501-4. Epub Jul. 12, 2004.

(56) References Cited

OTHER PUBLICATIONS

Kuo, et al. Deformability considerations in filtration of biological cells. Lab Chip. Apr. 7, 2010;10(7):837-42. doi: 10.1039/b922301k. Epub Jan. 19, 2010.
Li, et al. Negative enrichment of target cells by microfluidic affinity chromatography. Anal Chem. Oct. 15, 2011;83(20):7863-9. doi: 10.1021/ac201752s. Epub Sep. 22, 2011.
Mahalingam, et al. Formation, stability, and mechanical properties of bovine serum albumin stabilized air bubbles produced using coaxial electrohydrodynamic atomization. Langmuir. Jun. 17, 2014;30(23):6694-703. doi: 10.1021/la5011715. Epub Jun. 4, 2014.
Nagrath, et al. Isolation of rare circulating tumour cells in cancer patients by microchip technology. Nature. Dec. 20, 2007;450(7173)1235-9.
NCBI Direct Submission. NM_002354.2. *Homo sapiens* epithelial cell adhesion molecule (EPCAM), mRNA. Feb. 5, 2012. [Retrieved from the Internet:<http://www.ncbi.nlm.nih.gov/nuccore/218505669?sat=15&satkey=5763417>.
Olmos, et al. Circulating tumour cell (CTC) counts as intermediate end points in castration-resistant prostate cancer (CRPC): a single-centre experience. Ann Oncol. Jan. 2009;20(1):27-33. doi: 10.1093/annonc/mdn544. Epub Aug. 11, 2008.
Ozkumur, et al. Inertial focusing for tumor antigen-dependent and -independent sorting of rare circulating tumor cells. Sci Transl Med. Apr. 3, 2013;5(179):179ra47. doi: 10.1126/scitranslmed.3005616.
Panchision, et al. Optimized flow cytometric analysis of central nervous system tissue reveals novel functional relationships among cells expressing CD133, CD15, and CD24. Stem Cells. Jun. 2007;25(6):1560-70. Epub Mar. 1, 2007.
Pantel, et al. Detection, clinical relevance and specific biological properties of disseminating tumour cells. Nat Rev Cancer. May 2008;8(5):329-40. doi: 10.1038/nrc2375.
Patriarca, et al. Epithelial cell adhesion molecule expression (CD326) in cancer: a short review. Cancer Treat Rev. Feb. 2012;38(1):68-75. doi: 10.1016/j.ctrv.2011.04.002. Epub May 14, 2011.
Ruf, et al. Characterisation of the new EpCAM-specific antibody HO-3: implications for trifunctional antibody immunotherapy of cancer. Br J Cancer. Aug. 6, 2007;97(3):315-21. Epub Jul. 10, 2007.
Schiro, et al. Sensitive and high-throughput isolation of rare cells from peripheral blood with ensemble-decision aliquot ranking. Angew Chem Int Ed Engl. May 7, 2012;51(19):4618-22. doi: 10.1002/anie.201108695. Epub Feb. 22, 2012.
Shah, et al. Biopolymer system for cell recovery from microfluidic cell capture devices. Anal Chem. Apr. 17, 2012;84(8):3682-8. doi: 10.1021/ac300190j. Epub Apr. 3, 2012.
Shih, et al. Flow-focusing regimes for accelerated production of monodisperse drug-loadable microbubbles toward clinical-scale applications. Lab Chip. Dec. 21, 2013;13(24):4816-26. doi: 10.1039/c3lc51016f.
Singer, et al. The fluid mosaic model of the structure of cell membranes. Science. Feb. 18, 1972;175(4023):720-31.
Stroock, et al. Chaotic mixer for microchannels. Science. Jan. 25, 2002;295(5555):647-51.
Sun, et al. High-performance size-based microdevice for the detection of circulating tumor cells from peripheral blood in rectal cancer patients. PLoS One. Sep. 16, 2013;8(9):e75865. doi: 10.1371/journal.pone.0075865. eCollection 2013.
Tan, et al. Versatile label free biochip for the detection of circulating tumor cells from peripheral blood in cancer patients. Biosens Bioelectron. Dec. 15, 2010;26(4):1701-5. doi: 10.1016/j.bios.2010.07.054. Epub Jul. 22, 2010.
Thorsteinsson, et al. The clinical significance of circulating tumor cells in non-metastatic colorectal cancer—a review. European Journal of Surgical Oncology (EJSO) 37.6 (2011): 459-465.
Triffo, et al. Monitoring lipid anchor organization in cell membranes by PIE-FCCS. J Am Chem Soc. Jul. 4, 2012;134(26):10833-42. doi: 10.1021/ja300374c. Epub Jun. 14, 2012.
Tseng, et al. Tethered fibronectin liposomes on supported lipid bilayers as a prepackaged controlled-release platform for cell-based assays. Biomacromolecules. Aug. 13, 2012;13(8):2254-62. doi: 10.1021/bm300426u. Epub Jul. 11, 2012.
Vona, et al. Isolation by size of epithelial tumor cells : a new method for the immunomorphological and molecular characterization of circulating tumor cells. Am J Pathol. Jan. 2000;156(1):57-63.
Wang, et al. Highly efficient capture of circulating tumor cells by using nanostructured silicon substrates with integrated chaotic micromixers. Angew Chem Int Ed Engl. Mar. 21, 2011;50(13):3084-8. doi: 10.1002/anie.201005853. Epub Mar. 4, 2011.
Wang, et al. Open-tubular capillary cell affinity chromatography: single and tandem blood cell separation. Anal Chem. Mar. 15, 2008;80(6):2118-24. doi: 10.1021/ac702553w. Epub Feb. 21, 2008.
Wang, et al. Shear stress induces endothelial differentiation from a murine embryonic mesenchymal progenitor cell line. Arterioscler Thromb Vasc Biol. Sep. 2005;25(9):1817-23. Epub Jun. 30, 2005.
Wu, et al. Antibody conjugated supported lipid bilayer for capturing and purification of viable tumor cells in blood for subsequent cell culture. Biomaterials. Jul. 2013;34(21):5191-9. doi: 10.1016/j.biomaterials.2013.03.096. Epub Apr. 21, 2013.
Xu, et al. A cancer detection platform which measures telomerase activity from live circulating tumor cells captured on a microfilter. Cancer Res. Aug. 15, 2010;70(16):6420-6. doi: 10.1158/0008-5472.CAN-10-0686. Epub Jul. 27, 2010.
Yurke, et al. A DNA-fuelled molecular machine made of DNA. Nature. Aug. 10, 2000;406(6796):605-8.
Lin, et al. Adhesion of antibody-functionalized polymersomes. Langmuir. Apr. 25, 2006;22(9):3975-9.
Lin, J.J. et al. 2006. Adhesion of antibody-functionalized polymersomes. Langmuir 22: 3975-3979. specif. pp. 3975, 3979.
Office action dated Jan. 21, 2015 for U.S. Appl. No. 14/065,265.
Office action dated Mar. 9, 2016 for U.S. Appl. No. 14/065,265.
Office action dated Mar. 23, 2016 for U.S. Appl. No. 14/128,354.
Office action dated May 29, 2015 for U.S. Appl. No. 14/065,265.
Office action dated Mar. 23, 2016 for U.S. Appl. No. 14/128,345.
Phillips, et al. Enrichment of cancer cells using aptamers immobilized on a microfluidic channel. Anal Chem. Feb. 1, 2009;81(3):1033-9. doi: 10.1021/ac802092j.
Phillips, J.A. et al. 2009. Enrichment of cancer cells using aptamers immobilized on a microfluidic channel. Analytical Chemistry81 : 1 033-1 039. specif. pp. 1 034, 1 035, 1 036, 1 037, 1 038.
Xu, et al. Aptamer-based microfluidic device for enrichment, sorting, and detection of multiple cancer cells. Anal Chem. Sep. 1, 2009;81(17):7436-42. doi: 10.1021/ac9012072.
Xu, Y. et al. 2009. Aptamer-based microfluidic device for enrichment, sorting, and detection of multiple cancer cells. AnalyticalChemistry 81: 7436-7442. specif. pp. 7436, 7437, 7439, 7440.
Hsu, et al. Microvortex for focusing, guiding and sorting of particles. Lab Chip. Dec. 2008;8(12):2128-34. doi: 10.1039/b813434k. Epub Oct. 30, 2008.
Stott, et al. Isolation of circulating tumor cells using a microvortex-generating herringbone-chip. Proc Natl Acad Sci U S A. Oct. 26, 2010;107(43):18392-7. doi: 10.1073/pnas.1012539107. Epub Oct. 7, 2010.

* cited by examiner

SEQUENCE LISTING

```
<160> NUMBER OF SEQ ID NOS: 2

<210> SEQ ID NO 1
<211> LENGTH: 116
<212> TYPE: PRT
<213> ORGANISM: Artificial Sequence
<220> FEATURE:
<223> OTHER INFORMATION: synthetic anti-epithelial cell adhesion
      molecule (EpCAM) membrane protein antibody EpAb4-1 heavy chain
      V-H9 domain
<220> FEATURE:
<221> NAME/KEY: PEPTIDE
<222> LOCATION: (1)..(25)
<223> OTHER INFORMATION: framework region 1 (FW1)
<220> FEATURE:
<221> NAME/KEY: PEPTIDE
<222> LOCATION: (26)..(35)
<223> OTHER INFORMATION: complementarity-determining region 1 (CDR1)
<220> FEATURE:
<221> NAME/KEY: PEPTIDE
<222> LOCATION: (36)..(50)
<223> OTHER INFORMATION: framework region 2 (FW2)
<220> FEATURE:
<221> NAME/KEY: PEPTIDE
<222> LOCATION: (51)..(58)
<223> OTHER INFORMATION: complementarity-determining region 2 (CDR2)
<220> FEATURE:
<221> NAME/KEY: PEPTIDE
<222> LOCATION: (59)..(98)
<223> OTHER INFORMATION: framework region 3 (FW3)
<220> FEATURE:
<221> NAME/KEY: PEPTIDE
<222> LOCATION: (99)..(105)
<223> OTHER INFORMATION: complementarity-determining region 3 (CDR3)
<220> FEATURE:
<221> NAME/KEY: PEPTIDE
<222> LOCATION: (106)..(116)
<223> OTHER INFORMATION: framework region 4 (FW4)

<400> SEQUENCE: 1

Gln Ile Gln Leu Val Gln Ser Gly Pro Glu Leu Lys Lys Pro Gly Glu
1               5                   10                  15

Thr Val Lys Ile Ser Cys Lys Ala Ser Gly Tyr Thr Phe Thr Asn Tyr
            20                  25                  30

Gly Met Asn Trp Val Lys Gln Ala Pro Gly Lys Gly Leu Lys Trp Met
        35                  40                  45

Gly Trp Ile Asn Thr Tyr Thr Gly Glu Pro Thr Tyr Gly Asp Asp Phe
    50                  55                  60

Lys Gly Arg Phe Ala Phe Ser Leu Glu Thr Ser Ala Ser Thr Ala Tyr
65                  70                  75                  80

Leu Gln Ile Asn Asn Leu Lys Asn Glu Asp Thr Ala Thr Tyr Phe Cys
                85                  90                  95

Ala Arg Phe Gly Arg Ser Val Asp Phe Trp Gly Gln Gly Thr Ser Val
            100                 105                 110

Thr Val Ser Ser
        115
```

-continued

<210> SEQ ID NO 2
<211> LENGTH: 112
<212> TYPE: PRT
<213> ORGANISM: Artificial Sequence
<220> FEATURE:
<223> OTHER INFORMATION: synthetic anti-epithelial cell adhesion molecule (EpCAM) membrane protein antibody EpAb4-1 light chain V-kappa24/25 domain
<220> FEATURE:
<221> NAME/KEY: PEPTIDE
<222> LOCATION: (1)..(23)
<223> OTHER INFORMATION: framework region 1 (FW1)
<220> FEATURE:
<221> NAME/KEY: PEPTIDE
<222> LOCATION: (24)..(39)
<223> OTHER INFORMATION: complementarity-determining region 1 (CDR1)
<220> FEATURE:
<221> NAME/KEY: PEPTIDE
<222> LOCATION: (40)..(54)
<223> OTHER INFORMATION: framework region 2 (FW2)
<220> FEATURE:
<221> NAME/KEY: PEPTIDE
<222> LOCATION: (55)..(61)
<223> OTHER INFORMATION: complementarity-determining region 2 (CDR2)
<220> FEATURE:
<221> NAME/KEY: PEPTIDE
<222> LOCATION: (62)..(93)
<223> OTHER INFORMATION: framework region 3 (FW3)
<220> FEATURE:
<221> NAME/KEY: PEPTIDE
<222> LOCATION: (94)..(102)
<223> OTHER INFORMATION: complementarity-determining region 3 (CDR3)
<220> FEATURE:
<221> NAME/KEY: PEPTIDE
<222> LOCATION: (103)..(112)
<223> OTHER INFORMATION: framework region 4 (FW4)

<400> SEQUENCE: 2

Asp Ile Val Met Thr Gln Ala Ala Phe Ser Asn Pro Val Thr Leu Gly
1               5                   10                  15

Thr Ser Ala Ser Ile Ser Cys Arg Ser Ser Lys Ser Leu Leu His Ser
            20                  25                  30

Asn Gly Ile Thr Tyr Leu Tyr Trp Tyr Leu Gln Lys Pro Gly Gln Ser
        35                  40                  45

Pro Gln Leu Leu Ile Tyr His Met Ser Asn Leu Ala Ser Gly Val Pro
    50                  55                  60

Asp Arg Phe Ser Ser Ser Gly Ser Gly Thr Asp Phe Thr Leu Arg Ile
65                  70                  75                  80

Ser Arg Val Glu Ala Glu Asp Val Gly Ile Tyr Tyr Cys Ala Gln Asn
                85                  90                  95

Leu Glu Asn Pro Arg Thr Phe Gly Gly Gly Thr Lys Leu Glu Ile Lys
            100                 105                 110

COLLECTOR ARCHITECTURE LAYOUT DESIGN

CROSS-REFERENCE

This application claims the benefit of U.S. Provisional Application No. 62/042,079, filed Aug. 26, 2014, which applications are incorporated herein by reference.

SEQUENCE LISTING

The instant application contains a Sequence Listing which has been submitted in ASCII format via EFS-Web and is hereby incorporated by reference in its entirety. Said ASCII copy, created on Nov. 10, 2015, is named 45249-704.201-Seqlisting.txt and is 4 Kilobytes in size.

BACKGROUND

Rare cells, such as circulating tumor cells, can be hard to capture due to their relatively low abundance in blood samples. Isolation and analysis of circulating tumor cells can be important for determining the origin of a tumor or understanding the process of tumor metastasis. Rare cells, like circulating tumor cells, are fragile. This disclosure provides new methods for the isolation of such rare cells.

SUMMARY

In one aspect, the disclosure provides for a microfluidic channel. The channel comprises: a plurality of microstructures within the channel; and a plurality of vortex regions at which one or more vortexes are generated in response to fluid flow, wherein each vortex region is substantially free of the plurality of microstructures and comprises at least a cylindrical volume having (1) a height of the channel and (2) a base having a diameter at least 20% a width of the channel.

In some embodiments, the microfluidic channel is coated with a non-fouling layer and a set of binding moieties configured to selectively bind particles of interest. In some embodiments, each vortex region comprises at least a rectangular volume having (1) a height of the channel, (2) a width equal to the diameter, and (3) a length at least 30% a width of the channel. In some embodiments, the plurality of vortex regions are positioned in a palindromic pattern along a length of the channel. In some embodiments, the plurality of vortex regions are positioned in a repeating pattern along a length of the channel. In some embodiments, the plurality of microstructures are arranged in a plurality of columns substantially parallel to one another and wherein each column of the plurality of columns comprises a column length equal to a distance from an outermost edge of a first microstructure to an outermost edge of a last microstructure in the column. In some embodiments, the plurality of columns comprise columns having a first length and columns having a second length greater than the first length, and wherein the first length is equal to or less than 60% of the second length. In some embodiments, the plurality of columns comprise columns having a first length and columns having a second length greater than the first length, and wherein each column having the first length is adjacent to at least another column having the first length. In some embodiments, the channel comprises a minimum distance between ends of microstructures measured along an axis parallel to a channel width and a maximum distance between ends of microstructures measured along the axis parallel to the channel width, and wherein the minimum distance is equal to or less than 60% of the maximum distance.

In another aspect, a microfluidic channel having a channel width, a channel height, and a channel length extending from an inlet to an outlet of the channel, wherein the microfluidic channel comprises a plurality of microstructures disposed therein is provided. The channel comprises: a first zone comprising the channel height, the channel length, a width equal to or less than 40% of the channel width, wherein the first zone comprises 60% or more of the plurality of microstructures; and a second zone outside of the first zone.

In some embodiments, the second zone comprises 20% or more of the plurality of microstructures. In some embodiments, the second zone is substantially free of the plurality of microstructures. In some embodiments, the second zone comprises less than 10% of all microstructure volume. In some embodiments, one or more vortexes are generated at regular intervals along the channel length. In some embodiments, the first zone is equidistant from walls of the channel. In some embodiments, the plurality of microstructures are arranged in a repeating pattern along the channel length. In some embodiments, the plurality of microstructures are arranged in a plurality of columns substantially parallel to one another and wherein each column of the plurality of columns comprises a column length equal to a distance from an outermost edge of a first microstructure to an outermost edge of a last microstructure in the column. In some embodiments, the plurality of columns comprise columns having a first length and columns having a second length greater than the first length, and wherein the first length is equal to or less than 60% of the second length. In some embodiments, the plurality of columns comprise columns having a first length and columns having a second length greater than the first length, and wherein each column having the first length is adjacent to at least another column having the first length. In some embodiments, the second zone is discontinuous. In some embodiments, the percentage of the plurality of microstructures in the first zone depends on, or is defined by $$\frac{\text{a number of microstructures within the first zone}}{\text{a total number of microstructures within the channel}}.$$

In some embodiments, wherein the percentage of the plurality of microstructures in the first zone depends on, or is defined by $$\frac{\text{a volume of microstructures within the first zone}}{\text{a total volume of microstructures within the channel}}.$$

In another aspect, a microfluidic channel having a channel height, a channel width, and a channel length is provided. The channel comprises: a plurality of microstructures arranged in a plurality of columns substantially parallel to one another with respect to the channel width, wherein the plurality of columns (1) each comprise a column length measure along the channel width and a column width measured along the channel length, and (2) comprise columns having a minimum length and columns having a maximum length greater than the minimum length, wherein each column having the minimum length is either (a) adjacent to at least another column having the minimum length, or (b) comprises a column width greater than a column width of an adjacent column along the channel length, and wherein the channel comprises at least one section in which the column length along the channel length (1) progressively increases from the minimum length to the maximum length and subsequently (2) progressively decreases from the maximum length to the minimum length.

In some embodiments, each column having the minimum length comprises a single microstructure. In some embodiments, each column having the maximum length comprises three microstructures. In some embodiments, a center of the column length of each column of the plurality of columns aligns within the channel. In some embodiments, the channel is coated with a non-fouling layer and a set of binding moieties configured to selectively bind particles of interest.

In another aspect, a microfluidic channel is provided. The channel comprises: a plurality of microstructures within the channel arranged in a non-random pattern along a length of the channel, the non-random pattern configured to generate two dimensional vortices in a plurality of vortex regions in response to fluid flow through the channel, wherein the microfluidic channel is coated with a non-fouling layer and a set of binding moieties configured to selectively bind particles of interest.

In some embodiments, the plurality of vortex regions are located along one or more sides of the channel. In some embodiments, the plurality of vortex regions are free of the plurality of microstructures. In some embodiments, the plurality of microstructures are arranged in a plurality of columns substantially parallel to one another and wherein each column of the plurality of columns comprises a column length equal to a distance from an outermost edge of a first microstructure to an outermost edge of a last microstructure in the column. In some embodiments, the plurality of columns comprise columns having a first length and columns having a second length greater than the first length, and wherein the first length is equal to or less than 50% of the second length.

In another aspect the disclosure provides for a microfluidic channel comprising plurality of microstructures arranged on an upper surface of the channel forming regions that are microstructure-free along sides of the channel wherein: the upper surface has a surface area that is at least 25% microstructure free; and the surface of the channel comprises a non-fouling composition. In some embodiments, the microstructure-free regions are arranged symmetrically along the walls of the channel. In some embodiments, the channel comprises at least 100 microstructures. In some embodiments, the microstructures are arranged in a central region of the channel. In some embodiments, the microstructures are arranged in a symmetrical pattern within the channel. In some embodiments, a first microstructure free region is separated from a second microstructure free region that is upstream or downstream by at least one column of microstructures. In some embodiments, the first microstructure free region is separated from a second microstructure free region that is symmetrical from the first microstructure free region within the channel by a single microstructure. In some embodiments, the channel comprises microstructures arranged in columns having between 1 and 20 microstructures per column. In some embodiments, the microstructure-free region is triangular. In some embodiments, the microstructure-free region is rectangular. In some embodiments, the length of the microstructure-free region extends between the outermost edges of a microstructure in columns with a maximum number of microstructures. In some embodiments, the midpoint of the microstructure-free region is at the column with a minimum number of microstructures. In some embodiments, the microstructure-free regions are arranged in a symmetrical pattern within the channel. In some embodiments, the non-fouling composition covers the microstructure and the channel wall opposite the microstructures. In some embodiments, the non-fouling composition comprises a lipid layer. In some embodiments, the lipid layer comprises a monolayer, bilayer, liposomes or any combination thereof. In some embodiments, the non-fouling composition comprises a binding moiety.

In one aspect the disclosure provides for a microfluidic channel comprising: a plurality of microstructures arranged in a plurality of columns within the channel wherein: the number of microstructures in each column c is different from the number of microstructures in column c−1 and the number of microstructures in column c+1, wherein the minimum number of microstructures in a column is m and the maximum number of microstructures in a column is n, wherein n−m is greater or equal to 2, and wherein the number of microstructures in each column c−1 to c+n repeatedly increases from m to n and then decreases back to m, and wherein m is equal to 1 or n is greater than or equal to 3. In some embodiments, at least a subset of the microstructures abuts a first side of the channel and the upper surface of the channel. In some embodiments, the number of columns is greater than 10. In some embodiments, the number of columns is greater than 30. In some embodiments, a column spans at least 75% of the channel between ends of the outermost microstructures of the column. In some embodiments, the channel has a width of at least 1 mm. In some embodiments, the channel has a width of at least 3 mm. In some embodiments, the microstructures are oblong. In some embodiments, microstructures in a column are separated from one another by a distance of at least 200 micrometers. In some embodiments, the pattern of increasing and decreasing is repeated at least 10 times. In some embodiments, the microstructures do not traverse the entire channel. In some embodiments, the microstructures are arranged in the ceiling of the channel. In some embodiments, the channel has a uniform width along the columns. In some embodiments, the microfluidic channel has a width greater than 1,000 microns but less than 10,000 microns. In some embodiments, the microstructure has a non-uniform shape. In some embodiments, m is 2. In some embodiments, n is 3. In some embodiments, n is 4. In some embodiments, the number of microstructures get progressively smaller or greater with each successive column. In some embodiments, the number of microstructures get progressively smaller or greater every two columns. In some embodiments, the microstructures have rounded corners. In some embodiments, the microstructures have edged corners. In some embodiments, the microstructures are oblong and are oriented with a longer dimension perpendicular to the direction of flow through the channel. In some embodiments, the columns are separated by at least 250 or 350 micrometers. In some embodiments, the microstructures within the columns are separated by at least 100 or 150 micrometers. In some embodiments, the width of the microstructures is at least 100 or 140 micrometers. In some embodiments, the length of the microstructures is at least 500 or 900 micrometers. In some embodiments, the microstructures have a depth of at least 10 or 20 micrometers. In some embodiments, the channel is deeper than the microstructure by at least 20 micrometers. In some embodiments, the microstructures extend into the channel by no more than half the channel's depth. In some embodiments, the channel comprises a non-fouling composition. In some embodiments, the non-fouling composition covers the microstructure and the channel wall opposite the microstructures. In some embodiments, the non-fouling composition comprises a lipid layer. In some embodiments, the lipid layer comprises a monolayer, bilayer, liposomes or any combination thereof. In some embodiments, the non-fouling composition comprises a binding moiety. In some embodiments, one of the microstructures comprises a bound cell. In some embodiments, the bound cell is bound to the channel by a binding moiety. In some embodiments, the cell is a rare cell. In some embodiments, the cell is a circulating tumor cell.

In one aspect the disclosure provides for a microfluidic channel comprising: a plurality of microstructures arranged in a plurality of columns in the channel wherein: the minimum number of microstructures in a column c is ‘m’ and the maximum number of microstructures in a column c' is ‘n’; the number of microstructures get progressively greater between m and n and then get progressively smaller between n and m; at least two or more adjacent columns have the same number of microstructures; and n−m is greater than 2. In some embodiments, at least a subset of the microstructures abuts a first side of the channel and the upper surface of the channel. In some embodiments, the number of columns is greater than 10. In some embodiments, the number of columns is greater than 30. In some embodiments, a column spans at least 75% of the channel between ends of the outermost microstructures of the column. In some embodiments, the channel has a width of at least 1 mm. In some embodiments, the channel has a width of at least 3 mm. In some embodiments, the microstructures are oblong. In some embodiments, microstructures in a column are separated from one another by a distance at least 200 microns. In some embodiments, the pattern of increasing and decreasing is repeated at least 10 times. In some embodiments, the microstructures do not traverse the entire channel. In some embodiments, the microstructures are arranged in the ceiling of the channel. In some embodiments, the channel has a uniform width along the columns. In some embodiments, the microfluidic channel has a width greater than 1,000 microns but less than 10,000 microns. In some embodiments, the microstructure has a non-uniform shape. In some embodiments, the two or more adjacent columns with the same number of microstructures have m number of microstructures each. In some embodiments, the two or more adjacent columns with the same number of microstructures have a number of microstructures that is not m. In some embodiments, m is 2. In some embodiments, n is 3. In some embodiments, n is 4. In some embodiments, the number of microstructures get progressively smaller or greater with each successive column. In some embodiments, the number of microstructures get progressively smaller or greater every two columns. In some embodiments, the microstructures have rounded corners. In some embodiments, the microstructures have edged corners. In some embodiments, the microstructures are oblong and are oriented with a longer dimension perpendicular to the direction of flow through the channel. In some embodiments, columns are separated by at least 250 or 350 micrometers. In some embodiments, the microstructures within the columns are separated by at least 100 or 150 micrometers. In some embodiments, the width of the microstructures is at least 100 or 140 micrometers. In some embodiments, the length of the microstructures is at least 500 or 900 micrometers. In some embodiments, the microstructures have a depth of at least 10 or 20 micrometers. In some embodiments, the channel is deeper than the microstructure by at least 20 microns. In some embodiments, the microstructures extend into the channel by no more than half the channel’s depth. In some embodiments, the channel comprises a non-fouling composition. In some embodiments, the non-fouling composition covers the microstructure and the channel wall opposite the microstructures. In some embodiments, the non-fouling composition comprises a lipid layer. In some embodiments, the lipid layer comprises a monolayer, bilayer, liposomes or any combination thereof. In some embodiments, the non-fouling composition comprises a binding moiety. In some embodiments, one of the microstructures comprises a bound cell. In some embodiments, the bound cell is bound to the channel by a binding moiety. In some embodiments, the cell is a rare cell. In some embodiments, the cell is a circulating tumor cell.

In one aspect the disclosure provides for a microfluidic channel comprising a palindromic microstructure pattern of microstructure within the channel wherein the palindromic microstructure pattern comprises a plurality of microstructures disposed within a plurality of columns, wherein m is the minimum number of microstructures in a column, wherein x is the maximum number of microstructures in a column, wherein the palindromic microstructure pattern repeats itself in the channel, wherein x−m is equal to or greater than 2.

In one aspect the disclosure provides for a microfluidic channel comprising: a plurality of microstructures arranged on an upper surface within the channel, wherein: the microstructures comprise a first-size microstructure and a second-size microstructure, wherein the first-size microstructure has a dimension greater than any dimension of the second-size microstructure; wherein the plurality of microstructures are arranged in columns each designated as c−1 through c+n; wherein the number of first-size microstructures in the columns alternates between m and n, wherein n−m is greater or equal to 1; and wherein columns having less than n first size microstructures further comprise one or more second size microstructures proximal to walls of the microfluidic channel. In some embodiments, the columns comprise a series of 10 or more columns. In some embodiments, at least a subset of the microstructures abuts a first side of the channel and the upper surface of the channel. In some embodiments, the number of columns is greater than 10. In some embodiments, the number of columns is greater than 30. In some embodiments, a column spans at least 75% of the channel between ends of the outermost microstructures of the column. In some embodiments, the channel has a width of at least 1 mm. In some embodiments, the channel has a width of at least 3 mm. In some embodiments, the microstructures are oblong. In some embodiments, microstructures in a column are separated from one another by a distance at least 200 microns. In some embodiments, the pattern is repeated at least 10 times. In some embodiments, the microstructures do not traverse the entire channel. In some embodiments, the microstructures are arranged in the ceiling of the channel. In some embodiments, the channel has a uniform width along the columns. In some embodiments, the microfluidic channel has a width greater than 1,000 microns but less than 10,000 microns. In some embodiments, the microstructure has a non-uniform shape. In some embodiments, m is 2 and n is 3. In some embodiments, m is 3 and n is 4. In some embodiments, the number of columns with m number of microstructures is repeated at least twice followed by the same number of columns with n number of microstructures. In some embodiments, the microstructures have rounded corners. In some embodiments, the microstructures have edged corners. In some embodiments, the microstructures are oblong and are oriented with a longer dimension perpendicular to the direction of flow through the channel. In some embodiments, columns are separated by at least 250 or 350 micrometers. In some embodiments, the microstructures within the columns are separated by at least 100 or 150 micrometers. In some embodiments, the width of the microstructures is at least 100 or 140 micrometers. In some embodiments, the length of the microstructures is at least 500 or 900 micrometers. In some embodiments, the microstructures have a depth of at least 10 or 20 micrometers. In some embodiments, the channel is deeper than the microstructure by at least 20 microns. In some embodiments, the microstructures extend into the channel by no more than half the channel's depth. In some embodiments, the channel comprises a non-fouling composition. In some embodiments, the non-fouling composition covers the microstructure and the channel wall opposite the microstructures. In some embodiments, the non-fouling composition comprises a lipid layer. In some embodiments, the lipid layer comprises a monolayer, bilayer, liposomes or any combination thereof. In some embodiments, the non-fouling composition comprises a binding moiety. In some embodiments, one of the microstructures comprises a bound cell. In some embodiments, the bound cell is bound to the channel by a binding moiety. In some embodiments, the cell is a rare cell. In some embodiments, the cell is a circulating tumor cell.

In one aspect the disclosure provides for a microfluidic system comprising a plurality of microchannels fluidically coupled in parallel to one another wherein the microfluidic channels are selected from any of the microfluidic channels of the disclosure.

In one aspect the disclosure provides for a method for binding cells comprising: flowing a biological sample comprising particles of interest through a microfluidic channel of the disclosure; and binding the particles of interest to the microstructures. In some embodiments, the flowing comprises a linear velocity of at least 2.5 mm/s. In some embodiments, the flowing comprises a linear velocity of at most 4 mm/s. In some embodiments, the method further comprises releasing the particle of interest from the microstructures. In some embodiments, the releasing comprises passing a bubble through the channel thereby generating a released particle of interest. In some embodiments, the released particle of interest is viable. In some embodiments, the method further comprises collecting the released particle of interest. In some embodiments, the releasing removes greater than 70% of bound particles of interest. In some embodiments, the flowing comprises creating a vortex between on the ends of columns comprising a minimum number of microstructures. In some embodiments, the vortex increases the binding of the particles of interest to the microstructure. In some embodiments, the vortex increases contact of a cell to a microstructure by at least 30% compared to a microfluidic channel without the microstructure structure. In some embodiments, the vortex increases contact of a cell to a microstructure by at least 70% compared to a microfluidic channel without the microstructures. In some embodiments, the vortex is a counterclockwise vortex. In some embodiments, the vortex is a clockwise vortex. In some embodiments, the vortex is horizontal to the direction of flow of a sample through the channel. In some embodiments, the vortex is perpendicular to the direction of flow of a sample through the channel. In some embodiments, the vortex comprises fluid vectors in two dimensions. In some embodiments, the vortex comprises fluid vectors in three dimensions. In some embodiments, the vortex comprises two vortexes. In some embodiments, the two vortexes are perpendicular to each other. In some embodiments, the vortex comprises two parts of vortexes, wherein one part of the vortex flows clockwise, and one part of the vortex flows counter clockwise, and wherein the two parts share a common flow path.

In one aspect the disclosure provides for a method for creating fluid dynamics in a microfluidic channel comprising: generating a vortex by flowing a biological sample comprising particles of interest through a microfluidic channel of the disclosure. In some embodiments, the flowing comprises a linear velocity of at least 2.5 mm/s. In some embodiments, the flowing comprises a linear velocity of at most 4 mm/s. In some embodiments, the method further comprises binding a particle of interest to said microfluidic channel. In some embodiments, the method further comprises releasing the particle of interest from the microstructures. In some embodiments, the vortex is located between on the ends of columns comprising a minimum number of microstructures. In some embodiments, the vortex increases the binding of the particles of interest to the microstructure. In some embodiments, the vortex increases contact of a cell to a microstructure by at least 30% compared to a microfluidic channel without the microstructure structure. In some embodiments, the vortex increases cell movement resulting in increased contact of a cell to a microstructure by at least 70% compared to a microfluidic channel without the microstructures. In some embodiments, the vortex is a counterclockwise vortex. In some embodiments, the vortex is a clockwise vortex. In some embodiments, the vortex is horizontal to the direction of flow of a sample through the channel. In some embodiments, the vortex is perpendicular to the direction of flow of a sample through the channel. In some embodiments, the vortex comprises fluid vectors in two dimensions. In some embodiments, the vortex comprises fluid vectors in three dimensions. In some embodiments, the vortex comprises two vortexes. In some embodiments, the two vortexes are perpendicular to each other. In some embodiments, the vortex comprises two parts of the vortexes, wherein one part of the vortex flows clockwise, and one part of the vortex flows counter clockwise, and wherein the two parts share a common flow path. In some embodiments, the vortex interacts with another vortex.

In one aspect the disclosure provides for a microfluidic channel comprising: a plurality of microstructures arranged in a plurality of columns within the channel wherein: the depth of microstructures in each column c is different from the number of microstructures in column c−1 and the depth of microstructures in column c+1, wherein the minimum depth of microstructures in a column is x and the maximum depth of microstructures in a column is y, wherein the number of microstructures in each column c−1 to c+n repeatedly increases from m to n and then decreases back to m, and wherein m is equal to 1 or n is greater than or equal to 3. In one aspect the disclosure provides for a microfluidic channel comprising: a plurality of microstructures arranged in a plurality of columns in the channel wherein: the minimum depth of microstructures in a column c is 'x' and the maximum depth of microstructures in a column c' is 'y'; the depth of microstructures get progressively greater between x and y and then get progressively smaller between y and x; and at least two or more adjacent columns have the same depth of microstructures. In one aspect the disclosure provides for a microfluidic channel comprising: a plurality of microstructures arranged on an upper surface within the channel, wherein: the microstructures comprise a first-size microstructure and a second-size microstructure, wherein the first-size microstructure has a dimension greater than any dimension of the second-size microstructure; wherein the plurality of microstructures are arranged in columns each designated as c−1 through c+n; wherein the depth of first-size microstructures in the columns alternates between x and y; and wherein columns having less than n first size micro-structures further comprise one or more second size micro-structures proximal to walls of the microfluidic channel. In some embodiments, the minimum depth x is at least 10 micrometers. In some embodiments, the maximum depth y is at least 40 micrometers. In some embodiments, the difference between the depths x and y is at least 10 microns. In some embodiments, the difference between the depths x and y is at most 30 microns. In some embodiments, the minimum depth x is at most 50% of the depth of the channel. In some embodiments, the maximum depth y is at least 50% of the depth of the channel. In some embodiments, the depths of the microstructures within a column vary. In some embodiments, the dimension of depth of the microstructures into the channel at the ends of the column are the longest. In some embodiments, the depths of the microstructures into the channel in the middle of the column are the shortest. In some embodiments, the depths of the microstructures into the channel at the ends of the column are the shortest. In some embodiments, the depths of the microstructures in the middle of the column are the longest. In some embodiments, the pattern of increasing and decreasing is repeated at least 10 times. In some embodiments, the microstructures do not traverse the entire channel. In some embodiments, the microstructures are arranged in the ceiling of the channel. In some embodiments, the channel has a uniform width along the columns. In some embodiments, the number of micro-structures get progressively smaller or greater with each successive column. In some embodiments, the number of microstructures get progressively smaller or greater every two columns. In some embodiments, the channel comprises a non-fouling composition. In some embodiments, the non-fouling composition comprises a lipid layer. In some embodiments, the lipid layer comprises a monolayer, bilayer, liposomes or any combination thereof. In some embodiments, the non-fouling composition comprises a binding moiety. In some embodiments, one of the micro-structures comprises a bound cell. In some embodiments, the bound cell is bound to the channel by a binding moiety. In some embodiments, the cell is a rare cell. In some embodiments, the cell is a circulating tumor cell.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION

Definitions

As used herein, "microstructures" can refer to a collection of structures inside a microfluidic channel. A microstructure is one that has at least one dimension less than 1 cm, or more preferably less than 1,000 microns, or less than 500 microns. Such a dimension is preferably also greater than 1 nanometer, 1 micrometer or greater than 50 micrometers. Micro-structures is used interchangeably with "obstacles," "microtrenches," and "posts".

As used herein, "vortex" or "vortexing" can refer to a spinning current of water or air. A vortex can pull items, such as molecules or cells, into the current. A vortex can pull items downward into the current. A vortex can push items, such as molecules or cells out of the current.

The term "about" as used herein to refer to an integer shall mean +/−10%, 9%, 8%, 7%, 6%, 5%, 4%, 3%, 2%, or 1% of that integer.

The term "column" when referring to column of micro-structures or posts or obstacles refers to a linear arrangement of such microstructures or posts or obstacles that is roughly perpendicular to the fluid flow pathway. Examples of columns of microstructures can be seen in FIGS. 8, 9, 11, and 14 and as illustrated by numbers 1410.

General Overview

Figure 14:
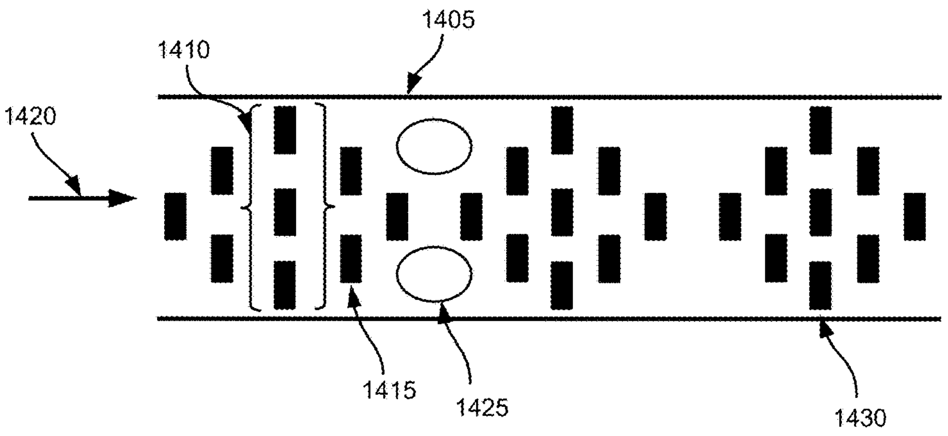
FIG. 14 depicts an exemplary embodiment of a micro-structure pattern in a channel.

The methods of the disclosure provide for a microstructure pattern for capturing particles of interest from a biological sample. FIG. 14 illustrates an exemplary embodiment of the compositions and methods of the disclosure. A microfluidic channel can comprise two walls 1405. Inside the channel can be a series of columns 1410 which comprise a number of microstructures 1415. A biological sample (e.g., bodily fluid such as urine, blood or plasma) comprising particles of interest (e.g., rare cells) can be flowed 1420 through the channel between the walls 1405. The particles of interest can bind to the microstructures 1415 in a column 1410 as well as potentially the ceiling and floor of the channel 1405. In some embodiments the channel itself may be non-planar in that the walls, top surface or bottom surface may take on a shape that approximates the microstructures 1415. In some embodiments there may be more than two walls depending upon the cross section of the channel. In some instances, the microstructures 1430 touch the wall 1405 of the channel. In some instances, the microstructures 1415 do not touch the wall 1405 of the channel. In some instances, the pattern of columns 1410 of microstructures 1415 can create microstructure-free zones 1425. A microstructure free zone 1425 can comprise a vortex. A vortex can cause localized fluid movement, which increases the mixing of the particles of interest to be in proximity to the one or more surfaces of the channel and thereby increase the likelihood of binding of particle of interests to a microstructure 1415.

Surfaces

The disclosure provides for flowing particles of interest over one or more surfaces (e.g., through a channel in a microfluidic chip). The surfaces may be flat, curved, and/or comprise topological features (e.g., microstructures). The surfaces may be the same. The surfaces may be different (e.g., a top surface may comprise microstructures, and a bottom surface may be flat).

Exemplary surfaces can include, but are not limited to, a biological microelectromechanical surface (bioMEM) surface, a microwell, a slide, a petri dish, a cell culture plate, a capillary, a tubing, a pipette tip, and a tube. A surface can be solid, liquid, and/or semisolid. A surface can have any geometry (e.g., a surface can be planar, tilted, jagged, have topology).

A surface can comprise a microfluidic surface. A surface can comprise a microfluidic channel. A surface can be the surface of a slide, the inside surface of a wellplate or any other cavity.

The surface can be made of a solid material. Exemplary surface materials can include silicon, glass, hydroxylated poly(methyl methacrylate) (PMMA), aluminum oxide, plastic, metal, and titanium oxide ($TiO_2$) or any combination thereof.

A surface can comprise a first solid substrate (e.g., PMMA) and a second solid substrate (e.g., glass). The first and second solid substrates can be adhered together. Adhesion can be performed by any adhesion means such as glue, tape, cement, welding, and soldering. The height of the space (e.g., channel) formed by the two solid substrates can be determined by the thickness of the adhesive. In some instances, the adhesive is about [include a definition of "about"] 1, 2, 3, 4, 5, 6, 7, 8, 9, 10, 20, 40, 60, 80, 100 microns thick.

A surface can comprise a channel. The channel can include a surface configured to capture the particle of interest (e.g., cell). The channel can be formed within a microfluidic device configured to capture the particle of interest from whole blood samples. Capture can be mediated by the interaction of a particle of interest (e.g., cell) with a binding moiety on a surface of the channel. For example, the channel can include microstructures coated with binding moieties. The microstructures can be arranged to isolate a particle of interest from a whole blood sample within the channel. Such a channel can be used to provide a permit selective bonding (loose or not) particle of interests from blood samples from patients, and can be useful both in cancer biology research and clinical cancer management, including the detection, diagnosis, and monitoring, and prognosis of cancer.

A channel can comprise three dimensions. The cross-section of the channel can be defined as two dimensions of the channel's volume (e.g., height and width). The third dimension can be referred to as the length of the channel. The length and/or width of the channel can be uniform. The length and/or width of the channel can be non-uniform.

The surface (e.g. of the microfluidic channel) can envelope a volume. The volume of the channel can be at least 1, 10, 20, 30, 40, 50, 60, 70, 80, 90, 100, 200 or more microliters. The volume of the channel can be at most 1, 10, 20, 30, 40, 50, 60, 70, 80, 90, 100, 200 or more microliters.

Adhesion of the particles of interest within the sample to the surface can be increased along the flat surface of each microstructure due to formation of a stagnation zone in the center of the flat surface, thereby providing a stagnant flow condition increasing residence time and/or increasing the efficiency of chemical or physical (such as hydrogen bonding, van der Waals forces, electrostatic forces, etc) interactions with the binding surface. In some embodiments, the surface can be an outer surface of a microstructure within the channel or a portion of the surface being oriented substantially perpendicular to a direction of fluid flow of the biological sample within the microfluidic channel. The microstructure can extend completely or partially across the microfluidic channel.

A microfluidic device can include a fluid flow channel providing fluid communication between an inlet and an outlet. The channel can include at least one surface configured to bind the particle of interest (e.g., functionalized with a binding agent). The surface can be formed on one or more microstructures within the channel configured to capture the particle of interest in the sample. The surface can be formed on the top or bottom of the channel. The channel can be included in combination with other components to provide a system for isolating analytes (e.g., cells) from a sample. The volume of the channel or the region having the binding agents may be selected depending on the volume of the sample being employed. The volume of the channel can be larger than the size of the sample.

One or more surfaces (e.g., of the microfluidic channel) can be configured to direct fluid flow and/or particles of interest within a fluid passing through the microfluidic channel. For example, the surface of a channel can be rough or smooth. The channel can include a roughened surface. The channel can comprise a periodic amplitude and/or frequency that is of a size comparable with a desired analyte (e.g., cell). In some instances, the channel can be defined by a wall with an undulating or "saw-tooth"-shaped surface positioned opposite the base of one or more microstructures within the microfluidic channel. The saw-tooth shaped surface can have a height and frequency on the order of about 1-100 micrometers. The saw-tooth shaped surface can be positioned directly opposite one or more microstructures extending only partially across the surface. The channel dimensions can be selected to provide a desired rate of binding of the particle of interest to the surface of the microfluidic channel.

The surface (e.g., microfluidic channel) can be configured to maximize binding of the particle of interest to one or more surfaces within the channel, while permitting a desired rate of fluid flow through the channel. Increasing the surface area of the microstructures can increase the area for particle of interest binding while increasing the resistance to sample fluid flow through the channel from the inlet to the outlet.

Microstructures

A surface (e.g., microfluidic channel) can comprise microstructures. Microstructures can refer to structures emanating from one of the surfaces of the channel (e.g., the bottom or top or one or more sides). The structures can be positioned and shaped such that the groove formed between the microstructures can be rectangular or triangular (See FIGS. 2 and 3). A groove can refer to the space between microstructures emanating from a surface. Microstructures can be arranged in zig-zigged or staggered patterns. Microstructures can be arranged a palindromic pattern. For example, the number of microstructures in each column (e.g. FIG. 14) in a series of adjacent columns can increase up to the maximum number of microstructures in a column and then decrease sequentially down to a least number of microstructures in a column. Microstructures can be used to change the stream line of the flow field of a biological sample through the channel. Microstructures can be arranged in a pattern in which the stream line of the flow field is changing.

A microstructure can be any shape. A microstructure can be rectangular. A microstructure can be square. A microstructure can be triangular (e.g., pyramidal). A microstructure can be oblong, oval, or circular. A microstructure can have rounded corners. A microstructure can have sharp corners. A microstructure can be a three-dimensional rectangular duct.

The number of microstructures in a column can be at least 1, 2, 3, 4, 5, 6, 7, 8, 9, or 10 or more. The number of microstructures in a column can be at most 1, 2, 3, 4, 5, 6, 7, 8, 9, or 10 or more. In some embodiments, the number of microstructures in a column is 1. In some embodiments, the number of microstructures in a column is 2. In some embodiments, the number of microstructures in a column is 3. In some embodiments, the number of microstructures in a column is 4.

The number of microstructures in adjacent columns can be the same. The number of adjacent columns with the same number of microstructures can be 1, 2, 3, 4, 5, 6, 7, 8, 9, or 10 or more columns. In some instances, the number of microstructures in adjacent columns differ by at least 1, 2, 3, 4, 5, 6, 7, 8, 9, or 10 or more microstructures. In some instances, the number of microstructures in adjacent columns differ by at most 1, 2, 3, 4, 5, 6, 7, 8, 9, or 10 or more microstructures. The base of the microstructures for each column may be on the same surface or may be on distinct surfaces.

The length of a column can refer to the distance from the outermost edges of the first and last microstructure in a column. The length of a column can refer to the distance from beyond the outermost edges of the first and/or beyond the outermost edges last microstructure in a column. The length of a column can be at least 5, 10, 15, 17, 20, 25, 30, 35, 40, 45, 50, 55, 60, 65, 70, 75, 80, 85, 90, 95 or 100% of the width of the channel. The length of a column can be at most 5, 10, 15, 17, 20, 25, 30, 35, 40, 45, 50, 55, 60, 65, 70, 75, 80, 85, 90, 95 or 100% of the width of the channel. In some instances, the length of the column is about 17% the width of the channel.

The microstructure pattern can be a pattern wherein the number of microstructures in adjacent columns increases until the column consisting of the maximum number of microstructures in the microstructure pattern, after which the number of microstructures in each adjacent column decreases until the column consisting of the minimum number of microstructures in the microstructure pattern. In this way, a microstructure pattern can be palindromic. For example, a microstructure pattern can be x, x+1, x+2 . . . x+n . . . x+2, x+1, x, wherein x is any integer number and x+n is the maximum number of microstructures in a column, and wherein each variable separated by a comma represents an adjacent column, (e.g., 1232123212321 (i.e., wherein each number refers to the number of microstructures in a column, wherein each number represents a column).

The number of microstructures in adjacent columns can increase or decrease by any integer number, not necessarily just by one. The number of microstructures in adjacent columns can increase or decrease by 2, 3, 4, 5, 6, 7, 8, 9, or 10 or more.

Any variable (e.g., separated by a comma) can be repeated any number of times before moving on to the next variable. For example, a microstructure pattern can be x, x+1, x+1, x+2, x+1, x+1, x.

In some instances, the microstructure pattern can be a pattern wherein the number of microstructures in adjacent columns increases until the column consisting of the maximum number of microstructures in the microstructure pattern, after which the whole set of columns is repeated in which the number of microstructures in each adjacent column decreases until the column consisting of the minimum number of microstructures in the microstructure pattern. For example, a microstructure pattern can be x, x+1, x+2 . . . x+n, x+n . . . x+2, x+1, x. In another example, a microstructure pattern can be x, x, x+1, x+2 . . . x+n . . . x+2, x+1, x, x (e.g., 1233212332123321. In some instances, the columns with the largest and the smallest number of microstructures can be repeated next to each other. For example, the pattern can be 123211232112321 or 123321123321123321.

In some instances, the number of microstructures in columns in a microstructure pattern alternates between columns. In some instances, one or more adjacent columns consist of the same number of microstructures, followed by one or more columns of consisting of a different number of microstructures. For example, a microstructure pattern can be 121212, 112112112, or 11221122 (i.e., wherein 1 and 2 are the number of microstructures in each column).

Figure 8:
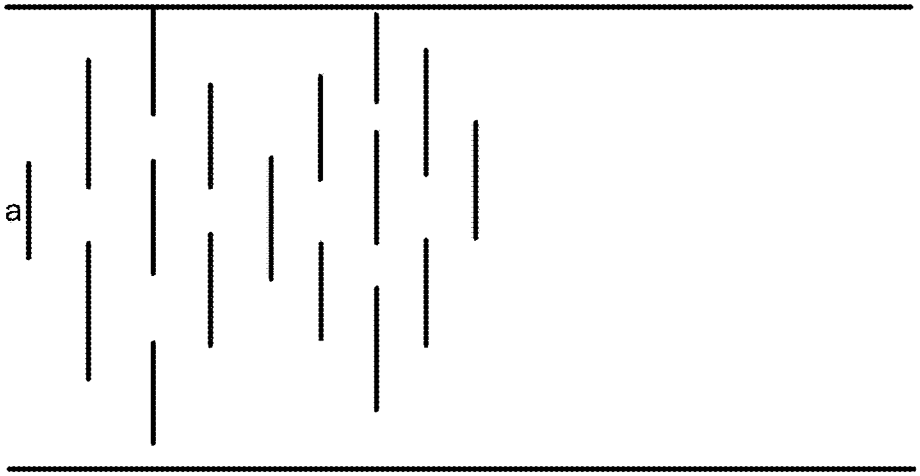
FIG. 8 shows an exemplary microstructure pattern of 12321.

In some instances, the number of microstructures in adjacent consecutive columns is arranged in a 12321 pattern (See FIG. 8). A 12321 pattern refers to a column of 1 microstructure oriented in a channel perpendicular to the direction of flow, followed consecutively by a column of two microstructures oriented in a channel perpendicular to the direction of flow, followed by a column of three microstructures oriented in a channel perpendicular to the direction of flow, etc. The pattern of micro-structures (1232123212321 . . . ) shown in FIG. 8 and the pattern (123211232112321 . . . ) have similar effects on the flow field of micro-channel.

In some embodiments, the microstructures are oriented in an alternating pattern, wherein alternating columns comprise either m or n number of microstructures, wherein m−n is 1. M or n can be at least 1, 2, 3, 4, 5, 6, 7, 8, 9 or 10 or more. In some instances, the number of columns with m microstructures can be repeated at least 1, 2, 3, 4, 5, 6, 7, 8, 9, or 10 or more times followed by 1, 2, 3, 4, 5, 6, 7, 8, 9 or 10 or more columns comprising n microstructures. In some embodiments, an alternating pattern of columns comprises two or more differently sized microstructures. For example, columns can alternate between m and n number of first sized columns. When a column has the smallest number of microstructures it can also comprise microstructures of a second size at the ends of the microstructure column (e.g., at the ends closest to the walls of the channel).

The second size microstructure can have at least one dimension being at least 10, 20, 30, 40, 50, 60, 70, 80, 90 or 100% smaller than any dimension of the first-sized microstructure. The second size microstructure can have at most one dimension being at least 10, 20, 30, 40, 50, 60, 70, 80, 90 or 100% smaller than any dimension of the first-sized microstructure. The second sized microstructure can be smaller than the first sized microstructure. The second sized microstructure can be oriented such that it takes up any remaining space between the microstructure and the column, such that all the columns have a uniform distance between the wall of the channel and the closest microstructure.

Figure 9:
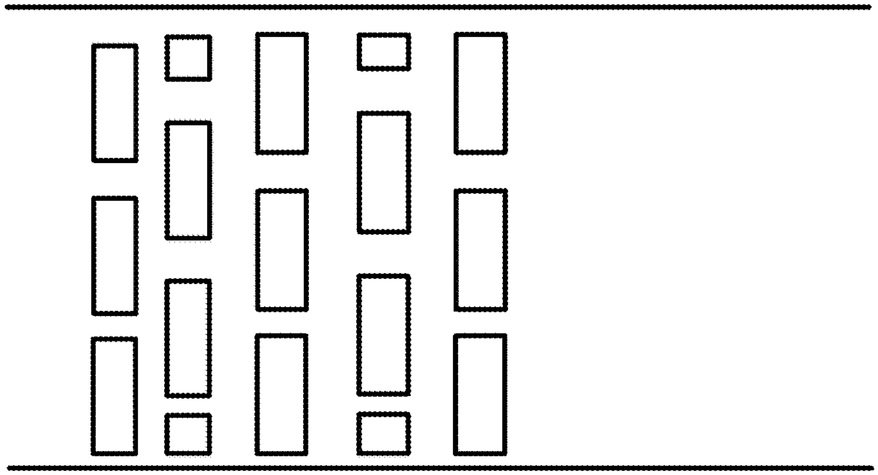
FIG. 9 shows an exemplary microstructure pattern of 3434.

In some embodiments, the microstructures are oriented in a 3434 pattern (See FIG. 9). This pattern design can be used to block off the intended path of fluid particles. A 3434 pattern refers to the number of microstructures across one column of a channel (i.e., the number of microstructures in a channel perpendicular to the direction of flow). For example, a 3434 pattern refers to a column of 3 microstructures oriented in a channel perpendicular to the direction of flow, followed by a column of 4 microstructures oriented in a channel perpendicular to the direction of flow, etc. In some instances, the number of columns with 3 microstructures can be repeated at least 1, 2, 3, 4, 5, 6, 7, 8, 9, or 10 or more times followed by 1, 2, 3, 4, 5, 6, 7, 8, 9 or 10 or more columns comprising 4 microstructures.

The microstructure pattern can be repeated through some or all of the length of the channel. The microstructure pattern can be repeated at least 10, 20, 30, 40, 50, 60, 70, 80, 90 or 100% of the length of the channel. The microstructure pattern can be repeated at most 10, 20, 30, 40, 50, 60, 70, 80, 90 or 100% the length of the channel.

The microstructures within a column can be spaced by at least 10, 25, 50, 75, 100, 250, 500, or 750 or more micrometers. The microstructures within a column can be spaced by at most 10, 25, 50, 75, 100, 250, 500, or 750 or more micrometers. The columns of microstructures can be spaced by at least about 10, 25, 50, 75, 100, 250, 500, or 750 or more micrometers. The columns of microstructures can be spaced by at most about 10, 25, 50, 75, 100, 250, 500, or 750 or more micrometers.

Microstructures can have a width of from 250 micrometers to a length of 1000 micrometers with a variable height (e.g., 50, 80 and 100 micrometers). The height, width, or length of the microstructures can be at least 5, 10, 25, 50, 75, 100, 250, 500 micrometers or more. The height, width, or length of the microstructures can be at most 100, 500, 250, 100, 75, 50, 25, or 10 or less micrometers. The size of all the microstructures in a column may not be the same. For example, at least 5, 10, 15, 20, 25, 30, 35, 40, 45, 50, 55, 60, 6, 70, 75, 80, 85, 90, 95 or 100% of the microstructures can be the same size. At most 5, 10, 15, 20, 25, 30, 35, 40, 45, 50, 55, 60, 6, 70, 75, 80, 85, 90, 95 or 100% of the microstructures can be the same size. In some instances, none of the microstructures are the same size. In some instances, at least 5, 10, 15, 20, 25, 30, 35, 40, 45, 50, 55, 60, 6, 70, 75, 80, 85, 90, 95 or 100% of the microstructures have at least one dimension that is the same. In some instances, at most 5, 10, 15, 20, 25, 30, 35, 40, 45, 50, 55, 60, 6, 70, 75, 80, 85, 90, 95 or 100% of the microstructures have at least one dimension that is the same.

Microstructures can create (e.g., induce) a vortex (ie, a disturbed flow) of the fluid as it passes around the microstructures. The vortex can cause an increase of the amount of particles captured by the channel. The number of vortexes created by each microstructure can be at least 1, 2, 3, 4, 5, 6, 7, 8, 9, or 10 or more vortexes. The number of vortexes created by each microstructure can be at most 1, 2, 3, 4, 5, 6, 7, 8, 9, or 10 or more vortexes. In some instances, 2 vortexes are created by a microstructure pattern. In some instances, the microchannel comprises one vortex with subvortexes at different locations within the microchannel.

A vortex can have horizontal fluid vectors (e.g., the flow of fluid in the vortex can be parallel to the direction of flow through a channel). A vortex can be a counterclockwise vortex. A vortex can be a clockwise vortex. A vortex can have vertical fluid vectors (e.g., the flow of fluid in the vortex can be perpendicular to the direction of flow through a channel).

Figure 10:
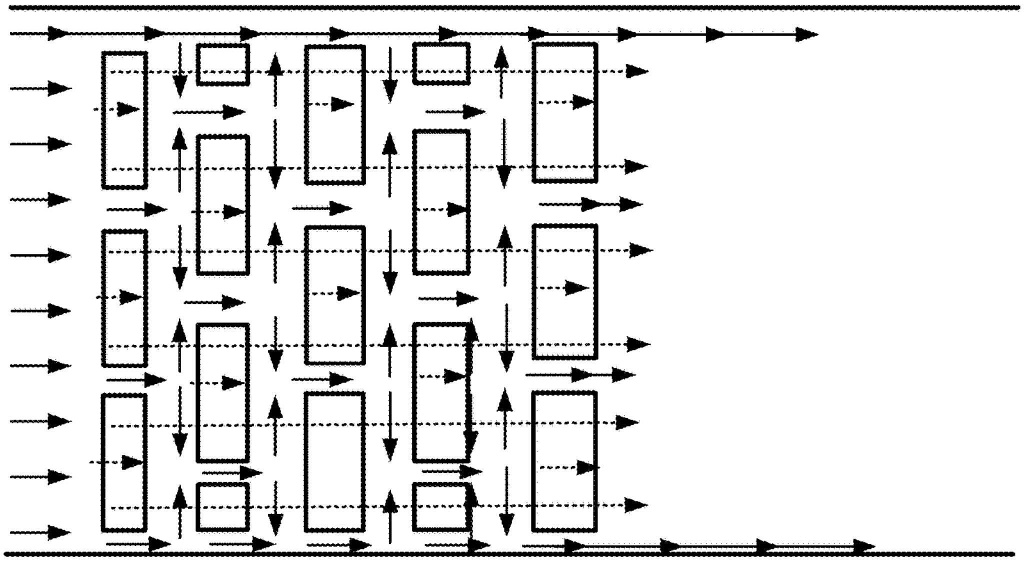
FIG. 10 shows the effect of blocking-off (e.g., slowing down of the flow by the microcavity) of the micro-structure. The solid arrows refer to high velocity vectors and the dotted arrows refer to low velocity vectors.
Figure 11A:
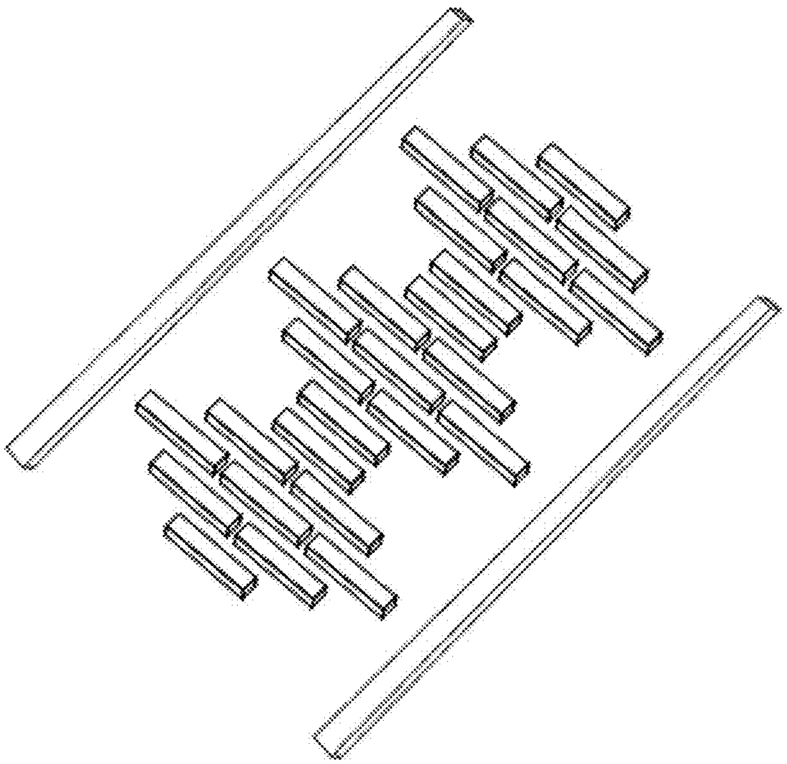
FIG. 11A-E shows exemplary embodiments of the 12321 microstructure pattern.
Figure 11B:
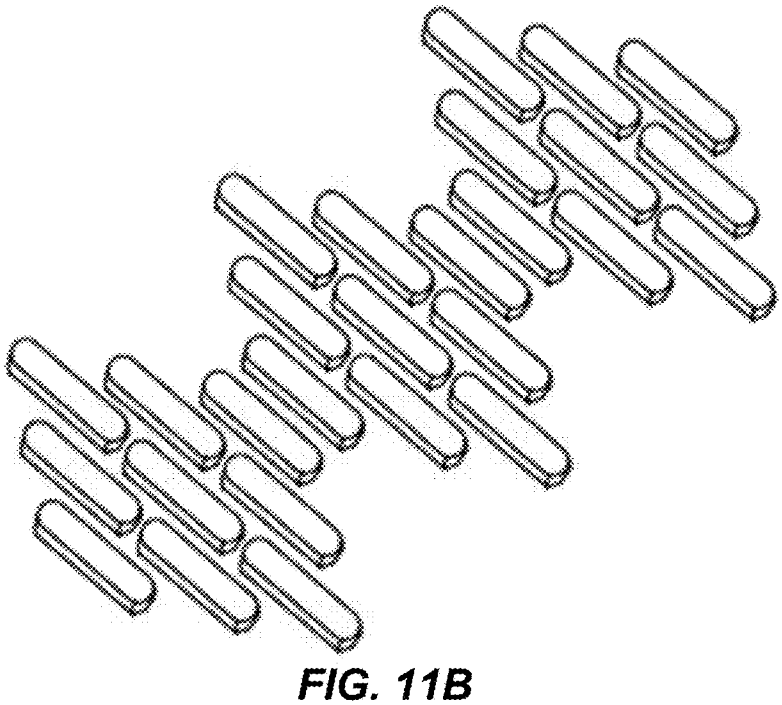
Figure 11C:
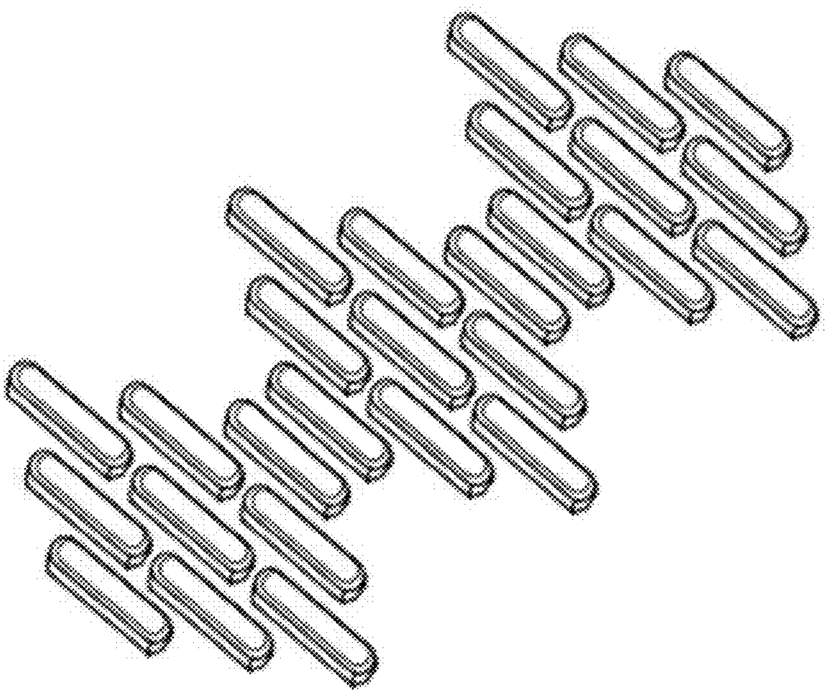
Figure 11D:
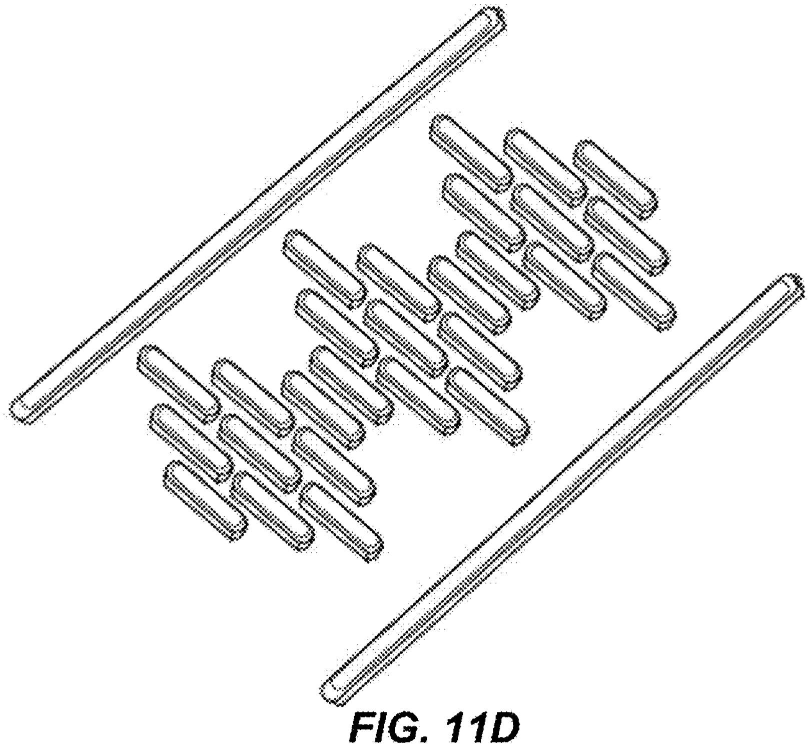
Figure 11E:
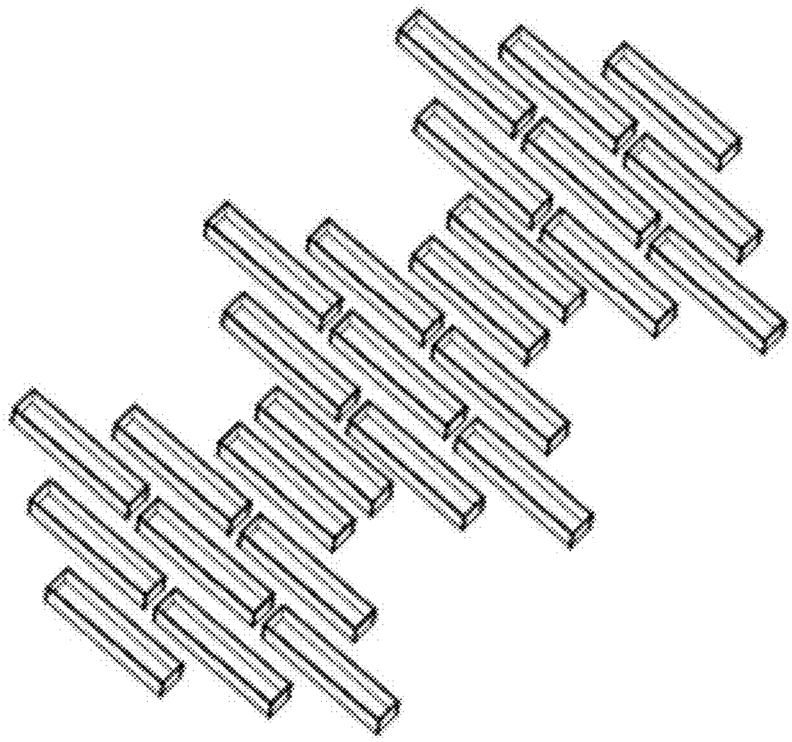
Figure 11F:
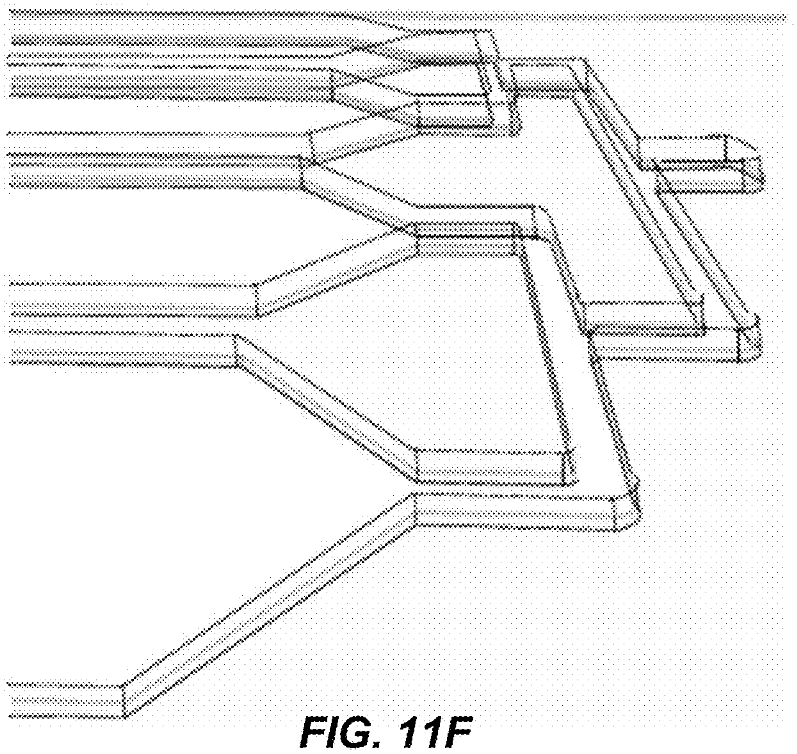
FIG. 11F-G shows exemplary embodiments of the inlet architecture of a microfluidic chip.
Figure 11G:
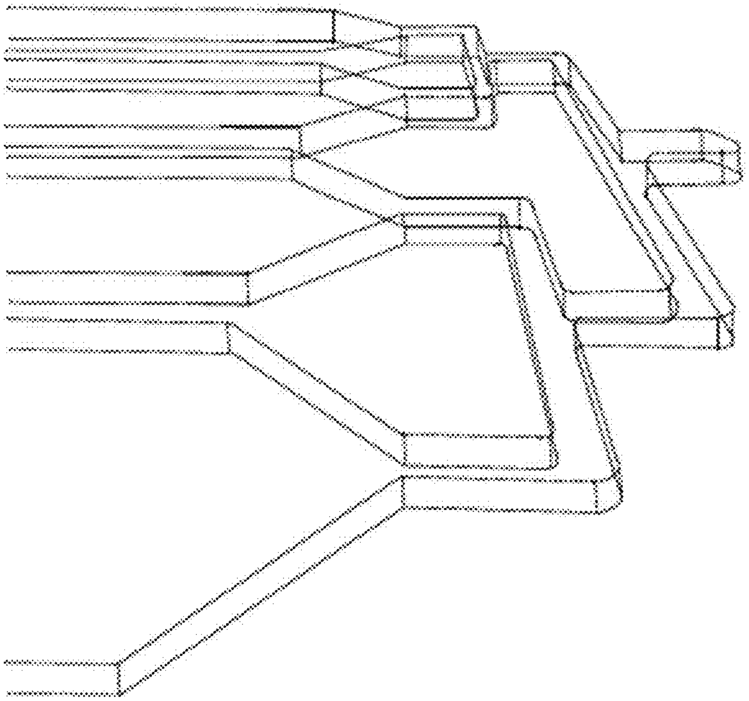
Figure 11H:
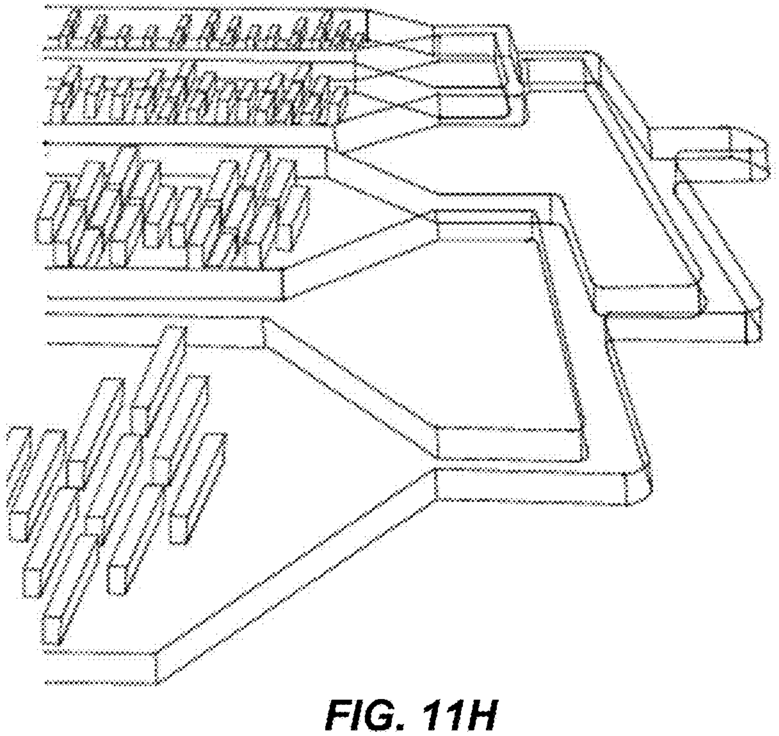
FIG. 11H shows an exemplary embodiment of the inlet architecture of a microfluidic chip with the 12321 micro-structure architecture in the channels.

In some instances, a vortex can comprise two-dimensional movement of the biological sample (e.g., fluid) through the channel. The two-dimensional movement of the sample can occur through the voids in the microstructure columns. Two-dimensional movement of the sample can comprise fluid vectors horizontal and perpendicular to the flow of fluid through the channel (See FIG. 10). In some instances, the fluid flow is three-dimensional. Three-dimensional fluid flow can comprise fluid vectors horizontal, perpendicular, and into space. Three-dimensional fluid flow can occur near microstructures as fluid moves around the microstructure.

A vortex can comprise two or more vortexes. In some instances, a vortex comprises two vortexes. Two vortexes may be perpendicular to each other as measured by their respective vorticities. In some instances, a vortex is influenced by comprising two parts. One part of the two parts of the influenced vortex can have its vorticity parallel to an X axis. One part of the two parts of the vortex can have its vorticity parallel to a Y axis. Some of the two parts of the vortex can comprise a same vorticity. Two vortexes may be perpendicular to each other. In some instances, a vortex comprises two parts. One part of the two parts of the vortex can flow in a clockwise direction. One part of the two parts of the vortex can flow in a counter clockwise direction. Some of the two parts of the vortex can comprise a same flow path (See FIG. 12B, side view).

Vortexes can cause an increase in the binding of particles of interest (e.g., cells) to the microstructures and/or surfaces. A vortex can cause an increase in the binding of a particle of interest to a microstructure and/or surfaces by at least 1, 2, 3, 4, 5, 6, 7, 8, 9, or 10 or more fold. A vortex can cause an increase in the binding of a particle of interest to a microstructure and/or surface by at most 1, 2, 3, 4, 5, 6, 7, 8, 9, or 10 or more fold. A vortex can cause an increase in the binding of a particle of interest by at least 10, 20, 30, 40, 50, 60, 70, 80, 90 or 100%. A vortex can cause an increase in the binding of a particle of interest by at most 10, 20, 30, 40, 50, 60, 70, 80, 90 or 100%.

In some instances a vortex may not focus, guide and/or sort particles of interest through the micro-channel. A vortex may randomly move particles within the sample, where a particle among the particles may or may not become in contact with a microstructure and/or wall of the channel at any time during the particles' random movement. A vortex may increase the binding of particles of interest to a microstructure and/or wall of the channel without preference for a specific type of cell. A vortex may increase the binding of particles of interest to a microstructure and/or wall of the channel with preference for a specific type of cell. A vortex can interact with another vortex within a channel. A vortex can interact with 1, 2, 3, 4, 5, 6, 7, or more vortexes. A vortex can interact with another vortex with fluid vectors in the horizontal and/or perpendicular direction (i.e., a vortex can intersect with another vortex, a vortex can be above or below a vortex). A vortex may increase the movement of particles within the fluid, where the fluid is within the channel. The increased particle movement can increase the proximity of the particles to the microstructure and/or wall of the channel The strength of a vortex may be influenced by the rate of flow of fluid through a channel. The strength of a vortex can be measured in the velocity of the fluid in the vortex. The velocity of fluid in the vortex may increase when the rate of flow of fluid through the channel is increased. The velocity of fluid in the vortex may decrease when the rate of flow of fluid through the channel is increased.

Microstructures can be made by any method. In some instances, microstructures (e.g., a microstructure pattern) is made by attaching microstructures to a surface of the microfluidic channel. Microstructures can be made by removing parts of the surface (e.g., a top surface), wherein the removing cuts away the structure to reveal the microstructure shape. Methods of cutting can include, for example, etching, laser cutting, or molding (e.g., injection molding). In some instances, microstructures (e.g., in a microstructure pattern are made by growing (e.g., a semiconductor fabrication process, i.e., using photoresist). Exemplary methods for making microstructures in a microfluidic channel can include photolithography (e.g., stereolithography or x-ray photolithography), molding, embossing, silicon micromachining, wet or dry chemical etching, milling, diamond cutting, Lithographie Galvanoformung and Abformung (LIGA), and electroplating. For example, for glass, traditional silicon fabrication techniques of photolithography followed by wet (KOH) or dry etching (reactive ion etching with fluorine or other reactive gas) can be employed. Techniques such as laser micromachining can be adopted for plastic materials with high photon absorption efficiency. This technique can be suitable for lower throughput fabrication because of the serial nature of the process. For mass-produced plastic devices, thermoplastic injection molding, and compression molding can be used. Conventional thermoplastic injection molding used for mass-fabrication of compact discs (which preserves fidelity of features in sub-microns) may also be employed to fabricate the devices. For example, the device features can be replicated on a glass master by conventional photolithography. The glass master can be electroformed to yield a tough, thermal shock resistant, thermally conductive, hard mold. This mold can serve as the master template for injection molding or compression molding the features into a plastic device. Depending on the plastic material used to fabricate the devices and the requirements on optical quality and throughput of the finished product, compression molding or injection molding may be chosen as the method of manufacture. Compression molding (also called hot embossing or relief imprinting) can be compatible with high-molecular weight polymers, which are excellent for small structures, but can be difficult to use in replicating high aspect ratio structures and has longer cycle times. Injection molding works well for high-aspect ratio structures or for low molecular weight polymers. A device may be fabricated in one or more pieces that are then assembled.

Changes in Microstructure Height

Figure 15:
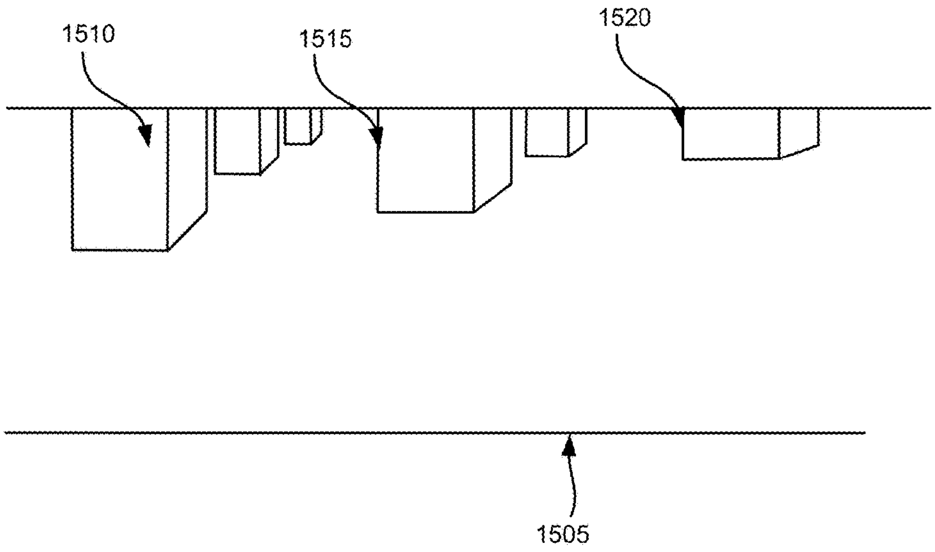
FIG. 15 depicts depths of microstructures in columns in a channel.

Microstructure depths can vary in a repetitive pattern. In some instances, microstructure depths correlates with any microstructure pattern as described above. The microstructures located at the ends of a column of microstructures can have the longest dimension of depth (e.g., depth into the channel). For example, FIG. 15 shows the walls of a channel 1505 with microstructures emanating from the top wall of the channel 1510/1515/1520. In some embodiments, the microstructures 1510 of column with the largest number of microstructures (e.g., 3) are the longest, or have the longest depth into the channel. The microstructures in a column with a number of microstructures between the minimum and the maximum number of microstructures 1515 can have an intermediate depth into the channel. In some instances, the microstructures 1520 in the column with the minimum number of microstructures (e.g., 1) have the shortest depth into the channel.

The microstructures located in a column of microstructures closest to the walls of the channel can have the shortest dimension of depth (e.g., depth into the channel). The microstructures located in a column farthest from the walls of the channel can have the longest dimension of depth. The microstructures located in a column farthest from the walls of the channel can have the shortest dimension of depth. The microstructures located in a column with the maximum number of microstructures can have the longest dimension of depth (e.g., depth). The microstructures located in a column with the maximum number of microstructures can have the shortest dimension of depth (e.g., depth). The microstructures located in a column with the minimum number of microstructures can have the longest depth. The microstructures located in a column with the minimum number of microstructures can have the shortest depth.

The depth of the microstructures can be at least 1, 5, 10, 15, 20, 25, 30, 35, 40, 45, 50, 55, 60, 65, 70, 75, 80, 85, 90, 95 or 100 or more microns. The depth of the microstructures can be at most 1, 5, 10, 15, 20, 25, 30, 35, 40, 45, 50, 55, 60, 65, 70, 75, 80, 85, 90, 95 or 100 or more microns. The difference between then depth of the longest and the shortest microstructure can be at least 1, 5, 10, 15, 20, 25, 30, 35, 40, 45, 50, 55, 60, 65, 70, 75, 80, 85, 90, 95 or 100 or more microns. The difference between then depth of the longest and the shortest microstructure can be at most 1, 5, 10, 15, 20, 25, 30, 35, 40, 45, 50, 55, 60, 65, 70, 75, 80, 85, 90, 95 or 100 or more microns. The depth of the microstructures can be at least 10, 20, 30, 40, 50, 60, 70, 80, 90 or 100% of the depth of the channel. The depth of the microstructures can be at most 10, 20, 30, 40, 50, 60, 70, 80, 90 or 100% of the depth of the channel.

Microstructures within a column can have varying depths. The depths of microstructures within a column can vary by at least 10, 20, 0, 40, 50, 60, 70, 80, 90, or 100% or more. The depths of microstructures within a column can vary by at most 10, 20, 30, 40, 50, 60, 70, 80, 90, or 100% or more. Some of the depths of the microstructures within a same column can be the same. Some of the depths of the microstructures within a same column can be different.

Vortexes can be created between microstructure columns of varying depths. The varying depths of the microstructures in a microstructure pattern can influence features of the vortexes in the channel, such as strength of the vortex and direction of flow vectors of the vortex.

In some embodiments, the depth of the microstructures alternate between columns of microstructures, wherein alternating columns of microstructures in a microstructure pattern comprise either morn number of microstructures, wherein m−n is 1. M or n can be at least 1, 2, 3, 4, 5, 6, 7, 8, 9 or 10 or more. In some instances, the number of columns with m microstructures can be repeated at least 1, 2, 3, 4, 5, 6, 7, 8, 9, or 10 or more times followed by 1, 2, 3, 4, 5, 6, 7, 8, 9 or 10 or more columns comprising n microstructures. The depth of the microstructures in a column with m microstructures can be at least 10, 20, 30, 40, 50, 60, 70, 80, 90 or 100% of the depth of the microstructures in a column with n microstructures. The depth of the microstructures in a column with m microstructures can be at most 10, 20, 30, 40, 50, 60, 70, 80, 90 or 100% of the depth of the microstructures in a column with n microstructures. The difference in the depth between the microstructures in a column with m microstructures and n microstructures can be at least 10, 20, 0, 40, 50, 60, 70, 80, 90, or 100 or more microns. The difference in the depth between the microstructures in a column with m microstructures and n microstructures can be at most 10, 20, 0, 40, 50, 60, 70, 80, 90, or 100 or more microns.

In some embodiments, an alternating pattern of columns comprises two or more differently sized microstructures. For example, columns can alternate between m and n number of first sized columns. When a column has the smallest number of microstructures it can also comprise microstructures of a second size at the ends of the microstructure column (e.g., at the ends closest to the walls of the channel). The depth of the microstructures of the second sized microstructures can be at least 10, 20, 30, 40, 50, 60, 70, 80, 90 or 100% of the depth of the first sized microstructures. The depth of the microstructures of the second sized microstructures can be at most 10, 20, 30, 40, 50, 60, 70, 80, 90 or 100% of the depth of the first sized microstructures. In some instances, the depth of the second sized microstructures is the same as the first sized microstructures.

Figure 12A:
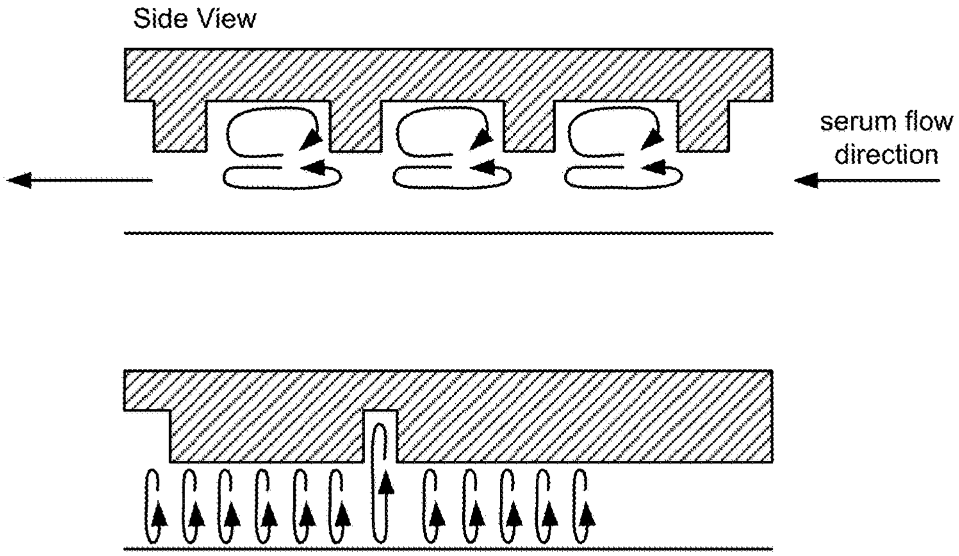
FIG. 12A-B depicts vortexes generated by the microstructure architecture in a channel.
Figure 12B:
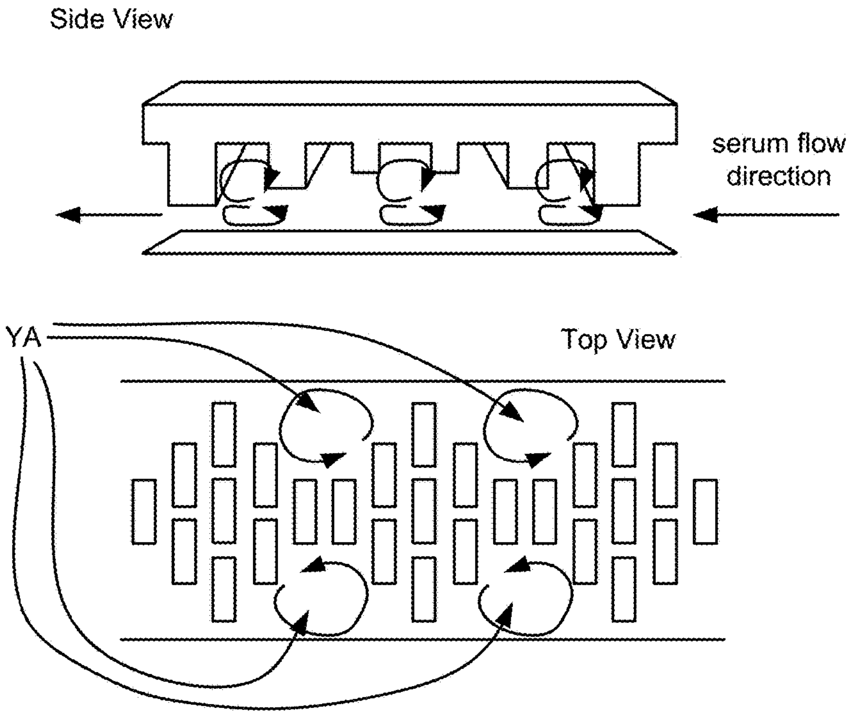

In some embodiments, when the depth of microstructures in adjacent columns increases until the column consisting of the maximum number of microstructures in the microstructure pattern, after which the depth of microstructures in each adjacent column decreases until the column consisting of the minimum number of microstructures in the microstructure pattern (See FIG. 12B).

For example, a microstructure pattern can be x, x+1, x+2 . . . x+n . . . x+2, x+1, x, wherein x is any integer number and x+n is the maximum number of microstructures in a column, and wherein each variable separated by a comma represents an adjacent column, (e.g., 1232123212321 (i.e., wherein each number refers to the number of microstructures in a column, wherein each number represents a column), and wherein the depth of the microstructures in x is less than x+1, which is less than x+2, which is less than x+n. In some instances, the depth of the microstructures in x is more than x+1, which is more than x+2, which is more than x+n.

In some instances, the microstructure pattern can be a pattern wherein the depth of microstructures in adjacent columns increases until the column consisting of the maximum number of microstructures in the microstructure pattern, after which the whole set of columns is repeated in which the depth of microstructures in each adjacent column decreases until the column consisting of the minimum number of microstructures in the microstructure pattern. For example, a microstructure pattern can be x, x, x+1, x+2 . . . x+n . . . x+2, x+1, x, x (e.g., 1233212332123321), wherein the depth of x, x+1, x+2 . . . x+n varies (e.g., the depth increases, or the depth decreases). In some instances, the columns with the largest and the smallest number of microstructures can be repeated next to each other. For example, the pattern can be 123211232112321 or 123321123321123321.

Microstructure-Free Zones

In some instances, the microstructure pattern creates microstructure free zones. The microstructure free zones can be located between the walls of the channel and the microstructures in a column. The microstructure free zones can be located on the same surface as the surface from which the microstructures emanate. The microstructure free zones can be located on a different surface than the surface from which the microstructures emanate. In some instances, a microstructure free zone can comprise a volume which can comprise the space between the top and bottom surfaces of the channel.

Figure 13A:
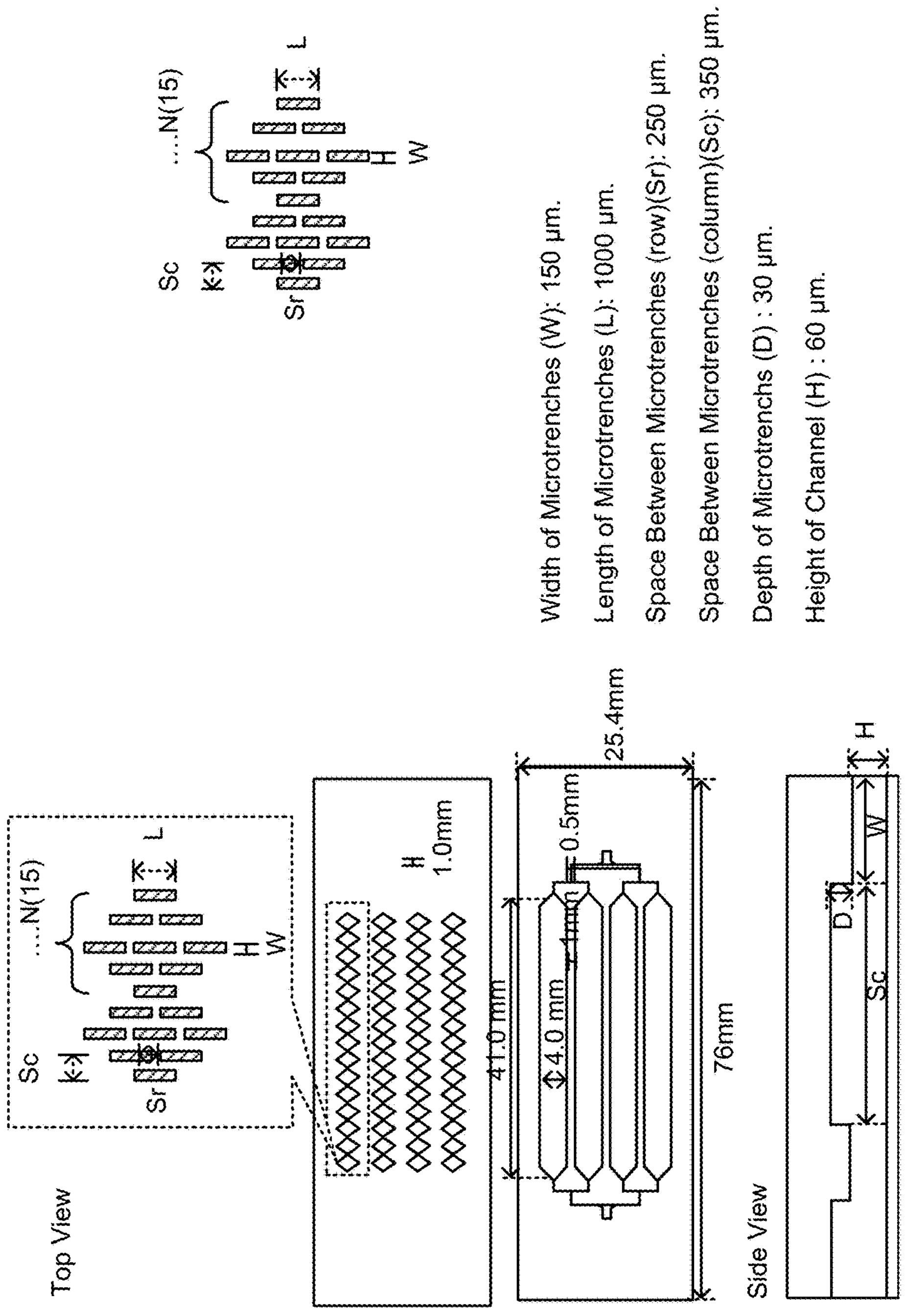
FIG. 13A-B depicts an exemplary embodiment of the dimensions of the microstructures in a microfluidic channel.
Figure 13B:
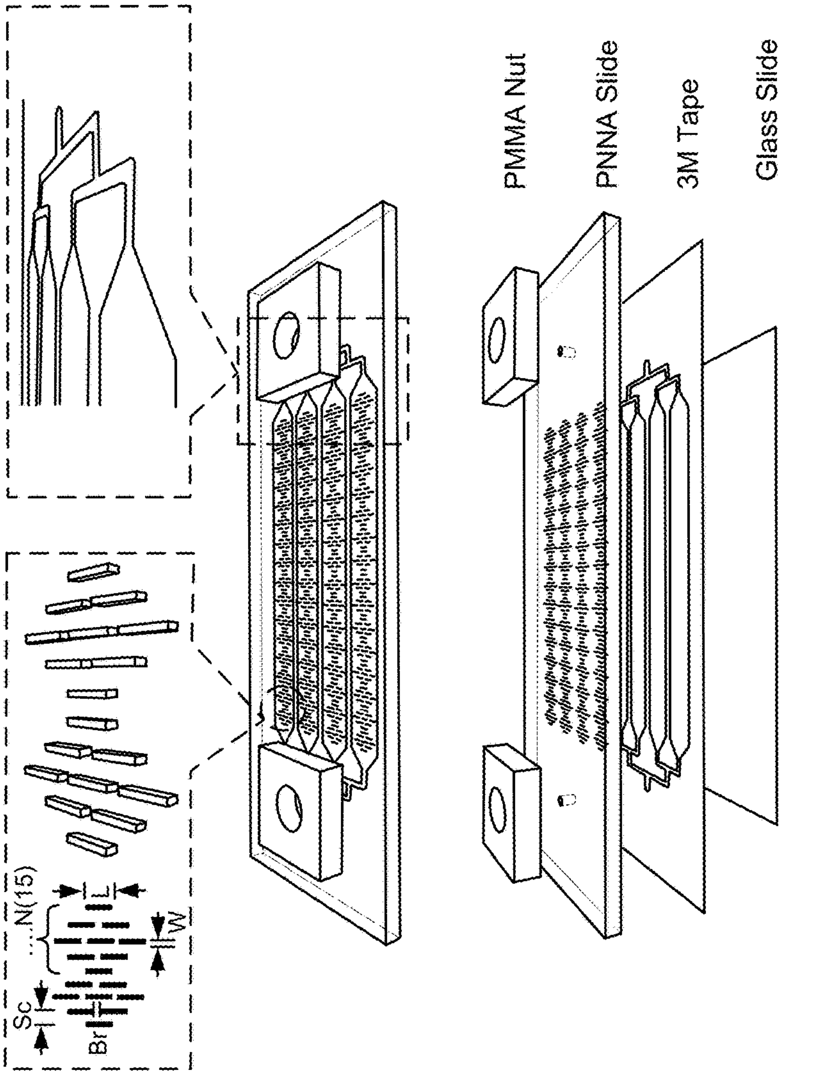

The microstructure-free zones can induce a vortex. A microstructure-free zone can be any shape. A microstructure-free zone can be a rectangle, a square, an oval, or a triangle. In some instances, a microstructure-free zone is triangular. A triangular microstructure-free zone can be considered to have three "sides", wherein one side is the wall of the channel, and wherein the two other "sides" lie along the outermost edges of the microstructures in a series of columns. Two microstructure-free zones can be created for two repeats of a microstructure pattern. In some instances, the two microstructure-free zones are separated by a column comprising at least one microstructure. The microstructure free zones (e.g., at least 10, 20, 30, 40 or 50 of them) are located on the same surface of the channel (e.g., the top surface). They create regions that are symmetrical of one another. Symmetrical regions are separated by one or more microstructures. A microstructure free zone can be at least 700 microns wide (distance from side of channel to first microstructure between two symmetrical zones). A microstructure free zone can be at least 400 microns long (between two microstructures along the fluid flow path encompassing the zone. This is shown in FIG. 13.

A microstructure-free zone can be at least 20, 30, 40, 50, 60, 70, 80, 90 or 100% of the width of the channel. A microstructure-free zone can be at most 20, 30, 40, 50, 60, 70, 80, 90 or 100% of the width of the channel. The length of a microstructure-free zone can be the distance between the outermost microstructures of the columns with the largest number of microstructures. In some instances, the distance between the columns with the largest number of microstructures is at least 0.3, 0.4, 0.5, 0.6, 0.7, 0.8, 0.9, 1.0, 1.1, 1.2, 1.3, 1.4, 1.5 1.6, 1.7, 1.8, 1.9 or 2.0 or more millimeters. In some instances, the distance between the columns with the largest number of microstructures is at most 0.3, 0.4, 0.5, 0.6, 0.7, 0.8, 0.9, 1.0, 1.1, 1.2, 1.3, 1.4, 1.5 1.6, 1.7, 1.8, 1.9 or 2.0 or more millimeters.

Functionalized Surfaces

The surface (e.g., microfluidic channel) can be coated with a non-fouling composition. A non-fouling composition can be a composition that prevents fouling (e.g., prevents binding of non-specific particles, while retaining the ability to bind particles of interest). The non-fouling composition can act as a lubricating surface such that only low flow shear stress, or low flow rates, can be used in the methods of the disclosure.

The non-fouling composition can comprise a lipid layer. The lipid layer can comprise a lipid monolayer, a lipid bilayer, lipid multilayers, liposomes, polypeptides, polyelectrolyte multilayers (PEMs), polyvinyl alcohol, polyethylene glycol (PEG), hydrogel polymers, extracellular matrix proteins, carbohydrate, polymer brushes, zwitterionic materials, poly(sulfobetaine) (pSB), and small organic compounds, or any combination thereof. Exemplary lipids that can be used in a non-fouling can include, but are not limited to, 1,2-dioleoyl-sn-glycero-3-phosphoethanolamine-N-(cap biotinyl) (sodium salt) (b-PE), 1-Palmitoyl-2-oleoyl-sn-glycero-3-phosphocholine (POPC), diacylglycerols, phospholipids, glycolipids, sterols, phosphatidylcholine (PtdCho), phosphatidylethanolamine (PtdEtn), phosphatidylinositol (PtdIns), phosphatidylserine (PtdSer), and phosphosphingolipids.

The non-fouling composition can comprise polyethylene glycol (PEG). The PEG can comprise a molecular weight of at least about 50, 100, 200, 500, 700, 1000, 5000, 10000, 15000, 50000, 75000, 100000, 150000, 200000, or 250000 or more daltons. The PEG can comprise a molecular weight of at most about 50, 100, 200, 500, 700, 1000, 5000, 10000, 15000, 50000, 75000, 100000, 150000, 200000, or 250000 or more daltons. The PEG can comprise a molecular weight from 100 to 100,000 daltons.

The non-fouling composition can comprise polyelectrolyte multilayers (PEMs). A PEM can refer to a polymer comprising an electrolyte. Exemplary PEMs can include, but are not limited to, poly-L-lysine/poly-L-glutamic acid (PLL/PLGA), poly-L-lysine/poly-L-aspartic acid, poly(sodium styrene sulfonate) (PSS), polyacrylic acid (PAA), poly(ethacrylic acid) (PEA), or any combination thereof.

The non-fouling composition can comprise a polymer brush. A polymer brush can refer to a polymer that can be attached at one end to a surface. Exemplary polymer brushes can include ([2-(acryloyloxy)ethyl]trimethyl ammonium chloride, TMA)/(2-carboxy ethyl acrylate, CAA) copolymer.

The non-fouling composition can comprise lipids, PEGs, polyelectrolyte multilayers, or polymer brushes, or any combination thereof.

The non-fouling composition can comprise a thickness. The thickness of the non-fouling composition can be at least about 0.5, 1, 10, 25, 50, 75, 100, 200, 300, 400, 500, 600, 700, 800, or 900 or more nanometers. The thickness of the non-fouling composition can be at most about 0.5, 1, 10, 25, 50, 75, 100, 200, 300, 400, 500, 600, 700, 800, or 900 or more nanometers.

A non-fouling composition can comprise a functional group. A functional group can be capable of covalent and/or non-covalent attachment. Exemplary functional groups can include, but are not limited to hydroxy groups, amine groups, carboxylic acid or ester groups, thioester groups, aldehyde groups, epoxy or oxirane groups, hyrdrazine groups and thiol groups, biotin, avidin, streptavidin, DNA, RNA, ligand, receptor, antigen, antibody and positive-negative charges. A functional group can be attached to a lipid of the non-fouling composition.

The non-fouling composition can be covalently attached to the surface. The non-fouling composition can be non-covalently attached to the surface. The non-fouling composition can interact with the surface by hydrogen bonding, van der waals interactions, ionic interactions, and the like.

The non-fouling composition can bind a particle of interest while reducing the binding of other non-specific particles. The non-fouling composition can bind less than 1, 5, 10, 15, 20, 25, 30, 35, 40, 45, or 50% or more non-specific particles.

The surface may comprise a fouling composition. A fouling composition may comprise a composition that induces the aggregation and/or precipitation of non-specific particles of interest.

The surface may be a functionalized surface. The surface may be functionalized with, for example, dyes, organic photoreceptors, antigens, antibodies, polymers, poly-D-lysine, an oxide chosen among $HfO_2$, $TiO_2$, $Ta_2O_5$, $ZrO_2$ and their mixtures, organic compounds, and functionalized nanolayers. A surface can be functionalized with non-specific binding agents such as an extracellular matrix, and a thin-film coating. A surface may be functionalized by, for example, soft-lithography, UV irradiation, self-assembled monolayers (SAM) and ink-jet printing.

Binding Moieties

The surface can be coated with binding moieties selected to bind a particle of interest. The binding moiety can be conjugated to the surface. Types of conjugation can include covalent binding, non-convalent binding, electrostatic binding, and/or van der Waals binding. The binding moiety can be conjugated to the non-fouling composition (e.g., a lipid in the non-fouling composition).

A binding moiety can comprise a moiety that can specifically bind a particle of interest. Exemplary binding moieties can include synthetic polymers, molecular imprinted polymers, extracellular matrix proteins, binding receptors, antibodies, DNA, RNA, antigens, aptamers, or any other surface markers which present high affinity to the biological substance.

The binding moiety can bind to the particle of interest through, for example, molecular recognition, chemical affinity, and/or geometrical/shape recognition.

The binding moiety can comprise an antibody. The antibody can be an anti-EpCAM membrane protein antibody. The anti-EpCAM membrane protein antibody can be EpAb4-1antibody, comprising a heavy chain sequence with SEQ ID No:1 and a light chain sequence with SEQ ID NO: 2 shown in Table 1.

TABLE 1

Amino Acid Sequence of VH and VL domains of EpAb4-1 antibody. Complementary-determining regions 1-3 (CDR1-3), framework regions 1-4 (FW1-4) for both the VH and VL domains are shown.

| | FW1 | CDR1 | FW2 | CDR2 |
|---|---|---|---|---|
| SEQ ID NO: 1 (VH) | QIQLVQSGPELKKPGETV KISCKAS | **GYTFTNYG MN** | WVKQAPGKGLK WMGW | **INTYTGEP** |
| SEQ ID NO: 2 (VL) | DIVMTQAAFSNPVTLGTS ASISC | **RSSKSLLH SNGITYLY** | WYLQKPGQSPQ LLIY | **HMSNLAS** |

| | FW3 | CDR3 | FW4 | Family |
|---|---|---|---|---|
| SEQ ID NO: 1 (VH) | TYGDDFKGRFAFSLETSA STAYLQINNLKNEDTATY FCAR | **FGRSVDF** | WGQGTSVTVSS | VH9 |

TABLE 1-continued

Amino Acid Sequence of VH and VL domains of EpAb4-1 antibody. Complementary-determining regions 1-3 (CDR1-3), framework regions 1-4 (FW1-4) for both the VH and VL domains are shown.

| | | | | |
|---|---|---|---|---|
| SEQ ID NO: 2 (VL) | GVPDRFSSSGSGTDFTLRI SRVEAEDVGIYYC | **AQNLENP R T** | FGGGTKLEIK | VK24/25 |

The binding moiety can comprise a functional group. The functional group can be used to attach the binding moiety to the non-fouling composition and/or the surface. The functional group can be used for covalent or non-covalent attachment of the binding moiety. Exemplary functional groups can include, but are not limited to: hydroxy groups, amine groups, carboxylic acid or ester groups, thioester groups, aldehyde groups, epoxy or oxirane groups, hyrdrazine groups, thiol groups, biotin, avidin, streptavidin, DNA, RNA, ligand, receptor, antigen-antibody and positive-negative charges.

In some embodiments, functional groups comprise biotin and streptavidin or their derivatives. In some embodiments, functional groups comprise 1-Ethyl-3-[3-dimethylaminopropyl]carbodiimide hydrochloride (EDC) and N-hydroxysulfosuccinimide (Sulfo-NHS). In some embodiments, the functional groups comprise sulfo Succinimidyl-4-(N-maleimidomethyl)cyclohexane-1-carboxylate (sulfo-SMCC).

In some embodiments, the microfluidic surface comprises a non-fouling composition comprising a lipid non-covalently bound to the surface, and the non-fouling composition is attached to a binding moiety by a linker.

Linkers

A linker can join the non-fouling composition and the binding moiety. Linkers can join the binding moiety to the surface. Linkers can join the non-fouling composition to the surface. A linker can join the non-fouling composition and the binding moiety covalently or non-covalently. Exemplary linkers can include, but are not limited to: hydroxy groups, amine groups, carboxylic acid or ester groups, thioester groups, aldehyde groups, epoxy or oxirane groups, hyrdrazine groups thiol groups, biotin, avidin, streptavidin, DNA, RNA, ligand, receptor, antigen, antibody, and positive-negative charges, or any combination thereof.

The linker can comprise a cleavable linker. Exemplary cleavable linkers can include, but are not limited to: a photosensitive functional group cleavable by ultraviolet irradiation, an electrosensitive functional group cleavable by electro pulse mechanism, a magnetic material cleavable by the absence of the magnetic force, a polyelectrolyte material cleavable by breaking the electrostatic interaction, a DNA cleavable by hybridization, and the like.

Particles of Interest, Samples, and Subjects

The disclosure provides for capturing particles of interest. A particle of interest can be a cell. A cell can refer to a eukaryotic cell. A eukaryotic cell can be derived from a rat, cow, pig, dog, cat, mouse, human, primate, guinea pig, or hamster (e.g., CHO cell, BHK cell, NSO cell, SP2/0 cell, HEK cell). A cell can be a cell from a tissue (such as blood cells or circulating epithelial or endothelial cells in the blood), a hybridoma cell, a yeast cell, a virus (e.g., influenza, coronaviruses), and/or an insect cell. A cell can be a cell derived from a transgenic animal or cultured tissue. A cell can be a prokaryotic cell. A prokaryotic cell can be a bacterium, a fungus, a metazoan, or an archea. A cell can refer to a plurality of cells.

A particle of interest can refer to a part of a cell. For example, a cell can refer to a cell organelle (e.g., golgi complex, endoplasmic reticulum, nuclei), a cell debris (e.g., a cell wall, a peptidoglycan layer), and/or a the contents of a cell (e.g., nucleic acid contents, cytoplasmic contents).

A particle of interest can be a rare cell. Exemplary cells can include but are not limited to: rare cancer cells, circulating tumor cells, circulating tumor microemboli, blood cells, endothelial cells, endoderm-derived cells, ectoderm-derived cells, and meso-derm derived cells, or any combination thereof.

A particle of interest can be part of a sample. A sample can comprise a plurality of particles, only some of which are particles of interests. A particle can refer to a cell, a nucleic acid, a protein, a cellular structure, a tissue, an organ, a cellular break-down product, and the like. A particle can be a fouling particle. A particle may not bind to a non-fouling composition. A sample can comprise at least about 0.1, 0.2, 0.3, 0.4, 0.5, 0.6, 0.7, 0.8, 0.9, 1, 2, 3, 4, 5, 6, 7, 8, 9, or 10% or more particles of interest. A sample can comprise at most about 0.1, 0.2, 0.3, 0.4, 0.5, 0.6, 0.7, 0.8, 0.9, 1, 2, 3, 4, 5, 6, 7, 8, 9, or 10% or more particles of interest.

A sample can be obtained from a subject. A subject can be a human. A subject can be a non-human. A subject can be, for example, a mammal (e.g., dog, cat, cow, horse, primate, mouse, rat, sheep). A subject can be a vertebrate or invertebrate. A subject can have a cancer disease. A subject can have a disease of rare cells. A subject may have a disease of rare cells, or cancer, and not show symptoms of the disease. The subject may not know they have cancer or a disease of rare cells.

A sample can comprise a bodily fluid. Exemplary bodily fluids can include, but are not limited to, blood, serum, plasma, nasal swab or nasopharyngeal wash, saliva, urine, gastric fluid, spinal fluid, tears, stool, mucus, sweat, earwax, oil, glandular secretion, cerebral spinal fluid, tissue, semen, vaginal fluid, interstitial fluids, including interstitial fluids derived from tumor tissue, ocular fluids, spinal fluid, throat swab, breath, hair, finger nails, skin, biopsy, placental fluid, amniotic fluid, cord blood, emphatic fluids, cavity fluids, sputum, pus, micropiota, meconium, breast milk and/or other excretions.

Methods

The disclosure provides for methods for capturing a particle of interest (e.g., circulating tumor cell, rare cell). The particle of interest can be captured on the surface. The surface can be coated with a non-fouling composition. The non-fouling composition can comprise a binding moiety that specifically binds to the particle of interest.

Capture

In order to capture a particle of interest, a sample comprising a particle of interest can be flowed over a surface. The flow rate can comprise a linear velocity of at least 0.1, 0.2, 0.3, 0.4, 0.5, 1, 1.5, 2, 2.5, 3, 3.5, 4, 4.5, 5, 5.5, 6, 6.5, or 7 or more mm/s. The flow rate can comprise a linear velocity of at most 0.1, 0.2, 0.3, 0.4, 0.5, 1, 1.5, 2, 2.5, 3, 3.5, 4, 4.5, 5, 5.5, 6, 6.5, or 7 or more mm/s. The flow rate can comprise a linear velocity from 0.5 to 4 mm/s. The flow rate can comprise a linear velocity from 2.5 to 4 mm/s. The flow rate can be a rate wherein at least 50, 60, 70, 80, 90, or 100% of the particles of interest bind to the binding moiety. The flow rate can be a rate wherein at most 50, 60, 70, 80, 90, or 100% of the particles of interest bind to the binding moiety. The flow rate can be a rate that does not damage the particles of interest.

The surface can capture at least 50, 60, 70, 80, 90 or 100% of the particles of interest from the sample. The surface can capture at most 50, 60, 70, 80, 90 or 100% of the particles of interest from the sample. The surface can capture at least 5, 10, 25, 50, 100, 200, 300, 400, 500, 1000, 1500, 2000, or 2500 particles of interest per milliliter of sample. The surface can capture at most 5, 10, 25, 50, 100, 200, 300, 400, 500, 1000, 1500, 2000, or 2500 particles of interest per milliliter of sample.

The rate and pressure of fluid flow can be selected to provide a desired rate of binding to the surface. The fluid flow velocity can also be selected to provide a desired shear stress to particles of interest bound to the surface. At least two variables can be manipulated to control the shear stress applied to the channel: the cross sectional area of the chamber and the fluid pressure applied to the chamber. Other factors can be manipulated to control the amount of shear stress necessary to allow binding of desired particles of interest and to prevent binding of undesired particles, (e.g., the binding moiety employed and the density of the binding moiety in the channel). Pumps that produce suitable flow rates (and thurs, shear forces) in combination with microfluidic channels can produce a unidirectional shear stress (i.e., there can be substantially no reversal of direction of flow, and/or substantially constant shear stress). Either unidirectional or substantially constant shear stress can be maintained during the time in which a sample is passed through a channel Purification by Washing The surface can be further purified by removing non-specific particles of interest and/or other components of the sample. Purification can be performed by flowing a wash buffer over the surface. The flow rate of the wash buffer can comprise a linear velocity of at least 0.1, 0.2, 0.3, 0.4, 0.5, 1, 1.5, 2, 2.5, 3, 3.5, 4, 4.5, 5, 5.5, 6, 6.5, 7, 7.5, 8, 8.5, or 9 or more mm/s. The flow rate of the wash buffer can comprise a linear velocity of at most 0.1, 0.2, 0.3, 0.4, 0.5, 1, 1.5, 2, 2.5, 3, 3.5, 4, 4.5, 5, 5.5, 6, 6.5, 7, 7.5, 8, 8.5, or 9 or more mm/s. The flow rate of the wash buffer can comprise a linear velocity from 0.5 to 4 mm/s or more. The flow rate of the wash buffer can comprise a linear velocity from 2.5 to 4 mm/s or more. The flow rate of the wash buffer can be a rate wherein at least 50, 60, 70, 80, 90, or 100% of the particles of interest remain bound to the binding moiety. The flow rate of the wash buffer can be a rate wherein at most 50, 60, 70, 80, 90, or 100% of the particles of interest remain bound to the binding moiety. The flow rate of the wash buffer can be a rate that does not damage the particles of interest. Damage can refer to morphological changes in the particle of interest, degradation of the particle of interest, changes in viability of the particles of interest, lysis of the particles of interest, and/or changes in gene expression (e.g., metabolism) of the particle of interest.

Flowing of the wash buffer (i.e., rinsing), can remove at least 40, 50, 60, 70, 80, 90, or 100% of non-specific particles of interest. Flowing of the wash buffer (i.e., rinsing), can remove at most 40, 50, 60, 70, 80, 90, or 100% of non-specific particles of interest. Flowing of the wash buffer can leech at least 1, 2, 3, 4, 5, 6, 7, 8, 9, 10, or 15% or more particles of interest from the non-fouling composition of the surface. Flowing of the wash buffer can leech at most 1, 2, 3, 4, 5, 6, 7, 8, 9, 10, or 15% or more particles of interest from the non-fouling composition of the surface.

Release

The methods of the disclosure provide a releasing method for collecting a particle of interest, wherein the released particle of interest is viable. Release of a particle of interest can be performed by flowing a foam composition comprising air bubbles over the surface (e.g., a surface comprising a non-fouling layer, linker, and/or binding moiety). In some instances, a foam composition comprising 4 milliliters of a 5% BSA in PBS, 2 mL of air, wherein at least 50% of the air bubbles of the foam composition have a diameter from about 10 to 100 micrometers when flowed over a surface at a flow rate from 0.5-4 mm/s or more to release a particle of interest.

Use of the foam composition (e.g., the air bubbles of the foam composition) to release cells, can result in the removal of the non-fouling composition and/or binding moiety from the surface. Methods to release cells can result in the removal of at least 50, 60, 70, 80, 90 or 100% of the non-fouling composition and/or binding moiety from the surface. Methods to release cells can result in the removal of at most 50, 60, 70, 80, 90 or 100% of the non-fouling composition and/or binding moiety from the surface. In some instances, the releasing method (e.g., foam composition) removes at least 70% of the non-fouling composition and/or binding moiety. In some instances, a foam composition comprising 4 milliliters of a 5% BSA in PBS, 2 mL of air, wherein at least 50% of the air bubbles of the foam composition have a diameter from about 10 to 100 micrometers when flowed over a surface at a flow rate from 0.5-4 mm/s or more to can result in the removal of at least 50% of the non-fouling composition, binding moiety, linker, and/or particle of interest from the surface.

Particles of interest released by the foam composition of the disclosure can be viable. Particles of interest released by the foam composition of the disclosure can be non-viable. At least 50, 60, 70, 80, 90, or 100% of the particles of interest released can be viable. At most 50, 60, 70, 80, 90, or 100% of the particles of interest released can be viable. Viability can be determined by changes in morphology (e.g., lysis), gene expression (e.g., caspase activity), gene activity (shutdown of certain cellular pathways), and cellular function (e.g., lack of motility). In some instances, released cells can be used for downstream processes such as ELISAs, immunoassays, culturing, gene expression, and nucleic acid sequencing. If a released cell fails to perform well in downstream assays, the cell can be referred to as unviable. In some instances, a foam composition comprising 4 milliliters of a 5% BSA in PBS, 2 mL of air, wherein at least 50% of the air bubbles of the foam composition have a diameter from about 10 to 100 micrometers when flowed over a surface (e.g., comprising a non-fouling composition and a binding moiety) at a flow rate from 0.5-4 mm/s or more to release cells bound to the surface, wherein the at least 50% of the released cells are viable.

The released particles of interest can be at least 50, 60, 70, 80, 90 or 100% free of non-specific particles of interest. The released particles of interest can be at most 50, 60, 70, 80, 90 or 100% free of non-specific particles of interest. A non-specific particle of interest can be any cellular particle that is not a particle of interest. For example, a non-specific particle of interest can include, white blood cells, red blood cells, serum proteins, serum nucleic acids, and circulating epithelial cells. A non-specific particle of interest can refer to a particle that is unable to specifically bind to a binding moiety used in the microfluidic chip of the disclosure. In other words, a non-specific particle of interest may refer to a cell that does not express an antigen/receptor, specific for the binding moiety. In some instances, a foam composition comprising 4 milliliters of a 5% BSA in PBS, 2 mL of air, wherein at least 50% of the air bubbles of the foam composition have a diameter from about 10 to 100 micrometers when flowed over a surface at a flow rate from 0.5-4 mm/s or more can result in the removal of at least 50% of the non-fouling composition from the surface, and/or result in released particles of interest that are at least 50% free of non-specific particles of interest.

In some instances, a population of cells can be released from the surface (e.g., of a microfluidic channel, e.g., of a non-fouling composition). A population of cells can comprise at least 1, 2, 3, 4, 5, 6, 7, 8, 9, 10, 100, 1000, 10000, 100000, or 1000000 or more cells. A population of cells can comprise at most 1, 2, 3, 4, 5, 6, 7, 8, 9, 10, 100, 1000, 10000, 100000, or 1000000 or more cells. A population of cells can be released from the surface with an efficiency of at least 50, 60, 70, 80, 90, 95, 99, or 100% efficiency. A population of cells can be released from the surface with an efficiency of at most 50, 60, 70, 80, 90, 95, 99, or 100% efficiency. In other words, at least 50, 60, 70, 80, 90, 95, 99 or 100% of the cells in a population of cells can be released. At most 50, 60, 70, 80, 90, 95, 99 or 100% of the cells in a population of cells can be released (e.g., by a foam or air bubble composition).

The cells of the population of cells may be viable. At least 50, 60, 70, 80, 90, 95, 99, or 100% of the cells in a population of cells may be viable. At most 50, 60, 70, 80, 90, 95, 99, or 100% of the cells in a population of cells may be viable.

A population of cells can comprise a plurality of particles of interest. A population of cells can comprise at least 20, 30, 40, 50, 60, 70, 80, 90, or 100% particles of interest. A population of cells can comprise at most 20, 30, 40, 50, 60, 70, 80, 90, or 100% particles of interest. A population of cells can comprise a plurality of non-particles of interest. A population of cells can comprise at least 20, 30, 40, 50, 60, 70, 80, 90, or 100% non-particles of interest. A population of cells can comprise at most 20, 30, 40, 50, 60, 70, 80, 90, or 100% non-particles of interest.

The air bubbles of the foam composition of the disclosure can remove the non-fouling composition by interacting with the non-fouling composition. The air-liquid interaction of the air bubble can be hydrophobic. It can interact with the hydrophobic part of the non-fouling composition. When the hydrophobic part of the non-fouling composition comprises the hydrophobic tails of a lipid bilayer, the air bubble can interact with the hydrophobic tails of the lipid bilayer and disrupt the bilayer, thereby dislodging the non-fouling composition from the surface.

In some instances, when the air bubble interacts with the lipid bilayer it can generate a solid-liquid-air contact line (e.g., the contact between the air, liquid and cell). The combination of the contact angle of the air bubble on the cell, and the surface tension of the liquid-air interface of the bubble can be a driving force for pulling the cells off the surface. If the tension of the air-liquid interface of the bubble against the cell is too strong, it can damage the cell. If the surface tension is too weak, the cell may not be removed from the surface.

The interaction of the foam composition with the surface (e.g., cell), can result in the reorganization of the surface and/or the non-fouling composition (e.g., molecular changes). For example, a surface comprising a non-fouling composition comprising a lipid bilayer can be disrupted to a monolayer, and/or individual lipid molecules after by interaction with the air bubble of the foam composition.

Analysis

Collected cells can be counted by any method such as optical (e.g., visual inspection), automated counting by software, microscopy based detection, FACS, and electrical detection, (e.g., Coulter counters). Counting of the cells, or other particles of interest, isolated using the methods of the disclosure can be useful for diagnosing diseases, monitoring the progress of disease, and monitoring or determining the efficacy of a treatment. Cell, or other particle of interest, counting can be of use in non-medical applications, such as, for example, for determination of the amount, presence, or type of contaminants in environmental samples (e.g., water, air, and soil), pharmaceuticals, food, animal husbandry, or cosmetics.

One or more properties of the cells and/or particles of interest, or portions thereof collected by the methods of the disclosure can be measured. Examples of biological properties that can be measured can include mRNA expression, protein expression, nucleic acid alteration and quantification. The particles of interest isolated by the methods of the disclosure can be sequenced. Sequencing can be useful for determining certain sequence characteristics (e.g., polymorphisms and chromosomal abnormalities)

When lysis is employed to analyze a particle of interest (e.g., cell), the lysis can occur while the particles are still bound to the non-fouling composition. The cells can be analyzed in the presence of non-specifically retained cells.

Genetic information can be obtained from a particle of interest (e.g., cell) captured by a binding moiety of a non-fouling composition. Such genetic information can include identification or enumeration of particular genomic DNA, cDNA, or mRNA sequences. Other valuable information such as identification or enumeration of cell surface markers; and identification or enumeration of proteins or other intracellular contents that is indicative of the type or presence of a particular tumor can also be obtained. Cells can be analyzed to determine the tissue of origin, the stage or severity of disease, or the susceptibility to or efficacy of a particular treatment.

Particles of interests collected by the methods of the disclosure can be assayed for the presence of markers indicative of cancer stem cells. Examples of such markers can include CD133, CD44, CD24, epithelial-specific antigen (ESA), Nanog, and BMI1.

Compositions

A composition of the disclosure can comprise a released particle of interest (e.g., released rare cell). A released particle of interest can refer to a cell released by the methods of the disclosure (e.g., the flowing of foam and air bubbles over a surface comprising a non-fouling layer). In some instances, during the releasing step, the non-fouling composition, the binding moiety, the linker, and the particle of interest, or any combination thereof are released together. In some instances, during the releasing step, the non-fouling composition, and the particle of interest are released together.

A composition of the disclosure can comprise a released cell, a non-fouling layer, and an air bubble from the foam composition. The air bubble can comprise the released cell and the non-fouling layer. In other words, the air bubble can partially envelop the lipids of the non-fouling layer.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

EXAMPLES

Example 1: Identification of Groove Pattern

Figure 1A:
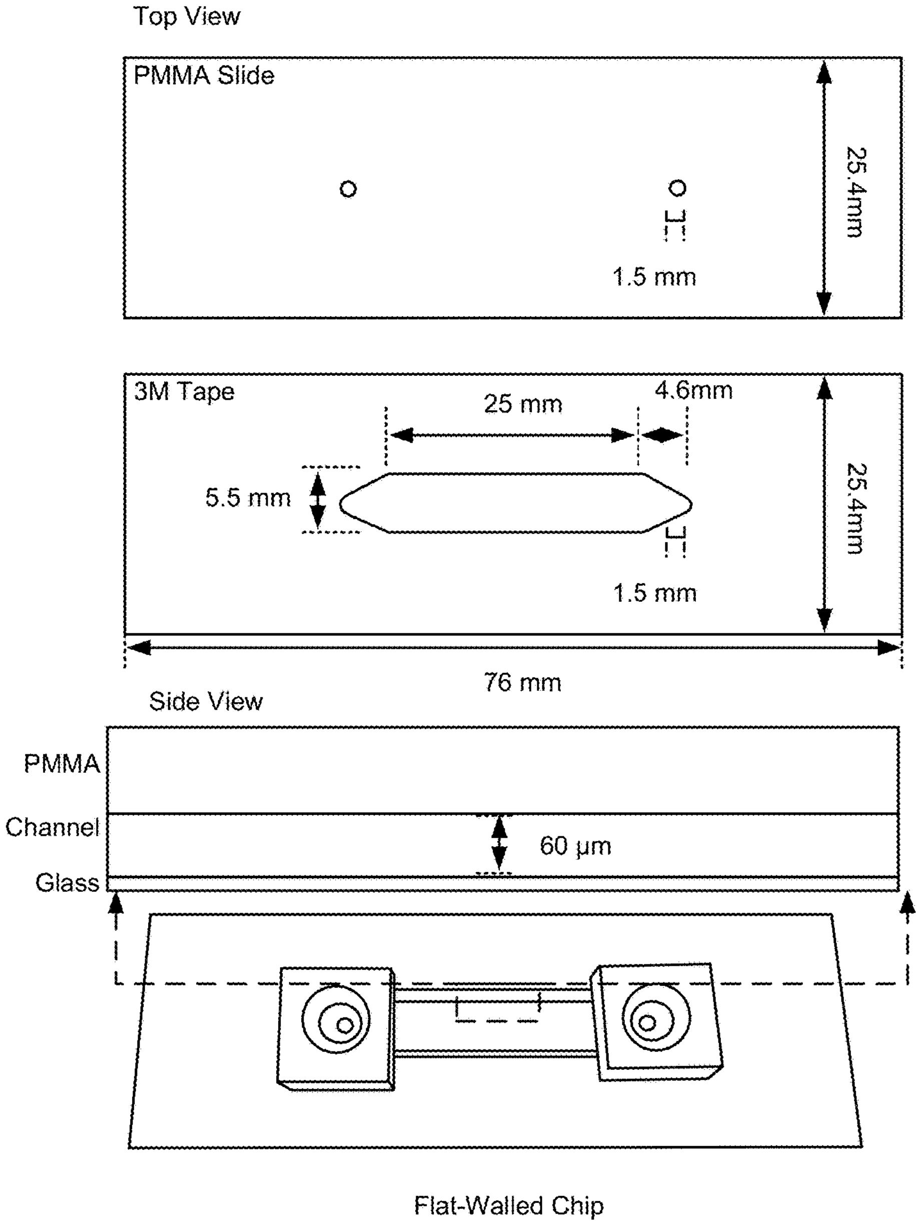
FIG. 1A-D depicts exemplary microfluidic chips.
Figure 1B:
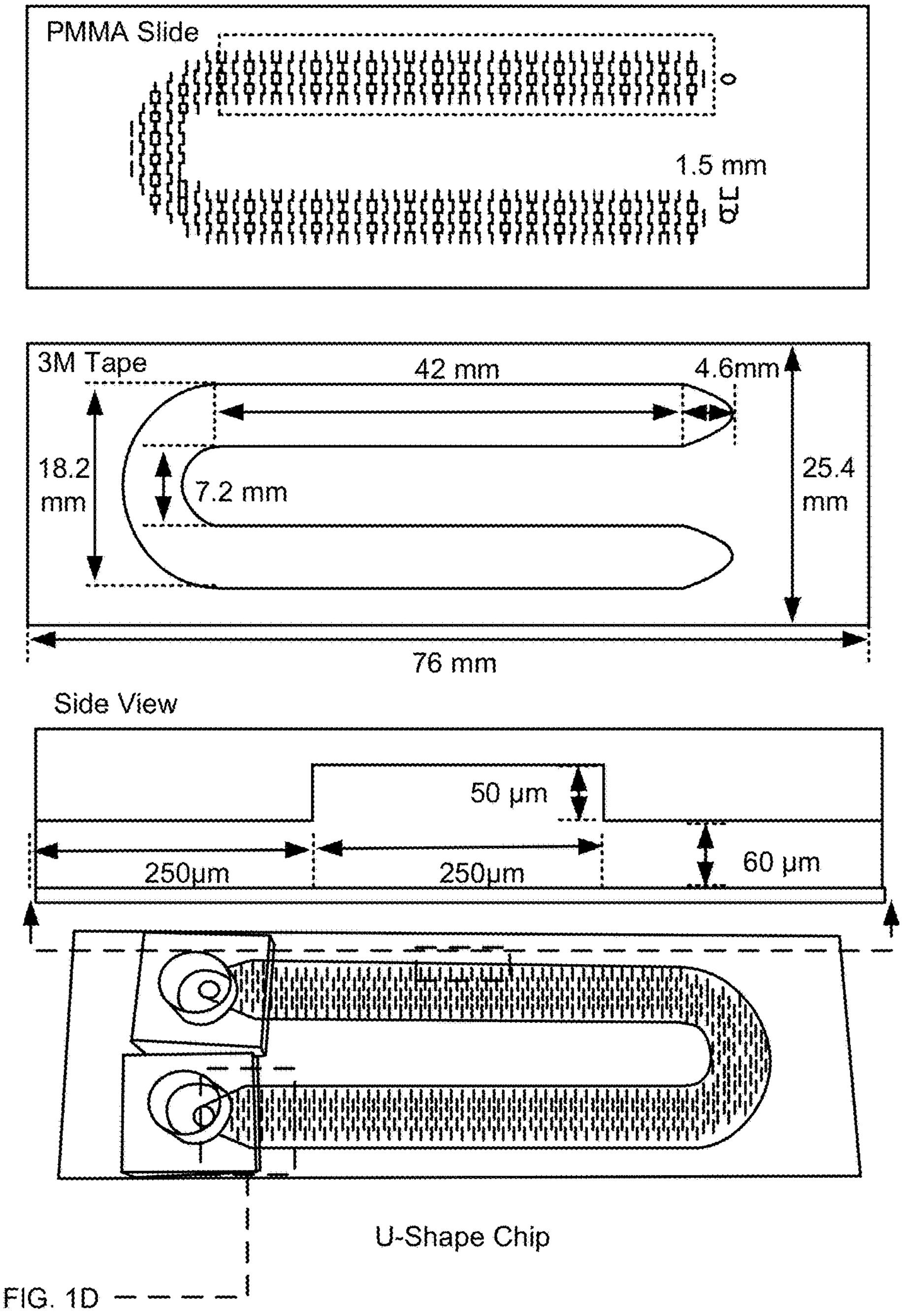
Figure 1C:
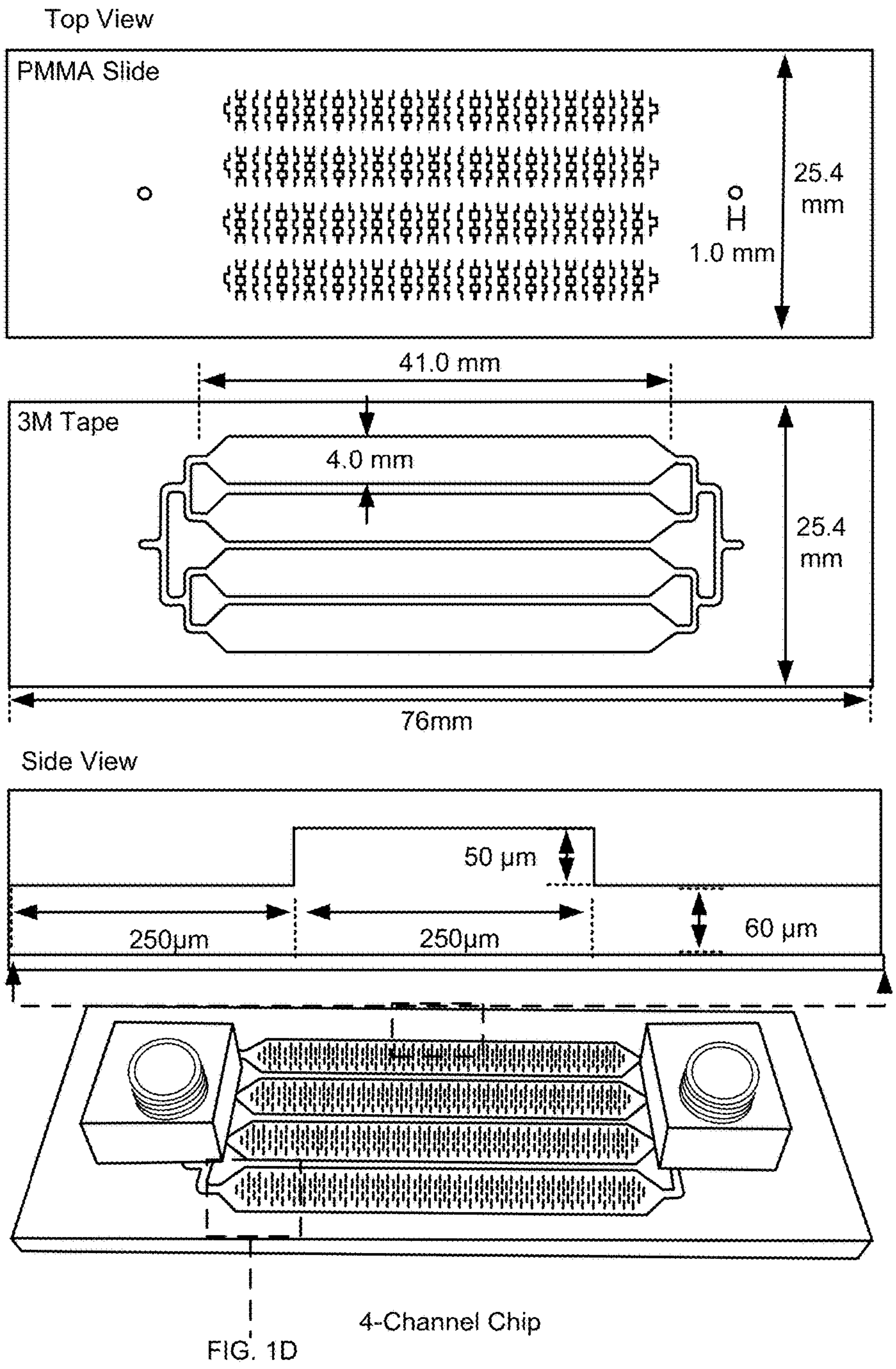
Figure 1D:
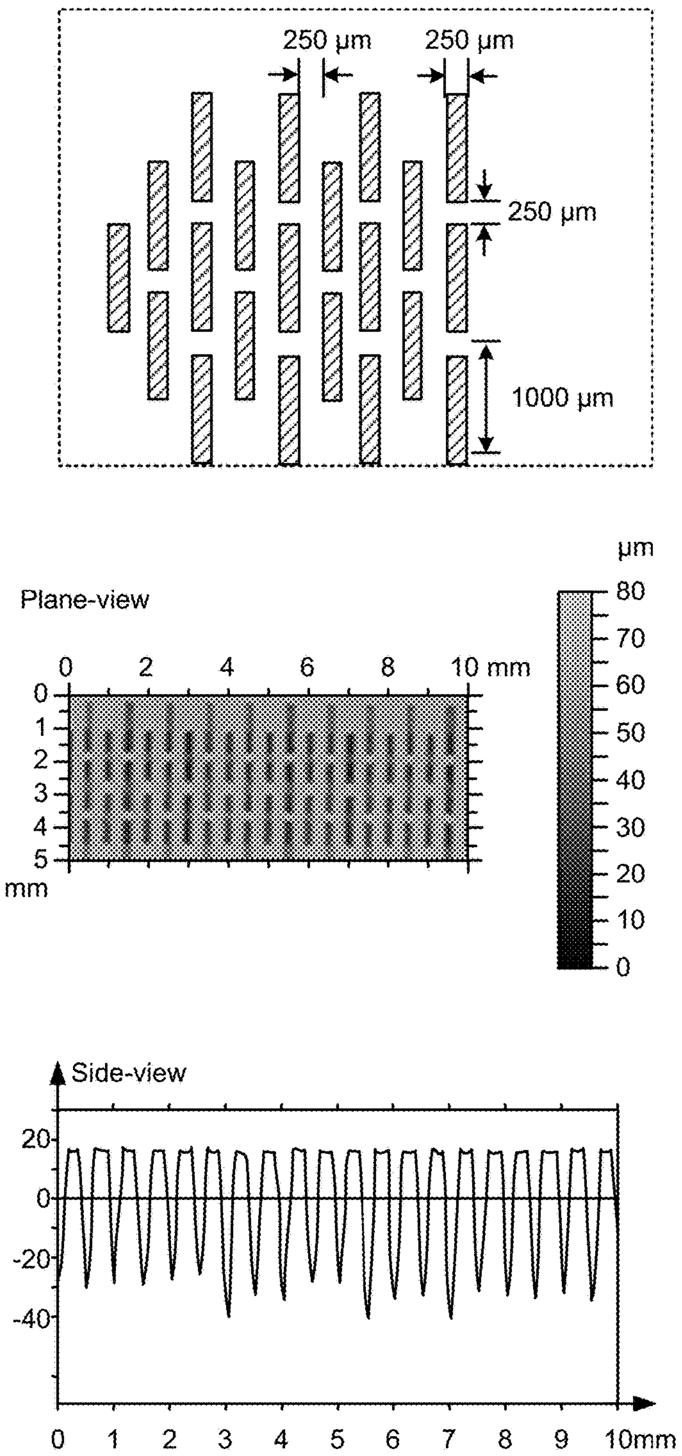
Figure 2:
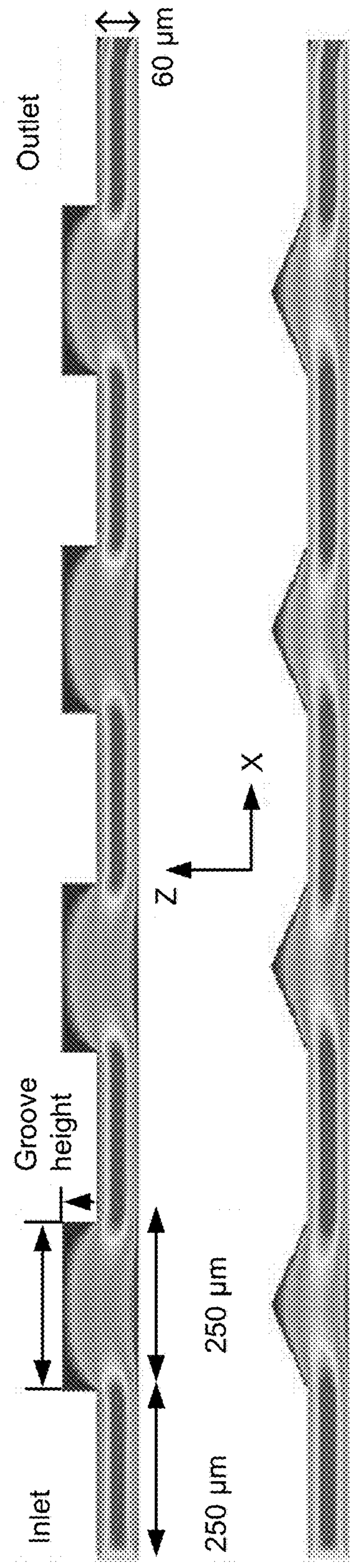
FIG. 2 depicts an exemplary two-dimensional configuration of the computational domain.

In order to find the proper design of pattern groove, a computation simulation was performed using multi-disciplinary modeling software for modeling fluid dynamics. In order to simplify the problem, a two dimensional model was used, as shown in FIG. 2. The x-axis represents the fluid flow direction and z-axis represents the direction from channel floor to channel ceiling. The varied parameters included groove width: 100 and 250 micrometers, groove height: 50 and 100 micrometers, and groove geometry: rectangular and triangular shapes.

With blood as the working fluid, the mass density and viscosity were determined to be 1060 kg $m^{-3}$ and 0.004 kg $m^{-1}$ $s^{-1}$. It was assumed that the boundaries at the solid wall met the conditions without slip or penetration. The inlet boundary was set to a constant flow rate of 0.5 ml/h and for the outlet boundary and the pressure condition was set to be 1 bar. All the simulation was performed at steady state.

Figure 3A:
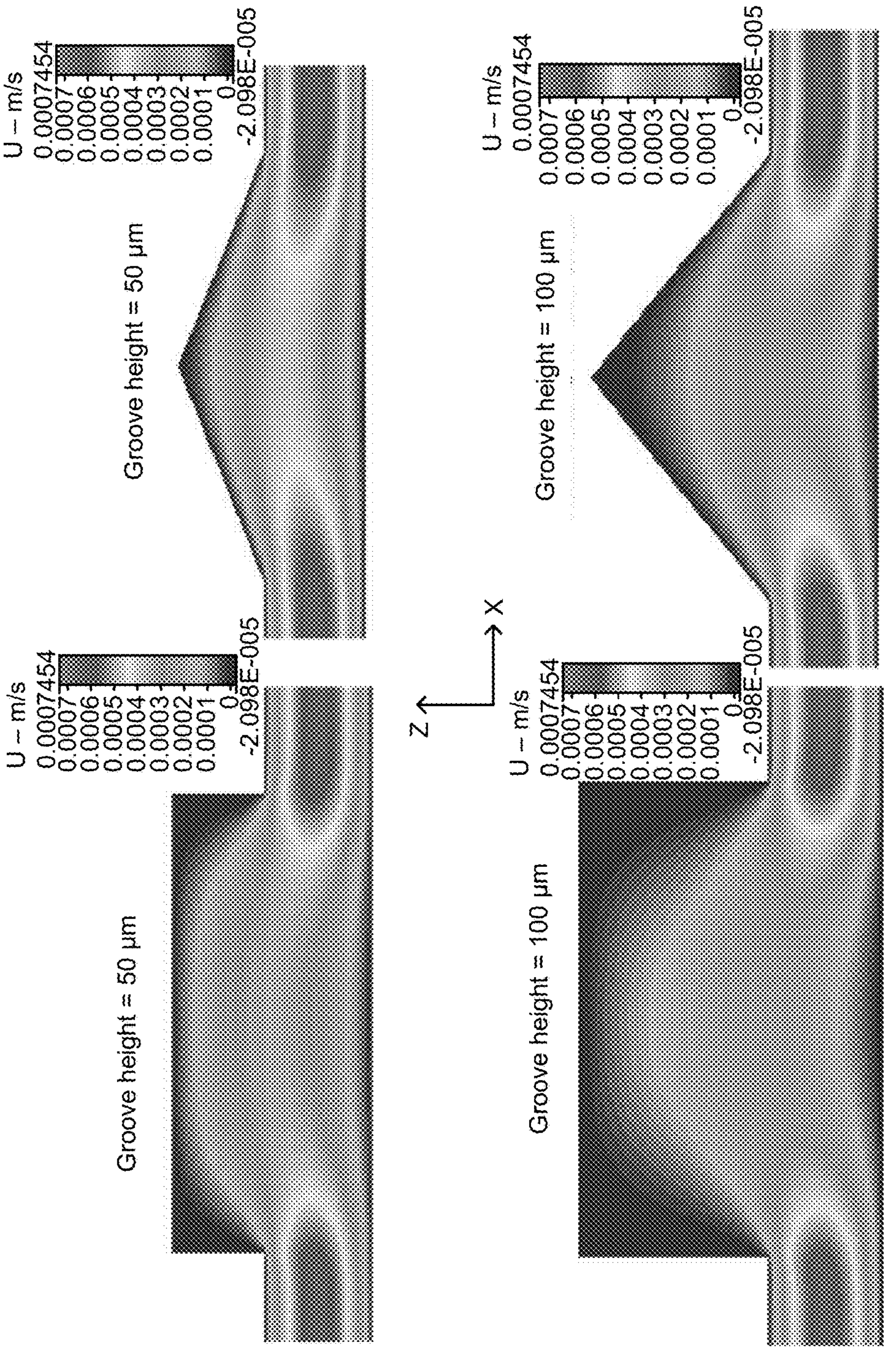
FIG. 3A-C shows the effect of groove height on the fluid velocity in micro-channel.
Figure 3B:
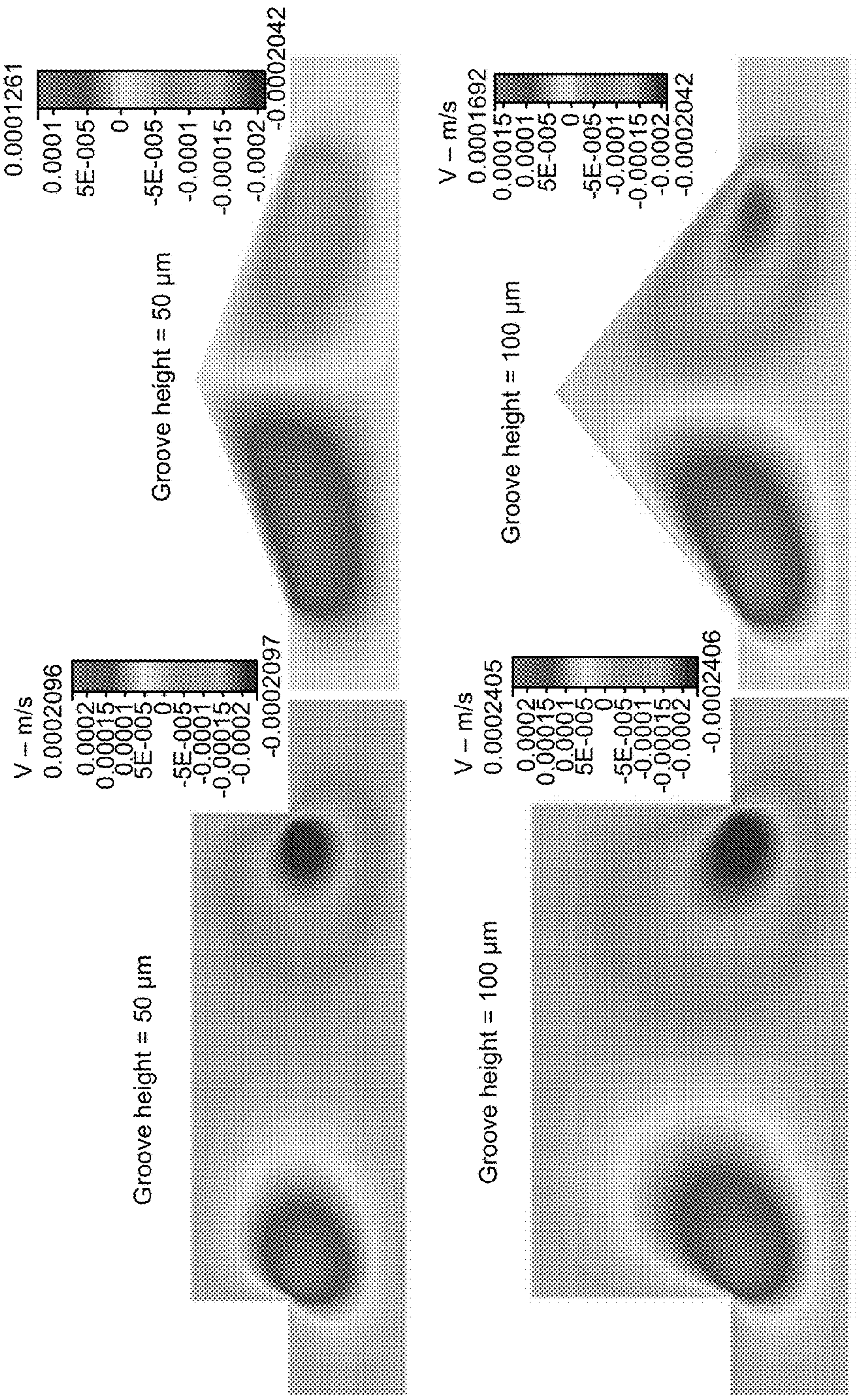
Figure 3C:
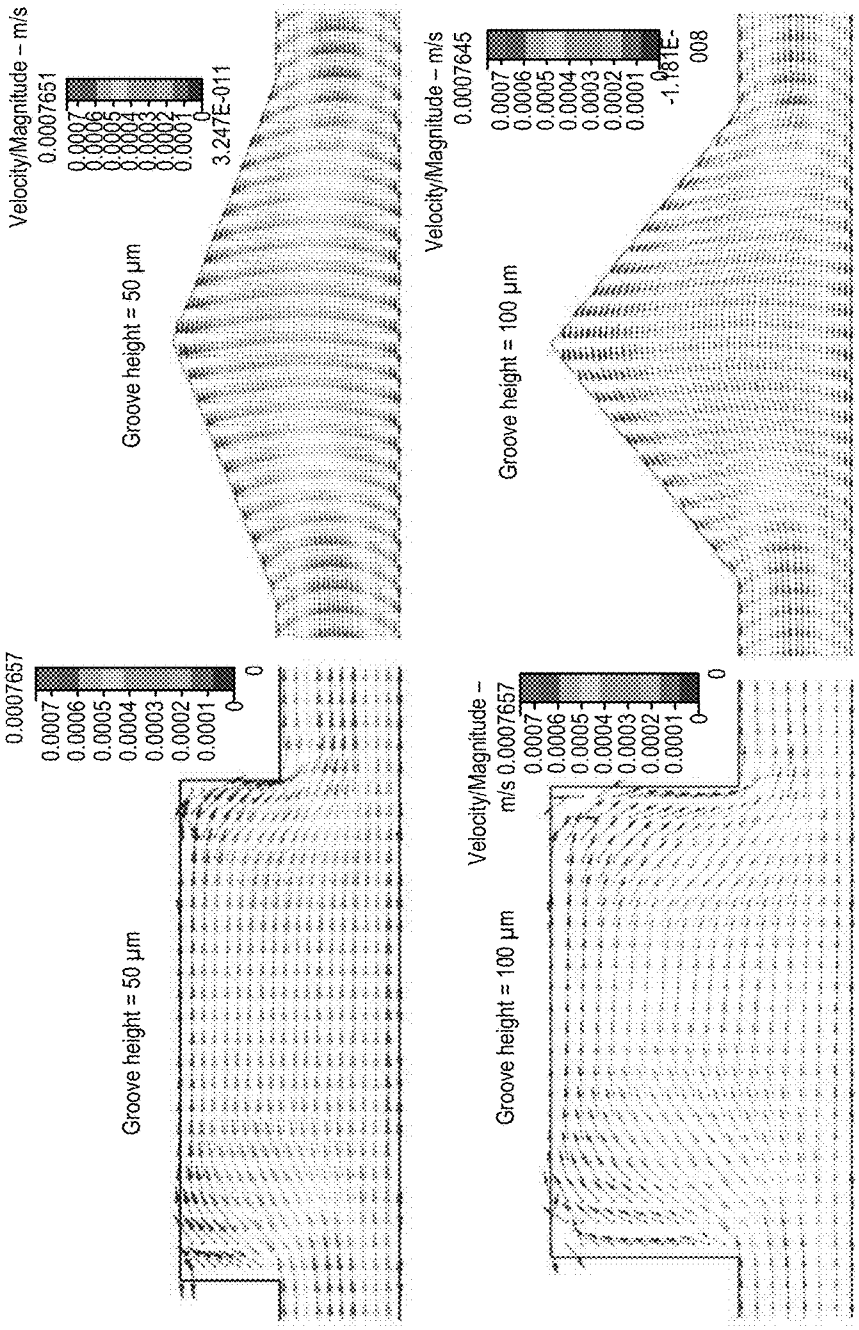

FIG. 3 shows the effect of groove height on the fluid velocity in micro-channel. When fluid flowed through the pattern groove, its x velocity component decreased, as shown in FIG. 3A. Despite different profiles, the maximum and minimum of x velocity component, as shown in FIG. 3A were the same for various groove heights and shapes. The z velocity component can be an indicator of level of chaotic mixing in micro-channel. The larger the difference between maximum and minimum of z velocity component, the greater the scale of mixing effect. FIG. 3B shows the fluid mixing effect of the rectangular groove was better than triangular groove. In addition, grooves with heights 100 micrometers have better mixing than those with a height 50 micrometers. The vector field of fluid velocity in FIG. 3C shows that triangular groove have smoother streamlines.

Figure 4A:
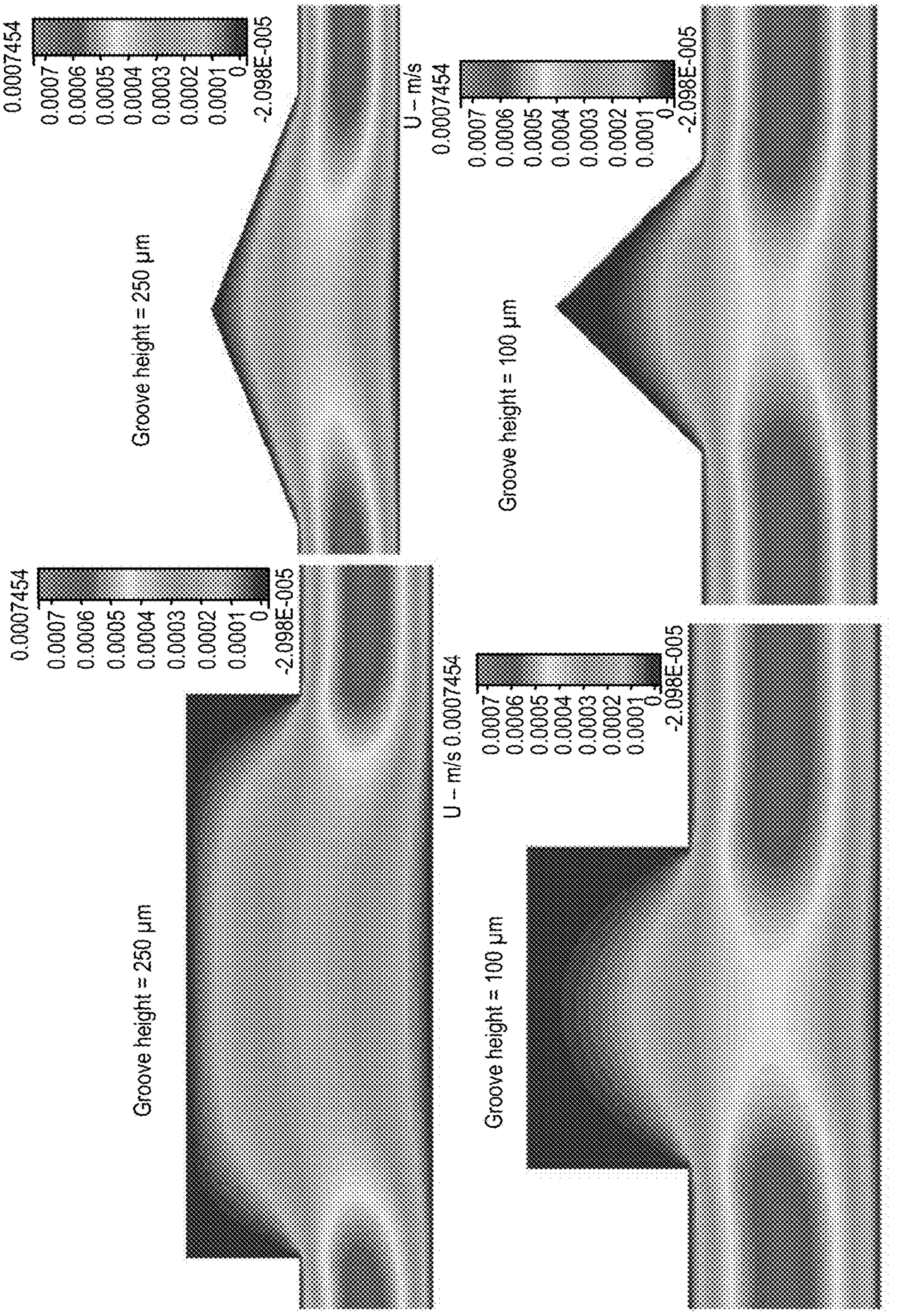
FIG. 4A-C shows the effect of groove width on the fluid velocity in micro-channel.
Figure 4B:
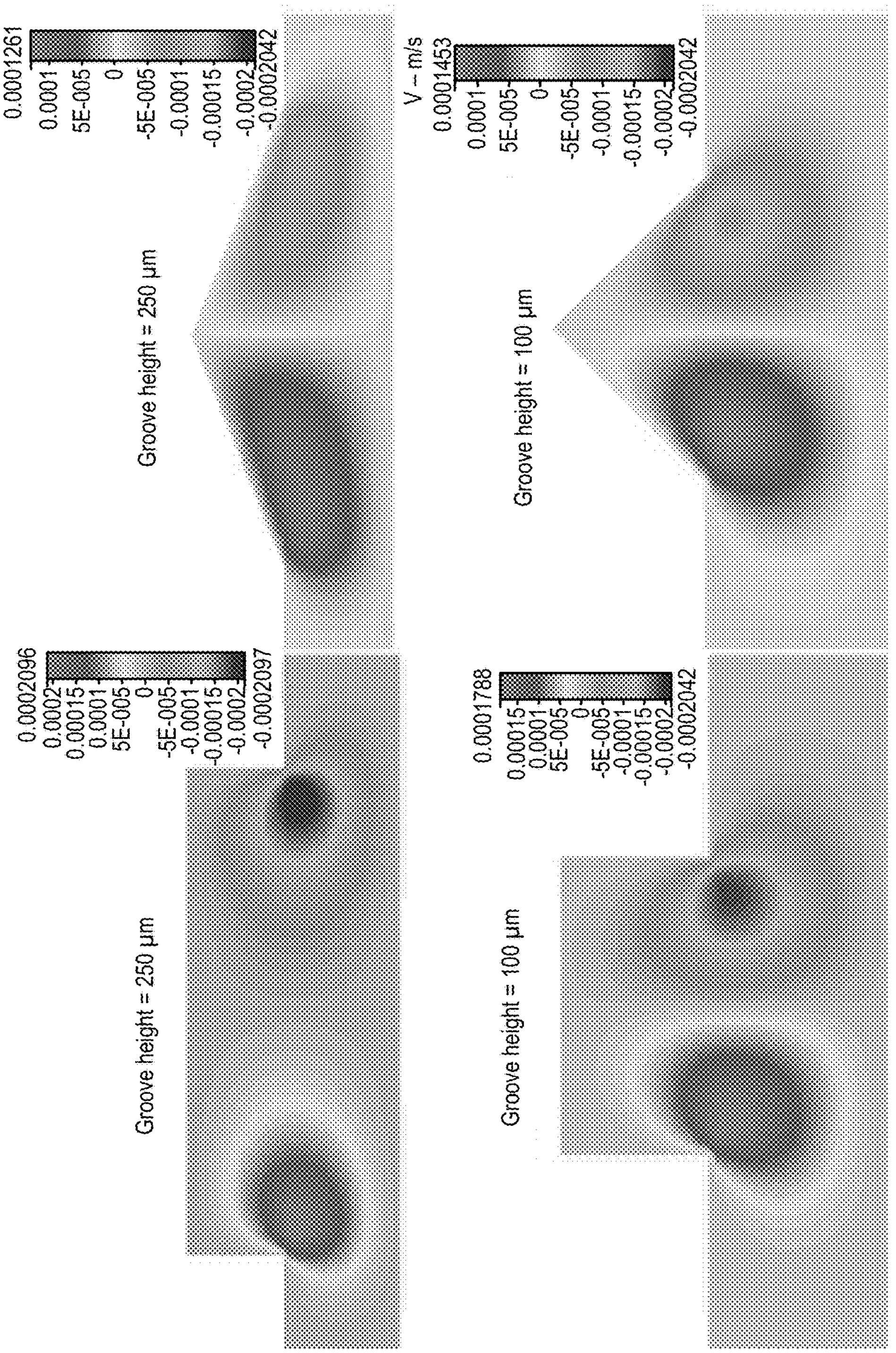
Figure 4C:
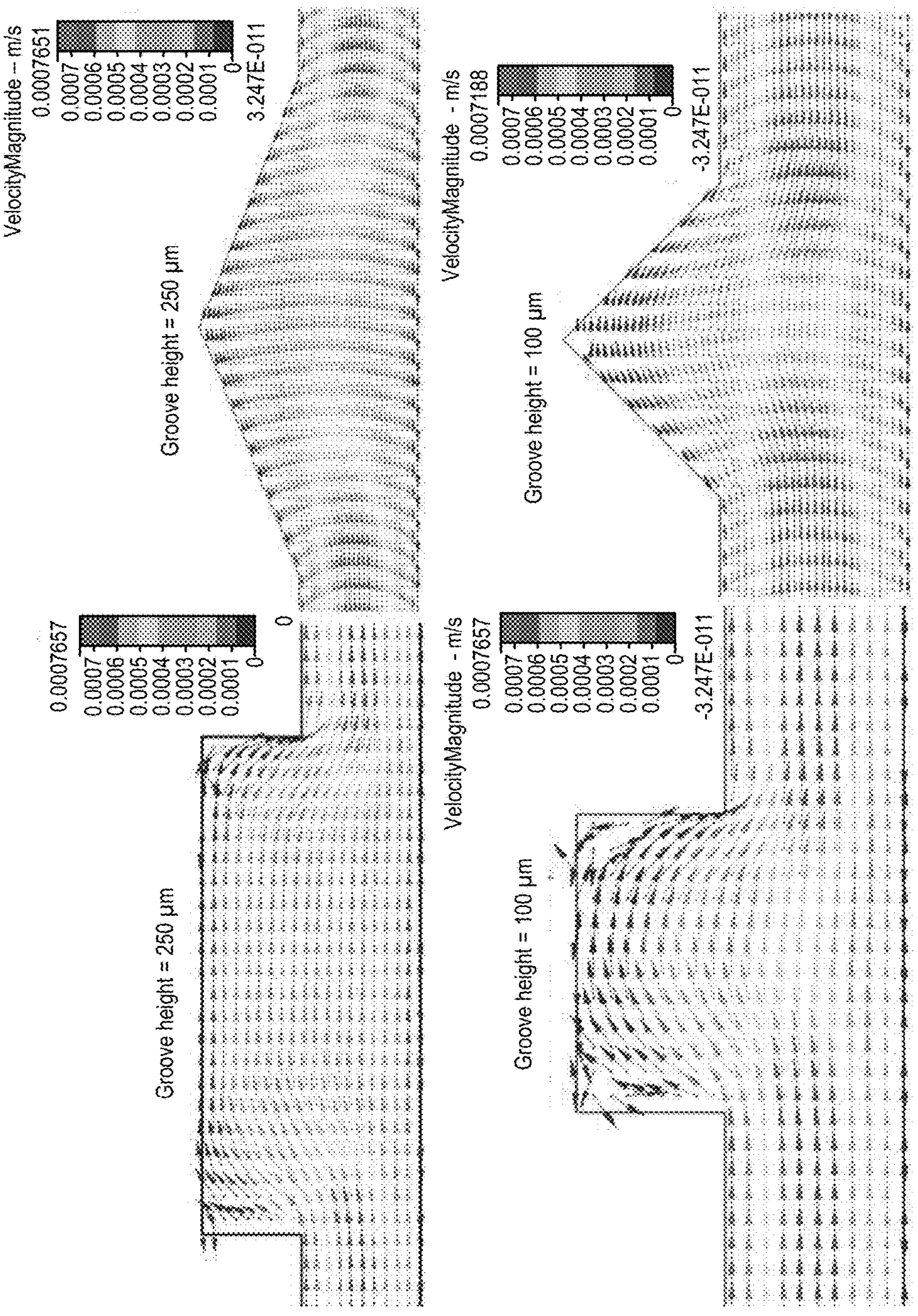
Figure 5:
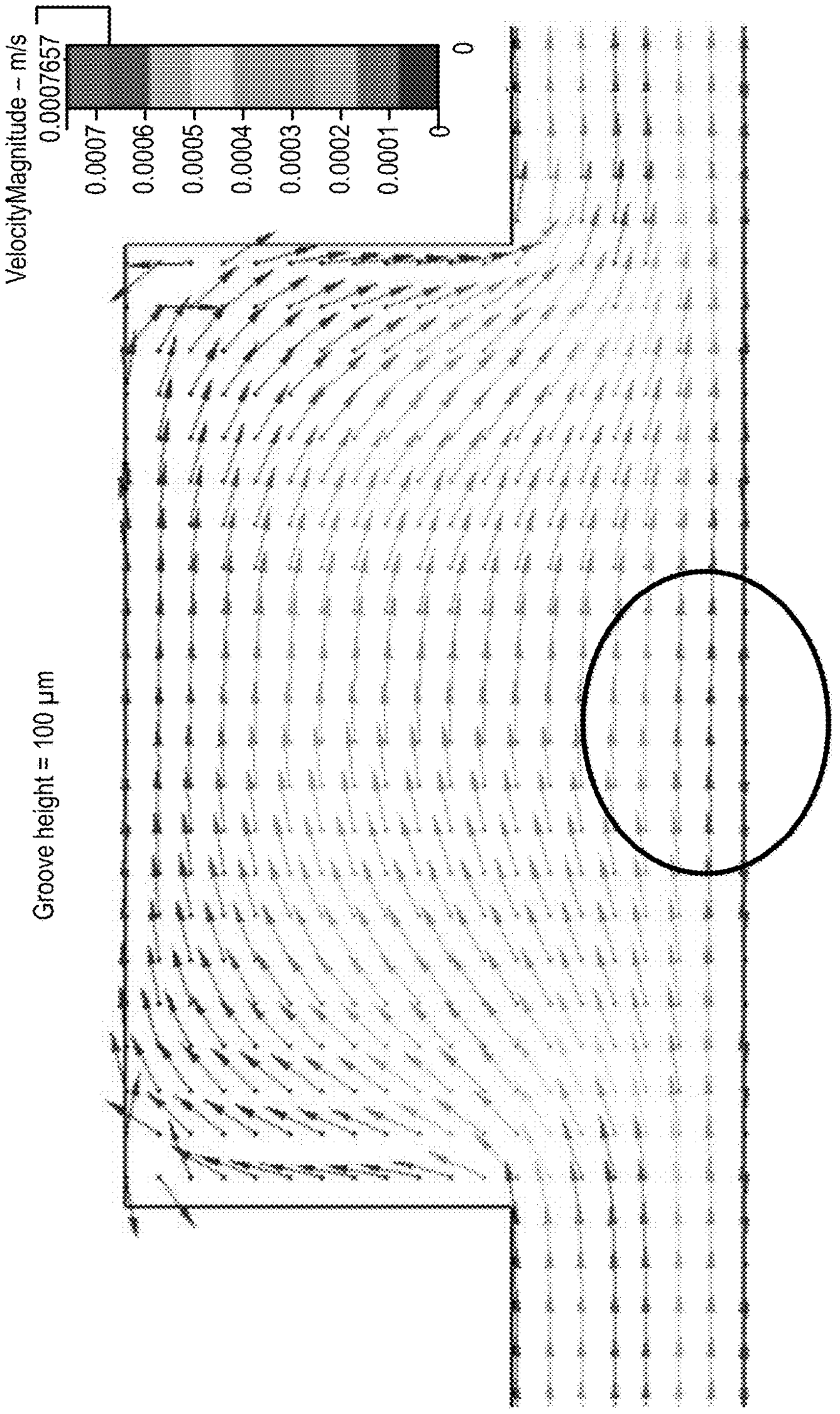
FIG. 5 shows an exemplary computational simulation of the velocity vector of flow field.

FIG. 4 shows the effect of groove width on the fluid velocity in micro-channel. The maximum and minimum of x velocity component were the same in all cases, as shown in FIG. 4A. FIG. 4B shows that the fluid mixing effect of rectangular groove was better than triangular groove. Grooves with a width 250 micrometers appear to have better mixing than those with a width 100 micrometers when fixed in rectangular shape. In a triangular shape, grooves with width 100 micrometers had better mixing.

Example 2: Analysis of Velocity Vectors in the Microstructures

Figure 6:
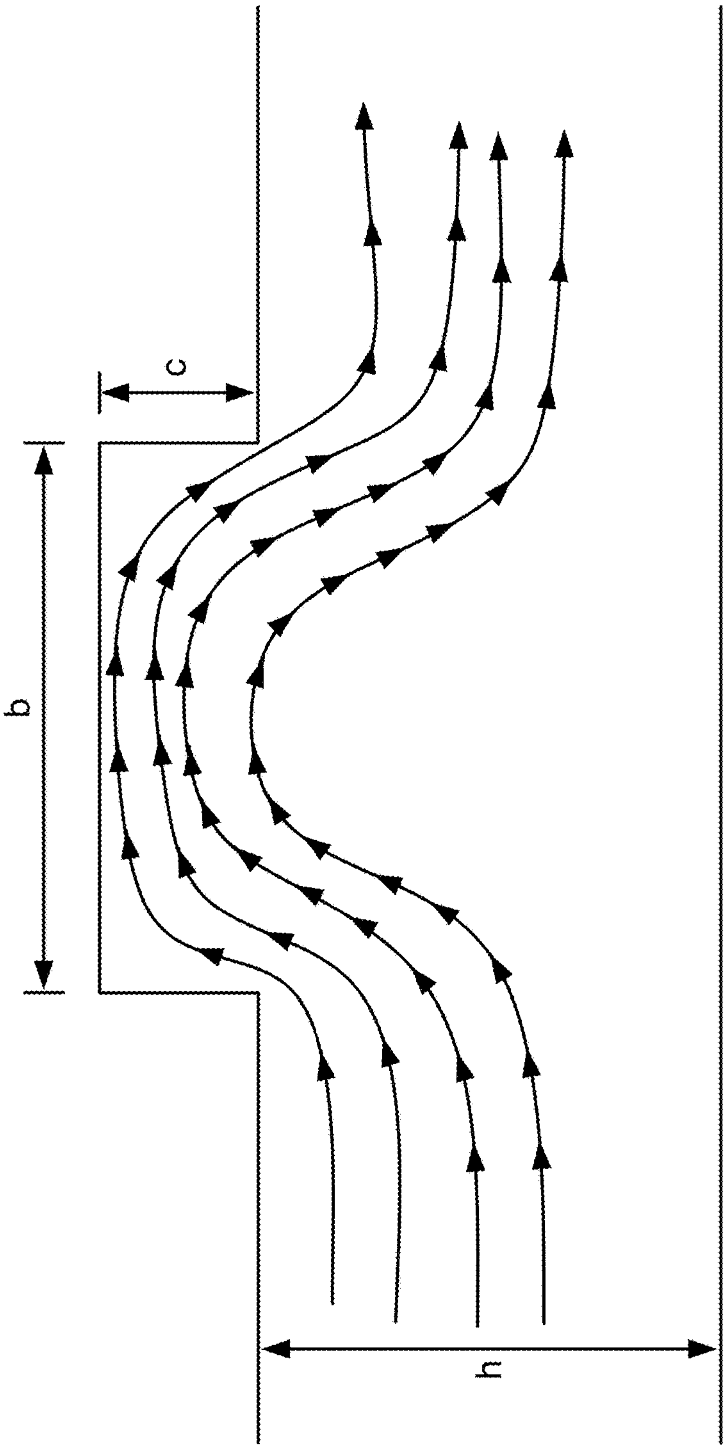
FIG. 6 depicts exemplary flow streamlines near the structure zone of a microfluidic chip.

A concave type of micro-structure can induce the fluctuations in the flow field of the micro-channel. The fluctuation can make the cells in the flow move downward to hit the bottom of surface, thereby increasing the chance of binding to surface. FIG. 3 shows a computational simulation showing the velocity vector of flow field near the micro-structures in micro-channel. The fluid particles have an upward velocity component when entering the micro-structure and downward velocity component when leaving the micro-structure. In addition, the vortex was formed under the structure and near the channel bottom. A schematic diagram of the flow streamlines is shown in FIG. 6. The streamlines indicate the path on which the cells in micro-channel can move. The cells on the streamlines of non-structure zone move in parallel, while the cells on the streamlines of structure zone continue to switch to the adjacent streamlines due to inertial forces. One of the features that herringbone structures possess is to induce a spiral type of streamlines.

Figure 7:
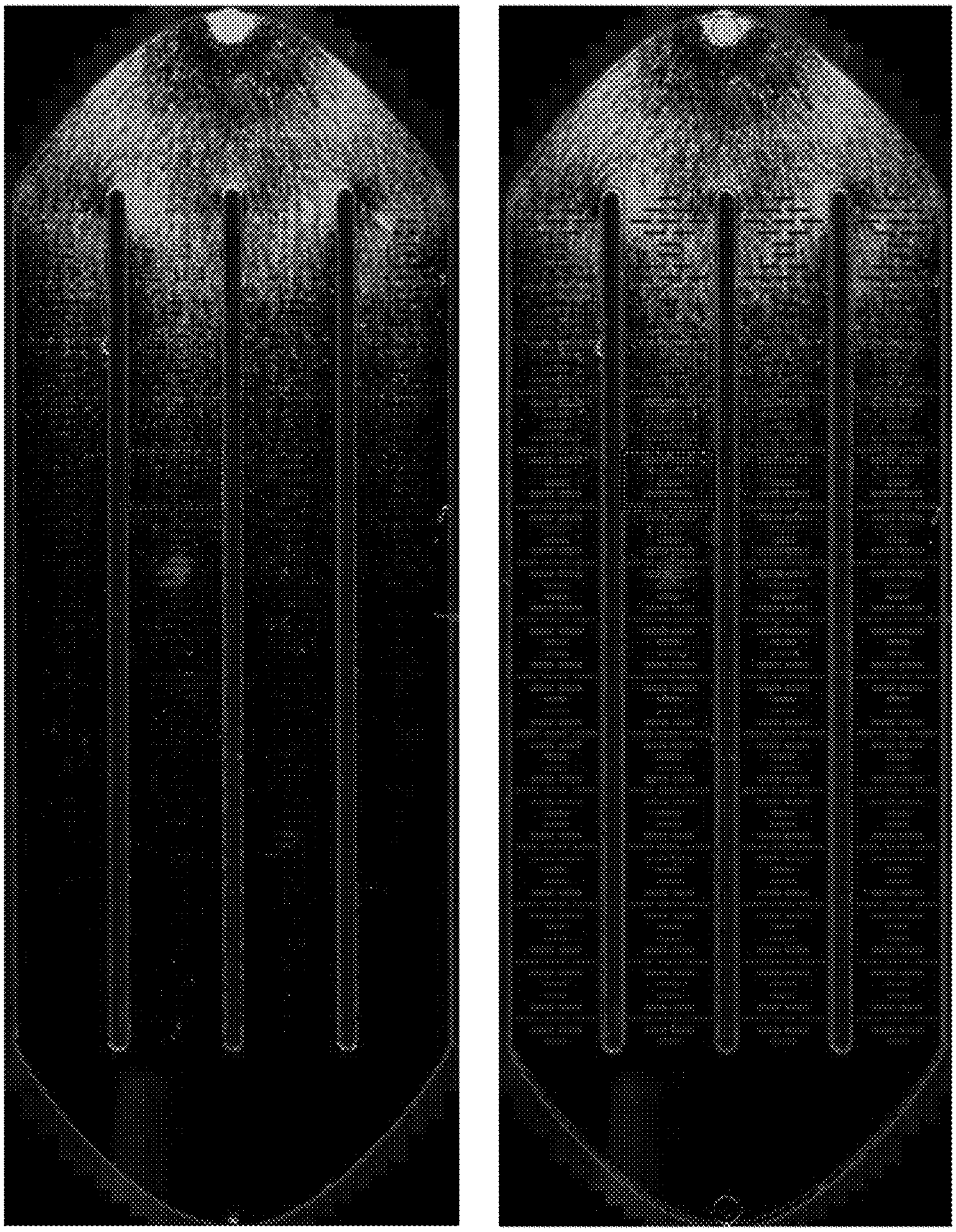
FIG. 7 shows flow profiles within microchannels as depicted by fluorescent images of the pre-stained cells.

Cell binding efficiency experiments were performed in various channel height (h) as shown in FIG. 2: h=40, 60, 100 micrometers. When h=60 micrometers higher cell binding efficiency is achieved. The computational simulation was conducted to optimize the geometrical parameters. Simulation results shows that when c/b is equal to 0.4 (100/250 μm) and h is fixed at h=60 micrometers, as shown in FIG. 6, the scale of fluctuation created is larger. FIG. 7 shows the fluorescent images of micro-channel: On the left of FIG. 7 shows an image of the microchannel captured after millions of cells pre-stained by cell tracker green dye flow into the microfluidic chip. The black line in FIG. 7 (right) describes the geometry of micro-channel and micro-structure. According to FIG. 3, a considerable number of cells bind to the field of non-structure zone and the density of cell binding is higher in the front than in the rear. In the inlet of micro-channel, cells follow the stratified streamlines into structure zones. Moreover, no symptom of vortex is found in FIG. 7.

Example 3: Capture of Circulating Cells Using a x, x+1, x+2, x+1, x, x+1, x+2, x+1, x Microstructure Pattern A sample comprising a circulating tumor cell is contacted to a channel comprising a microstructure pattern, wherein the microstructure pattern is 1232123212321. The channel, including the microstructure pattern, comprises a non-fouling composition. The non-fouling composition comprises a lipid bilayer and a binding moiety. The lipids of the non-fouling composition are non-covalently attached to the surface of the microfluidic channel (e.g., via Van der Waals interaction). The end of the lipid comprises a biotin moiety. The binding moiety comprises a streptavidin moiety. The biotin moiety and the streptavidin moiety bind together, thereby linking lipid to the binding moiety. The binding moiety is an anti-EpCam antibody. The sample is flowed over the surface with a flow rate from 0.5 to 4 mm/s. The circulating tumor cells jostle through the microstructure pattern by moving around and between the microstructures. The circulating tumor cells enter a vortex located in a microstructure-free zone. The vortex increases particle movement in the channel. Increased particle movement increases its movement within the volume, increasing the prospect of the particles coming in close contact to the binding moiety, thereby enabling the greater number of circulating tumor cells binding to the binding moiety on the microstructure to 90%. The surface of the non-fouling composition is purified by flowing a wash buffer comprising phosphobuffered saline over the non-fouling composition. The wash buffer removes non-specifically bound cells, but does not disrupt binding of the circulating tumor cells. The circulating tumor cells are released from the binding moiety and non-fouling composition by flowing an air bubble over the non-fouling composition. The air bubbles interact with the lipids of the non-fouling composition to remove the lipids from the surface. The lipids are removed by shear forces from the air-liquid interface between the air bubble and the non-fouling composition. The shear force turns the lipid bilayer inside out, thereby loosening the lipids so they are easily detached. The circulating tumor cells attached to the binding moiety of the non-fouling composition are also removed along with the lipids. The shear force is strong enough to remove the circulating tumor cells, but does not damage the cells. The released cells are viable. In this way, the circulating tumor cells are collected using a method of releasing by a foam composition.

Example 4: Capture of Circulating Cells Using a x, x+1, x+2, x+1, x, x, x+1, x+2, x+1, x, x Microstructure Pattern A sample comprising a circulating tumor cell is contacted to a channel comprising a microstructure pattern, wherein the microstructure pattern is 123211232112321. The channel, including the microstructure pattern, comprises a non-fouling composition. The non-fouling composition comprises a lipid bilayer and a binding moiety. The lipids of the non-fouling composition are non-covalently attached to the surface of the microfluidic channel (e.g., via Van der Waals interaction). The end of the lipid comprises a biotin moiety. The binding moiety comprises a streptavidin moiety. The biotin moiety and the streptavidin moiety bind together, thereby linking lipid to the binding moiety. The binding moiety is an anti-EpCam antibody. The sample is flowed over the surface with a flow rate from 0.5 to 4 mm/s. The circulating tumor cells jostle through the microstructure pattern by moving around and between the microstructures. The circulating tumor cells enter a vortex located in a microstructure-free zone. The vortex increases particle movement in the channel. Increased particle movement increases its movement within the volume, increasing the prospect of the particles coming in close contact to the binding moiety, thereby enabling a greater number of circulating tumor cells to bind to the binding moiety on the microstructure up to 90%. The surface of the non-fouling composition is purified by flowing a wash buffer comprising phosphobuffered saline over the non-fouling composition. The wash buffer removes non-specifically bound cells, but does not disrupt binding of the circulating tumor cells. The circulating tumor cells are released from the binding moiety and non-fouling composition by flowing an air bubble over the non-fouling composition. The air bubbles interact with the lipids of the non-fouling composition to remove the lipids from the surface. The lipids are removed by shear forces from the air-liquid interface between the air bubble and the non-fouling composition. The shear force turns the lipid bilayer inside out, thereby loosening the lipids so they are easily detached. The circulating tumor cells attached to the binding moiety of the non-fouling composition are also removed along with the lipids. The shear force is strong enough to remove the circulating tumor cells, but does not damage the cells. The released cells are viable. In this way, the circulating tumor cells are collected using a method of releasing by a foam composition.

Example 5: Capture of Circulating Cells Using a m, n, m, n, m, n Microstructure Pattern A sample comprising a circulating tumor cell is contacted to a channel comprising a microstructure pattern, wherein the microstructure pattern is 34343434. The channel, including the microstructure pattern, comprises a non-fouling composition. The non-fouling composition comprises a lipid bilayer and a binding moiety. The lipids of the non-fouling composition are non-covalently attached to the surface of the microfluidic channel (e.g., via Van der Waals interaction). The end of the lipid comprises a biotin moiety. The binding moiety comprises a streptavidin moiety. The biotin moiety and the streptavidin moiety bind together, thereby linking lipid to the binding moiety. The binding moiety is an anti-EpCam antibody. The sample is flowed over the surface with a flow rate from 0.5 to 4 mm/s. The circulating tumor cells jostle through the microstructure pattern by moving around and between the microstructures. The circulating tumor cells enter a vortex located in a microstructure-free zone. The vortex increases particle movement in the channel. Increased particle movement increases its movement within the volume, increasing the prospect of the particles coming in close contact to the binding moiety, thereby enabling a greater number of circulating tumor cells to bind to the binding moiety on the microstructure up to 90%. The surface of the non-fouling composition is purified by flowing a wash buffer comprising phosphate buffered saline over the non-fouling composition. The wash buffer removes non-specifically bound cells, but does not disrupt binding of the circulating tumor cells. The circulating tumor cells are released from the binding moiety and non-fouling composition by flowing an air bubble over the non-fouling composition. The air bubbles interact with the lipids of the non-fouling composition to remove the lipids from the surface. The lipids are removed by shear forces from the air-liquid interface between the air bubble and the non-fouling composition. The shear force turns the lipid bilayer inside out, thereby loosening the lipids so they are easily detached. The circulating tumor cells attached to the binding moiety of the non-fouling composition are also removed along with the lipids. The shear force is strong enough to remove the lipid and thus the circulating tumor cells, but does not damage the cells. The released cells are viable. In this way, the circulating tumor cells are collected using a method of releasing by a foam composition.

Figure 16:
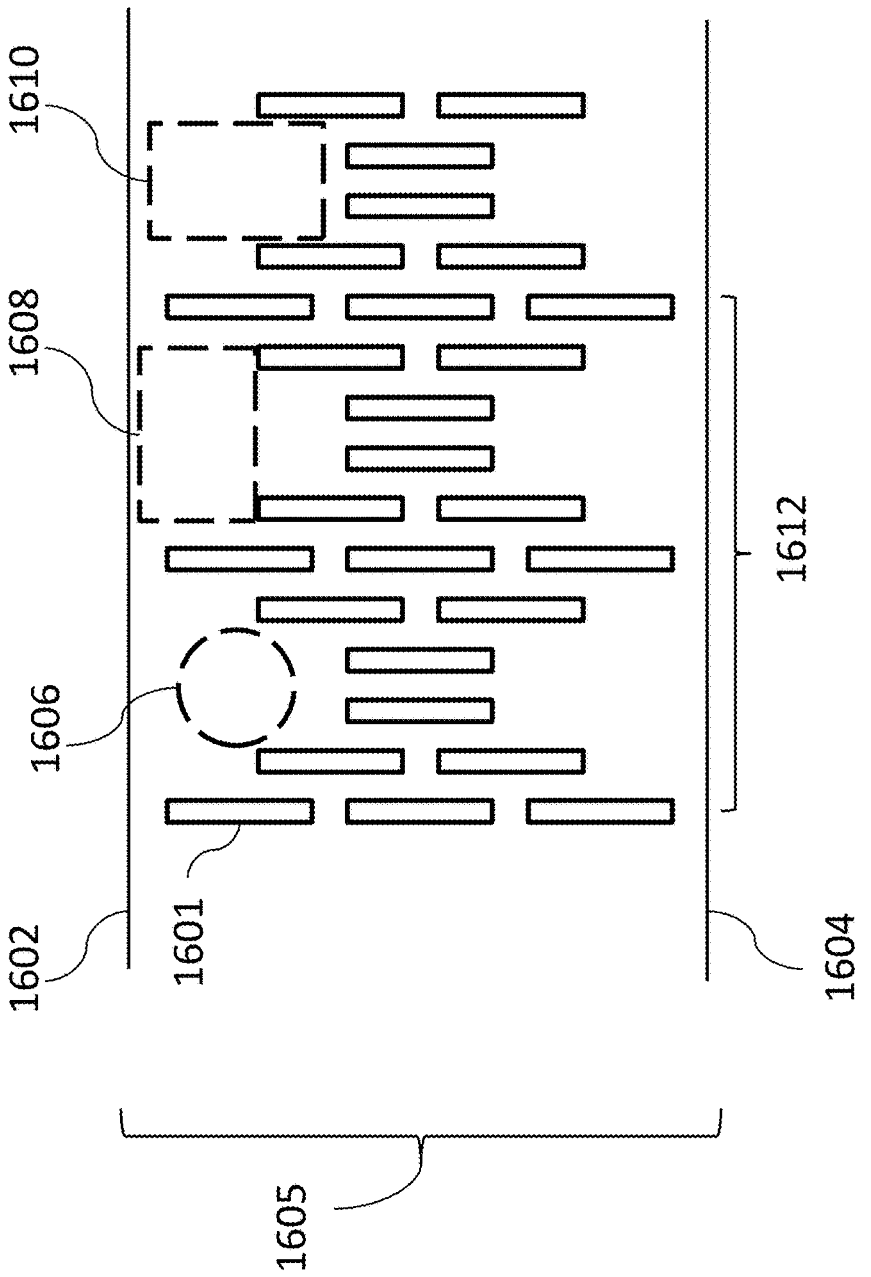
FIG. 16 illustrates a microfluidic channel comprising a plurality of vortex regions, in accordance with embodiments.

FIG. 16 illustrates a microfluidic channel comprising a plurality of vortex regions, in accordance with embodiments. Walls 1602 and 1604 may represent side walls of the microfluidic channel and the channel may have a channel width 1605. The microfluidic channel may comprise a plurality of vortex regions 1606, 1608, and 1610. Each of the plurality of vortex regions may be substantially free of a plurality of microstructures 1601. In some instances, each of the plurality of vortex regions may comprise a cylindrical volume. The cylindrical volume may comprise a height of the microfluidic channel and a base (e.g., as shown by vortex region 1606). The base may comprise a diameter equal to or more than about 20% a width 1605 of the channel. In some instances, the base may comprise a diameter equal to or more than about 25%, 30%, 35%, 40% 45%, or 50% a width of the channel. In some instances, each vortex region may further comprise a rectangular volume (e.g., as shown by vortex regions 1608, 1610). The rectangular volume may comprise a height of the channel, a width equal to the diameter, and a length at least 30% of a width 1605 of the channel. In some instances, the length may be equal to or more than about 35%, 40%, 45%, 50%, 55%, 60%, 65%, 70% of a width of the channel. The microstructures and/or the vortex regions may be positioned in a non-random pattern along a length of the channel. In some instances, the non-random pattern may be a repeating pattern or a palindromic pattern. For example, region 1612 shows microstructures and vortex regions in a repeating and palindromic pattern.

Figure 17:
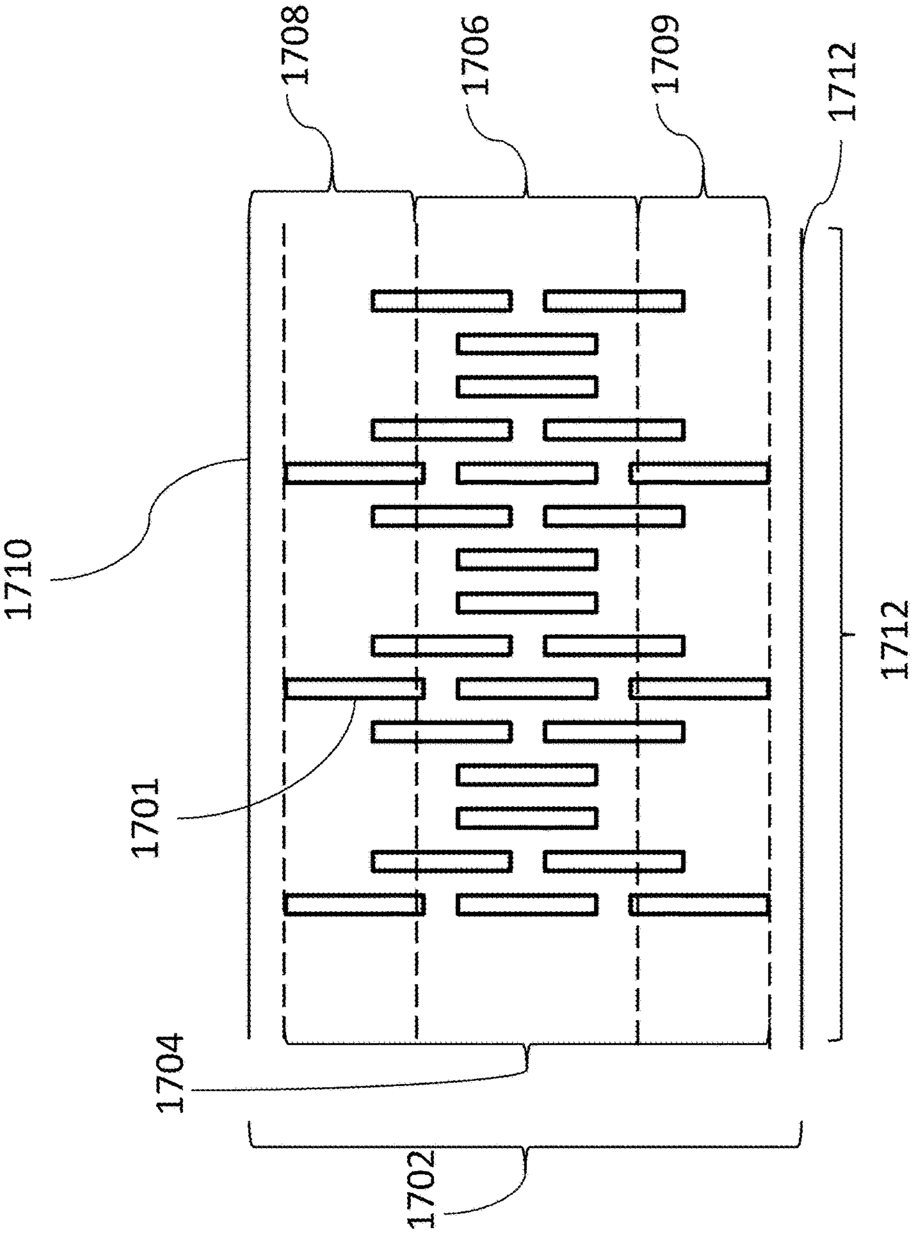
FIG. 17 illustrates a microfluidic channel comprising a first zone and a second zone in accordance with embodiments.

FIG. 17 illustrates a microfluidic channel comprising a first zone 1706 and a second zone 1708, 1709 in accordance with embodiments. The microfluidic channel may comprise a channel width 1702 and a channel height. The channel width may extend from one side wall to another side wall of the microfluidic channel. The channel height may extend from a floor of the channel to a ceiling of the channel. The microfluidic channel may comprise a length 1712. In some instances, the length may refer to an end-to-end length of the channel extending from an inlet to an outlet of the channel (e.g., the channel length). Alternatively, the length may refer to a portion of the channel length. For example, the length may be equal to or more than about 5%, 10%, 15%, 20%, 30%, 35%, 40%, 45%, 50%, 55%, 60%, 65%, 70%, 75%, 80%, 85%, 90%, or 95% of the channel length. The channel may comprise a plurality of microstructures 1701. The plurality of microstructures may be arranged in a non-random along the channel length, e.g., in a repeating pattern or a palindromic pattern. In some instances, the first zone may comprise the channel height, the length, and a width equal to or less than about 90%, 80%, 70%, 65%, 60%, 55%, 50%, 45%, 40%, 35%, 30%, 25%, 20%, 15%, or 10% or the channel width. In some instances, the first zone may comprise about 50%, 55%, 60%, 65%, 70%, 75%, 80%, 85%, 90%, 95%, or more of the plurality of microstructures of the channel (e.g., within the length). The microfluidic channel may further comprise a second zone outside of the first zone. The second zone may comprise about or more than 5%, 10%, 15%, 20%, 25%, 30%, 35%, 40%, 45%, 50%, 55%, 60%, 65%, 70%, 75%, 80%, 85%, 90% of the plurality of microstructures of the channel (e.g., within the length). In some instances, the first zone may be equidistant from walls 1710 and 1712 of the channel.

Various Embodiments

In many aspects, a microfluidic channel is provided. The microfluidic channel may comprise a plurality of microstructures, previously described herein. For example, each microstructure of the plurality of microstructures may be identical to one another. The microfluidic channel may comprise a plurality of vortex regions. A vortex region as used herein may refer to a region in which one or more vortices are generated in in response to fluid flow. The vortices may be as previously described (e.g., two dimensional or three dimensional). In some instances, a vortex region may refer to a microstructure free zone, as previously described herein.

The plurality of vortex regions and/or microstructures may increase binding of particles of interest to the microfluidic channel, e.g., compared to microfluidic channels without microstructures. The plurality of microstructures (e.g., non uniformly distributed throughout the channel as previously described herein) and/or the plurality of vortex regions resulting from the distribution of microstructures my increase binding of particles of interest to the microfluidic channel, e.g., compared to microfluidic channels having a uniform distribution of microstructures throughout the channel. In some instances, a size of the vortex region and/or distribution of the vortex regions throughout the channel may be an important contributing factor to the aforementioned increase in binding of the particles of interest to the channel. For example, fairly sizable vortex regions distributed throughout (e.g., vortex regions each comprising a dimension at least 5% a width of the channel) may contribute to an increase in binding of the particles of interest. The increase in binding (e.g., due to the plurality of microstructures or the vortex regions) may be equal to about or at least 10%, 20%, 30%, 40%, 50%, 60%, 70%, 80%, 90%, or more.

In some instances, each vortex region of the plurality of vortex regions may comprise a volume. For example, each vortex region may comprise a cubic volume, a rectangular volume, a cylindrical volume, and the like. In some instances, each vortex region may comprise a volume having a height of a channel height. In some instances, each vortex region may comprise at least one dimension that is at least 5%, 10%, 15%, 20%, 25%, 30%, 35%, 40%, 45%, 50%, 55%, 60%, 65%, 70%, 75%, 80%, 85%, 90%, or 95% of a width of the channel. In some instances, each vortex region may comprise at least one dimension that is at most 5%, 10%, 15%, 20%, 25%, 30%, 35%, 40%, 45%, 50%, 55%, 60%, 65%, 70%, 75%, 80%, 85%, 90%, or 95% of a width of the channel. In some instances, each vortex region may comprise a cylindrical volume having a height of a channel (e.g., channel height) and a base having a diameter at least 5%, 10%, 15%, 20%, 25%, 30%, 35%, 40%, 45%, 50%, 55%, 60%, 65%, 70%, 75%, 80%, 85%, 90%, or 95% a width of the channel. In some instances, each vortex region may comprise a cylindrical volume having a height of a channel (e.g., channel height) and a base having a diameter at most 5%, 10%, 15%, 20%, 25%, 30%, 35%, 40%, 45%, 50%, 55%, 60%, 65%, 70%, 75%, 80%, 85%, 90%, or 95% a width of the channel.

In some instances, the plurality of vortex regions may collectively comprise a volume no more than 5%, 10%, 20%, 30%, 40%, 50%, 60%, 70%, 80%, or 90% of the volume of the channel. In some instances, the plurality of vortex regions comprise at least 5%, 10%, 15%, 20%, 25%, 30%, 35%, 40%, 45%, or 50% of the volume of the channel.

In some instances, each vortex region of the plurality of vortex regions may comprise a surface area of the channel. For example, each vortex region of the plurality of vortex regions may comprise a surface area of the channel ceiling, channel floor, or channel walls. In some instances, each vortex region of the plurality of vortex regions may comprise a surface area of the channel surface comprising the plurality of microstructures (e.g., channel ceiling). In some instances, each vortex region may comprise a square surface area, a rectangular surface area, a circular surface area, and the like. In some instances, each vortex region may comprise at least one dimension that is at least 5%, 10%, 15%, 20%, 25%, 30%, 35%, 40%, 45%, 50%, 55%, 60%, 65%, 70%, 75%, 80%, 85%, 90%, or 95% of a width of the channel. In some instances, each vortex region may comprise at least one dimension that is at most 5%, 10%, 15%, 20%, 25%, 30%, 35%, 40%, 45%, 50%, 55%, 60%, 65%, 70%, 75%, 80%, 85%, 90%, or 95% of a width of the channel. In some instances, each vortex region may comprise a diameter that is at least 5%, 10%, 15%, 20%, 25%, 30%, 35%, 40%, 45%, 50%, 55%, 60%, 65%, 70%, 75%, 80%, 85%, 90%, or 95% of a width of the channel. In some instances, each vortex region may comprise a diameter that is at most 5%, 10%, 15%, 20%, 25%, 30%, 35%, 40%, 45%, 50%, 55%, 60%, 65%, 70%, 75%, 80%, 85%, 90%, or 95% of a width of the channel.

In some instances, the plurality of vortex regions may collectively comprise a surface area no more than 10%, 20%, 30%, 40%, 50%, 60%, 70%, 80%, or 90% of the channel ceiling, floor or walls. In some instances, the plurality of vortex regions may collectively comprise a surface area at least 10%, 20%, 30%, 40%, 50%, 60%, 70%, 80%, or 90% of a surface area of the channel ceiling, floor, or walls.

Each vortex region of the plurality of vortex regions may be free of the plurality of microstructures. In some instances, each vortex region of the plurality of vortex regions may be substantially free of the plurality of microstructures. A vortex region being substantially free of the plurality of microstructures may have less than or equal to about 1%, 2%, 5%, 10%, 15%, 20%, 25%, 30%, 35%, 40%, 45%, 50%, 60%, 70%, 80%, or 90% of the plurality of microstructures within each of the vortex regions. In some instances, a vortex regions being substantially free of the plurality of microstructures may have less than or equal to about 1%, 2%, 5%, 10%, 15%, 20%, 25%, 30%, 35%, 40%, 45%, 50%, 60%, 70%, 80%, or 90% of a surface area of the vortex region comprised of microstructures. In some instances, the plurality of vortex regions may be substantially free of the plurality of microstructures collectively. The plurality of vortex regions beings substantially free of the plurality of microstructures collectively may have less than or equal to about 1%, 2%, 5%, 10%, 15%, 20%, 25%, 30%, 35%, 40%, 45%, 50%, 60%, 70%, 80%, or 90% of the plurality of microstructures within the plurality of vortex regions.

The plurality of vortex regions may be arranged in an ordered, or non-random pattern within the channel. An ordered pattern may comprise a symmetrical pattern. The symmetrical pattern may be about any axis of the channel. For example, the symmetrical pattern may be about a longitudinal axis of the channel (e.g., traversing the channel ceiling, channel floor, channel side walls, etc). In some instances, an ordered pattern may comprise a recurring pattern, a repeating pattern, or a palindromic pattern. The recurring pattern, repeating pattern, or palindromic pattern may be with respect to a channel length.

In some instances, the plurality of vortex regions may be arranged or located along one or more sides of the channel. A side of the channel may refer to a region outside of a middle 5%, 10%, 15%, 20%, 25%, 30%, 35%, 40%, 45%, 50%, 55%, or 60% of the channel measured about the channel width.

Thus, in one aspect, a microfluidic channel is provided. The microfluidic channel comprises: a plurality of microstructures within the channel arranged in a non-random pattern along a length of the channel, the non-random pattern configured to generate two dimensional vortices in a plurality of vortex regions in response to fluid flow through the channel.

In some embodiments, the plurality of vortex regions are located along one or more sides of the channel. In some embodiments, the plurality of vortex regions are arranged in an ordered pattern throughout the channel. In some embodiments, the ordered pattern is a symmetrical pattern. In some embodiments, wherein the plurality of vortex regions are substantially free of the plurality of microstructures. In some embodiments, the plurality of vortex regions are free of the plurality of microstructures. In some embodiments, the plurality of vortex regions comprise at least 10% of the volume of the channel. In some embodiments, each of the plurality of the vortex regions comprise at least one dimension that is at least 10% of a width of the channel. In some embodiments, the non-random pattern is a repeating pattern. In some embodiments, the non-random pattern is a palindromic pattern. In some embodiments, each of the two dimensional vortexes regions are separated by at least 0.5 mm along the channel length. In some embodiments, each of the two dimensional vortexes regions are separated by at least 0.1, 0.2, 0.3, 0.4, 0.5, 0.6, 0.7, 0.8, 0.9, 1, 1.2, 1.5, or 2 mm along the channel length. In some embodiments, each of the two dimensional vortex regions comprises a cylinder having a height of the channel and a base having a diameter of at least 10% of a width of the channel. In some embodiments, the plurality of microstructures are sufficient to cause an increase in binding of particles of interest to the channel by at least 50% compared to a channel without the plurality of microstructures. In some embodiments, the plurality of microstructures are sufficient to cause an increase in binding of particles of interest to the channel by at least 10%, 20%, 30%, 40%, 50%, 60%, 70%, 80%, or 90% compared to a channel without the plurality of microstructures. In some embodiments, the plurality of microstructures are arranged in a plurality of columns substantially parallel to one another and wherein each column of the plurality of columns comprises a column length equal to a distance from an outermost edge of a first microstructure to an outermost edge of a last microstructure in the column. In some embodiments, the plurality of columns comprise columns having a first length and columns having a second length greater than the first length, and wherein the first length is equal to or less than 50% of the second length. In some embodiments, the plurality of columns comprise columns having a first length and columns having a second length greater than the first length, and wherein the first length is equal to or less than 10%, 20%, 30%, 40%, 50%, 60%, 70%, 80%, or 90% of the second length. In some embodiments, the plurality of columns comprise columns having a first length and columns having a second length greater than the first length, and wherein each column having the first length is adjacent to at least another column having the first length. In some embodiments, the first length is a minimum length of the plurality of columns. In some embodiments, the plurality of columns comprise columns of at least three different lengths. In some embodiments, the plurality of columns comprise columns of at least two, three, four, five, six, seven, eight, nine, ten, or more different lengths. In some embodiments, the vortex regions are free of the plurality of microstructures. In some embodiments, each of vortex regions are at least 400 microns along the length of the channel. In some embodiments, the vortex regions are free of the plurality of microstructures. In some embodiments, each of vortex regions are at least 100, 200, 300, 400, 500, 600, 700, 800, 900, 1000, or more microns in length along the length of the channel. In some embodiments, the channel comprises a minimum distance between ends of microstructures measured along an axis parallel to a channel width and a maximum distance between ends of microstructures measured along the axis parallel to the channel width, and wherein the minimum distance is equal to or less than 50% of the maximum distance.

In another aspect, a microfluidic channel is provided. The channel comprises: a plurality of microstructures disposed within said channel, wherein the microfluidic channel is coated with a non-fouling layer and a set of binding moieties configured to selectively bind particles of interest, and wherein the plurality of microstructures is arranged in a pattern that results in an increase in binding of the particles of interest to the microfluidic channel by at least 10% as compared to a channel coated with the non-fouling layer and the set of binding moieties but without said microstructures.

In some instances, the plurality of microstructures are arranged in a pattern that results in an increase in binding of the particles of interest to the microfluidic channel by at least 20%, 30%, 40%, 50%, 60%, 70%, 80%, 90%, or more as compared to a channel coated with the non-fouling layer and the set of binding moieties but without said microstructures.

In some embodiments, the plurality of microstructures are arranged in a non-random pattern along a length of the channel. In some embodiments, the non-random pattern is a repeating pattern. In some embodiments, the non-random pattern is a palindromic pattern. In some embodiments, the plurality of microstructures are arranged in a plurality of columns substantially parallel to one another and wherein each column of the plurality of the columns comprises a column length equal to a distance from an outermost edge of a first microstructure to an outermost edge of a last microstructure in the column. In some embodiments, the plurality of columns comprise columns having a first length and columns having a second length greater than the first length, and wherein the first length is equal to or less than 50% of the second length. In some embodiments, the plurality of columns comprise columns having a first length and columns having a second length greater than the first length, and wherein the first length is equal to or less than about 10%, 20%, 30%, 40%, 50%, 60%, 70%, 80%, or 90% of the second length. In some embodiments, the plurality of columns comprise columns having a first length and columns having a second length greater than the first length, and wherein each column having the first length is adjacent to at least another column having the first length. In some embodiments, the first length is a minimum length of the plurality of columns. In some embodiments, the plurality of columns comprise columns of at least three different lengths. In some embodiments, the plurality of columns comprise columns of at least two, three, four, five, six, seven, eight, nine, ten, or more different lengths. In some embodiments, the channel comprises a plurality of vortex regions free of microstructures. In some embodiments, the plurality of vortex regions are located at repeating intervals along a length of the channel. In some embodiments, each of vortex regions are at least 400 microns along the length of the channel. In some embodiments, each of vortex regions are at least 100, 200, 300, 400, 500, 600, 700, 800, 900, 1000, or more microns in length along the length of the channel. In some embodiments, the channel comprises a minimum distance between ends of microstructures measured along an axis parallel to a channel width and a maximum distance between ends of microstructures measured along the axis parallel to the channel width, and wherein the minimum distance is equal to or less than 50% of the maximum distance. In some embodiments, the channel comprises a minimum distance between ends of microstructures measured along an axis parallel to a channel width and a maximum distance between ends of microstructures measured along the axis parallel to the channel width, and wherein the minimum distance is equal to or less than about 10%, 20%, 30%, 40%, 50%, 60%, 70%, 80%, or 90% of the maximum distance.

In another aspect, a microfluidic channel is provided. The channel comprises: a plurality of microstructures disposed within said channel, wherein the microfluidic channel is coated with a non-fouling layer and a set of binding moieties configured to selectively bind particles of interest, and wherein the plurality of microstructures is arranged in a non-uniform pattern throughout the channel that results in an increase in binding of the particles of interest to the microfluidic channel by at least 10% as compared to a channel coated with the non-fouling layer and the set of binding moieties, and with a uniform arrangement of microstructures disposed throughout the channel.

In some instances, the plurality of microstructures are arranged in a pattern that results in an increase in binding of the particles of interest to the microfluidic channel by at least 20%, 30%, 40%, 50%, 60%, 70%, 80%, 90%, or more as compared to a channel coated with the non-fouling layer, the set of binding moieties, and with a uniform arrangement of microstructures disposed throughout the channel.

In some embodiments, for any given length along the channel length, a distance measured along a channel width between outermost microstructures is within 5%, 10%, 20%, 30%, 40%, or 50% of any other distance measured along the channel width between outermost microstructures at a different length along the channel length for the uniform arrangement of microstructures disposed throughout the channel. In some embodiments, the plurality of microstructures are arranged in a non-random pattern along the channel length. In some embodiments, the non-random pattern is a repeating pattern. In some embodiments, the non-random pattern is a palindromic pattern. In some embodiments, the plurality of microstructures are arranged in a plurality of columns substantially parallel to one another and wherein each column of the plurality of columns comprises a column length equal to a distance from an outermost edge of a first microstructure to an outermost edge of a last microstructure in the column. In some embodiments, the plurality of columns comprise columns having a first length and columns having a second length greater than the first length, and wherein the first length is equal to or less than about 10%, 20%, 30%, 40%, 50%, 60%, 70%, 80%, or 90% of the second length. In some embodiments, the plurality of columns comprise columns having a first length and columns having a second length greater than the first length, and wherein each column having the first length is adjacent to at least another column having the first length. In some embodiments, the first length is a minimum length of the plurality of columns. In some embodiments, the plurality of columns comprise columns of at least two, three, four, five, six, seven, eight, nine, ten, or more different lengths. In some embodiments, the channel comprises a plurality of vortex regions free of microstructures. In some embodiments, the plurality of vortex regions are located at repeating intervals along a length of the channel. In some embodiments, each of vortex regions are at least 100 microns, 200 microns, 300 microns, 400 microns, 500 microns, 600 microns, 700 microns, 800 microns, 900 microns, 1000 microns, or more microns in length along the length of the channel. In some embodiments, the channel comprises a minimum distance between ends of microstructures measured along an axis parallel to a channel width and a maximum distance between ends of microstructures measured along the axis parallel to the channel width, and wherein the minimum distance is equal to or less than about 10%, 20%, 30%, 40%, 50%, 60%, 70%, 80%, or 90% of the maximum distance.

In another aspect, a microfluidic channel is provided. The channel comprises: a plurality of microstructures within the channel; and a plurality of vortex regions at which one or more vortexes are generated in response to fluid flow, wherein each vortex region is substantially free of the plurality of microstructures and comprises at least a cylindrical volume having (1) a height of the channel and (2) a base having a diameter at least 5% a width of the channel.

In some embodiments, the base has a diameter at least 10%, 15%, 20%, 25%, 30%, 35%, 40%, 45%, or 50% of a width of the channel. In some embodiments, the plurality of vortex regions are positioned in a non-random pattern along a length of the channel. In some embodiments, the non-random pattern is a repeating pattern. In some embodiments, the non-random pattern is a palindromic pattern. In some embodiments, the plurality of microstructures are arranged in a non-random pattern along a length of the channel. In some embodiments, the non-random pattern is a repeating pattern. In some embodiments, the non-random pattern is a palindromic pattern. In some embodiments, the plurality of microstructures are arranged in a plurality of columns substantially parallel to one another and wherein each column of the plurality of columns comprises a column length equal to a distance from an outermost edge of a first microstructure to an outermost edge of a last microstructure in the column. In some embodiments, the plurality of columns comprise columns having a first length and columns having a second length greater than the first length, and wherein the first length is equal to or less than about 10%, 20%, 30%, 40%, 50%, 60%, 70%, 80%, or 90% of the second length. In some embodiments, the plurality of columns comprise columns having a first length and columns having a second length greater than the first length, and wherein each column having the first length is adjacent to at least another column having the first length. In some embodiments, the first length is a minimum length of the plurality of columns. In some embodiments, the plurality of columns comprise columns of at least two, three, four, five, six, seven, eight, nine, ten, or more different lengths. In some embodiments, each of vortex regions are at least 100 microns, 200 microns, 300 microns, 400 microns, 500 microns, 600 microns, 700 microns, 800 microns, 900 microns, 1000 microns, or more microns in length along the length of the channel. In some embodiments, the channel comprises a minimum distance between ends of microstructures measured along an axis parallel to a channel width and a maximum distance between ends of microstructures measured along the axis parallel to the channel width, and wherein the minimum distance is equal to or less than about 10%, 20%, 30%, 40%, 50%, 60%, 70%, 80%, or 90% of the maximum distance.

In another aspect, a microfluidic channel comprising a channel width, a channel height, and a channel length, wherein the microfluidic channel comprises a plurality of microstructures disposed therein is provided. The channel comprises: a first zone comprising the channel height, a width equal to or less than 40% of the channel width, and a length equal to or more than 10% of the channel length, wherein the first zone comprises 60% or more of the plurality of microstructures of the channel within the length; and a second zone outside of the first zone.

In some instances, the first zone comprises a width equal to or less than about 70%, 60%, 50%, 40%, 30%, 20%, or 10% of the channel width. In some instances, the first zone comprises a length equal to or more than 10%, 15%, 20%, 25%, 30%, 40%, 45%, 50%, 55%, 60%, 65%, 70%, 75%, 80%, 85%, 90%, 95%, or 100% of the channel length. In some instances, the first zone comprises about 30%, 40%, 50%, 60%, 70%, 80%, or 90% or more of the plurality of microstructures. In some instances, the first zone comprises a width equal to or less than about 40% of the channel width and 60% or more of the plurality of microstructures. In some instances, the percentage of the plurality of microstructures in the first zone referred to above refers to, or depends on $$\frac{\text{a number of microstructures within the first zone}}{\text{a total number of microstructures within the channel}}.$$

In some instances, the percentage of the plurality of microstructures in the first zone referred to above refers to, or depends on $$\frac{\text{a volume of microstructures within the first zone}}{\text{a total volume of microstructures within the channel}}.$$

In some instances, the percentage of the plurality of microstructures in the first zone referred to above refers to, or depends on $$\frac{\text{a surface area of microstructures within the first zone}}{\text{a total surface area of microstructures within the channel}}.$$

In some instances, the percentage of the plurality of microstructures in the first zone referred to above refers to, or depends on $$\frac{\begin{array}{c}\text{a surface area of the channel in contact}\\ \text{with microstructures within the first zone}\end{array}}{\begin{array}{c}\text{a surface area of the channel in contact}\\ \text{with microstructures within the channel}\end{array}}.$$

In some embodiments, the second zone comprises equal to or more than about 5%, 10%, 15%, 20%, 25%, 30%, 35%, or 40% of the plurality of microstructures. In some embodiments, the second zone comprises equal to or less than about 5%, 10%, 15%, 20%, 25%, 30%, 35%, or 40% of the plurality of microstructures. In some embodiments, the second zone is substantially free of the plurality of microstructures. In some embodiments, the second zone is free of the plurality of microstructures. In some embodiments, the second zone comprises less than about 1%, 5%, 10%, 15%, 20%, 25%, 30%, 35%, or 40% of all microstructure volume. In some embodiments, the second zone comprises more than about 1%, 5%, 10%, 15%, 20%, 25%, 30%, 35%, or 40% of all microstructure volume. In some embodiments, the second zone is configured for generating a plurality of two dimensional vortices. In some embodiments, the second zone comprises a plurality of vortex regions configured for generating a plurality of two dimensional vortices. In some embodiments, the first zone comprises a width equal to or less than 30% of the channel width. In some embodiments, the first zone comprises 70% or more of the plurality of microstructures. In some embodiments, one or more vortexes are generated at regular intervals along the channel length. In some embodiments, the one or more vortexes are generated in the second zone. In some embodiments, the first zone is equidistant from walls of the channel. In some embodiments, the plurality of microstructures are arranged on an upper surface of the channel. In some embodiments, the plurality of microstructures are arranged in a non-random pattern along a length of the channel. In some embodiments, the non-random pattern is a repeating pattern. In some embodiments, wherein the non-random pattern is a palindromic pattern. In some embodiments, the plurality of microstructures are arranged in a plurality of columns substantially parallel to one another and wherein each column of the plurality of columns comprises a column length equal to a distance from an outermost edge of a first microstructure to an outermost edge of a last microstructure in the column. In some embodiments, the plurality of columns comprise columns having a first length and columns having a second length greater than the first length, and wherein the first length is equal to or less than about 10%, 20%, 30%, 40%, 50%, 60%, 70%, 80%, or 90% of the second length. In some embodiments, the plurality of columns comprise columns having a first length and columns having a second length greater than the first length, and wherein each column having the first length is adjacent to at least another column having the first length. In some embodiments, the first length is a minimum length of the plurality of columns. In some embodiments, the plurality of columns comprise columns of at least three different lengths. In some embodiments, the second zone comprises vortex regions. In some embodiments, the vortex regions are at least 100 microns, 200 microns, 300 microns, 400 microns, 500 microns, 600 microns, 700 microns, 800 microns, 900 microns, 1000 microns, or more microns in length along the length of the channel. In some embodiments, the vortex regions are located in a non-random pattern within the second zone. In some embodiments, the non-random pattern is a repeating pattern along the channel length. In some embodiments, the non-random pattern is a palindromic pattern along the channel length. In some embodiments, the channel comprises a minimum distance between ends of microstructures measured along an axis parallel to a channel width and a maximum distance between ends of microstructures measured along the axis parallel to the channel width, and wherein the minimum distance is equal to or less than about 10%, 20%, 30%, 40%, 50%, 60%, 70%, 80%, or 90% of the maximum distance. In some embodiments, the first zone is continuous. In some embodiments, the second zone is discontinuous.

In another aspect, a microfluidic channel having a channel width, a channel height, and a channel length extending from an inlet to an outlet of the channel, wherein the microfluidic channel comprises a plurality of microstructures disposed therein is provided. The channel comprises: a first zone comprising the channel height, the channel length, a width equal to or less than about 80% of the channel width, wherein the first zone comprises about 20% or more of the plurality of microstructures; and a second zone outside of the first zone.

In some instances, the first zone comprises a width equal to or less than about 70%, 60%, 50%, 40%, 30%, 20%, or 10% of the channel width. In some instances, the first zone comprises about 30%, 40%, 50%, 60%, 70%, 80%, or 90% or more of the plurality of microstructures. In some instances, the first zone comprises a width equal to or less than about 40% of the channel width and 60% or more of the plurality of microstructures. In some instances, the percentage of the plurality of microstructures in the first zone referred to above refers to, or depends on $$\frac{\text{a number of microstructures within the first zone}}{\text{a total number of microstructures within the channel}}.$$

In some instances, the percentage of the plurality of microstructures in the first zone referred to above refers to, or depends on $$\frac{\text{a volume of microstructures within the first zone}}{\text{a total volume of microstructures within the channel}}.$$

In some instances, the percentage of the plurality of microstructures in the first zone referred to above refers to, or depends on $$\frac{\text{a surface area of microstructures within the first zone}}{\text{a total surface area of microstructures within the channel}}.$$

In some instances, the percentage of the plurality of microstructures in the first zone referred to above refers to, or depends on $$\frac{\text{a surface area of the channel in contact with microstructures within the first zone}}{\text{a surface area of the channel in contact with microstructures within the channel}}.$$

In some embodiments, the second zone comprises equal to or more than about 5%, 10%, 15%, 20%, 25%, 30%, 35%, or 40% of the plurality of microstructures. In some embodiments, the second zone comprises equal to or less than about 5%, 10%, 15%, 20%, 25%, 30%, 35%, or 40% of the plurality of microstructures. In some embodiments, the second zone is substantially free of the plurality of microstructures. In some embodiments, the second zone is free of the plurality of microstructures. In some embodiments, the second zone comprises less than about 1%, 5%, 10%, 15%, 20%, 25%, 30%, 35%, or 40% of all microstructure volume. In some embodiments, the second zone comprises more than about 1%, 5%, 10%, 15%, 20%, 25%, 30%, 35%, or 40% of all microstructure volume. In some embodiments, the second zone is configured for generating a plurality of two dimensional vortices. In some embodiments, the second zone comprises a plurality of vortex regions configured for generating a plurality of two dimensional vortices. In some embodiments, the first zone comprises a width equal to or less than 30% of the channel width. In some embodiments, the first zone comprises 70% or more of the plurality of microstructures. In some embodiments, one or more vortexes are generated at regular intervals along the channel length. In some embodiments, the one or more vortexes are generated in the second zone. In some embodiments, the first zone is equidistant from walls of the channel. In some embodiments, the plurality of microstructures are arranged on an upper surface of the channel. In some embodiments, the plurality of microstructures are arranged in a non-random pattern along a length of the channel. In some embodiments, the non-random pattern is a repeating pattern. In some embodiments, wherein the non-random pattern is a palindromic pattern. In some embodiments, the plurality of microstructures are arranged in a plurality of columns substantially parallel to one another and wherein each column of the plurality of columns comprises a column length equal to a distance from an outermost edge of a first microstructure to an outermost edge of a last microstructure in the column. In some embodiments, the plurality of columns comprise columns having a first length and columns having a second length greater than the first length, and wherein the first length is equal to or less than about 10%, 20%, 30%, 40%, 50%, 60%, 70%, 80%, or 90% of the second length. In some embodiments, the plurality of columns comprise columns having a first length and columns having a second length greater than the first length, and wherein each column having the first length is adjacent to at least another column having the first length. In some embodiments, the first length is a minimum length of the plurality of columns. In some embodiments, the plurality of columns comprise columns of at least three different lengths. In some embodiments, the second zone comprises vortex regions. In some embodiments, the vortex regions are at least 100 microns, 200 microns, 300 microns, 400 microns, 500 microns, 600 microns, 700 microns, 800 microns, 900 microns, 1000 microns, or more microns in length along the length of the channel. In some embodiments, the vortex regions are located in a non-random pattern within the second zone. In some embodiments, the non-random pattern is a repeating pattern along the channel length. In some embodiments, the non-random pattern is a palindromic pattern along the channel length. In some embodiments, the channel comprises a minimum distance between ends of microstructures measured along an axis parallel to a channel width and a maximum distance between ends of microstructures measured along the axis parallel to the channel width, and wherein the minimum distance is equal to or less than about 10%, 20%, 30%, 40%, 50%, 60%, 70%, 80%, or 90% of the maximum distance. In some embodiments, the first zone is continuous. In some embodiments, the second zone is discontinuous.

In another aspect, a microfluidic channel is provided. The channel comprises: a plurality of columns substantially parallel to one another, the plurality of columns comprising columns having a first length and columns having a second length, wherein the second length is greater than the first length by about 10% or more, and wherein the plurality of columns comprise a non-random pattern along the channel length.

In some embodiments, the second length is greater than the first length by about 20%, 30%, 40%, 50%, 60%, 70%, 80%, 90%, 100%, or more.

In some embodiments, the non-random pattern is a repeating pattern. In some embodiments, the non-random pattern is a palindromic pattern. In some embodiments, a length of each column of the plurality of columns is measured along a width of the channel. In some embodiments, the non-random pattern is repeated about 5, 10, 15, 20, 25, 30 or more times within the channel. In some embodiments, each column of the plurality of columns are comprised of one or more microstructures. In some embodiments, a length of each column of the plurality of column corresponds to a number of microstructures the column is comprised of. In some embodiments, each column of the plurality of columns comprises of one or more identically shaped and/or identically sized microstructure. In some embodiments, the plurality of columns are arranged on an upper surface of the channel. In some embodiments, a longitudinal axis of each column of the plurality of columns are parallel to one another. In some embodiments, the plurality of columns comprise columns of at least two, three, four, five, six, seven, eight, nine, ten or more different lengths. In some embodiments, the plurality of columns comprise a first type (c1) of column having the minimum length, a second type (c2) of column having an intermediate length between the minimum length and the maximum length, and a third type (c3) of column having the maximum length, and wherein the palindromic pattern is formed of consecutive columns along the direction of fluid flow having a following type: c1 c2 c3 c2 c1. In some embodiments, a center of the column length of each column of the plurality of columns aligns within the channel. In some embodiments, the plurality of columns are substantially parallel to one another along a channel width. In some embodiments, the plurality of column are substantially parallel to one another with respect to a width of the channel.

In another aspect, a microfluidic channel is provided. The channel comprises: a plurality of columns substantially parallel to one another, the plurality of columns comprising columns having a first length and columns having a second length, wherein the second length is greater than the first length, wherein each column having the first length is adjacent to at least another column having the first length, and wherein the plurality of columns comprise a non-random pattern along the channel length.

In some embodiments, the non-random pattern is a repeating pattern. In some embodiments, the non-random pattern is a palindromic pattern. In some embodiments, a length of each column of the plurality of columns is measured along a width of the channel. In some embodiments, the non-random pattern is repeated about 5, 10, 15, 20, 25, 30 or more times within the channel. In some embodiments, each column of the plurality of columns are comprised of one or more microstructures. In some embodiments, a length of each column of the plurality of columns corresponds to a number of microstructures the column is comprised of. In some embodiments, each microstructure is identical. In some embodiments, the plurality of columns are arranged on an upper surface of the channel. In some embodiments, a longitudinal axis of each column of the plurality of columns are parallel to one another. In some embodiments, the plurality of columns comprise columns of at least two, three, four, five, six, seven, eight, nine, ten or more different lengths. In some embodiments, the plurality of columns comprise a first type (c1) of column having the minimum length, a second type (c2) of column having an intermediate length between the minimum length and the maximum length, and a third type (c3) of column having the maximum length, and wherein the palindromic pattern is formed of consecutive columns along the direction of fluid flow having a following type: c1 c2 c3 c2 c1. In some embodiments, a center of the column length of each column of the plurality of columns aligns within the channel. In some embodiments, the plurality of columns are substantially parallel to one another along a channel width. In some embodiments, the plurality of column are substantially parallel to one another with respect to a width of the channel.

In another aspect, a method for binding particles of interest is provided. The method comprises: flowing a sample comprising particles of interest through any of the aforementioned microfluidic channels; and binding the particles of interest to the columns or the microstructures.

In some embodiments, the flowing comprises a linear velocity of at least 2.5 mm/s. In some embodiments, the flowing comprises a linear velocity of at most 4 mm/s. In some embodiments, flowing comprises creating vortexes at repeating intervals along the length of the channel. In some embodiments, the vortexes direct the particles of interest to a surface of the channel. In some embodiments, the method further comprises releasing the particles of interest from the microstructures.

In another aspect, a method for capturing particles of interest from a fluid sample is provided. The method comprises: flowing the sample comprising the particles of interest through a microfluidic channel having one or more microstructures coated with a non-fouling layer and one or more binding moieties that selectively bind the particles of interest to thereby generate a plurality of two dimensional vortices within the microfluidic channel, wherein each of the two dimensional vortices comprises a horizontal fluid vector and a vertical fluid vector and bind the particles of interest to a surface of the channel.

In some embodiments, the two dimensional vortex comprises a diameter of at least 10% of a width of the channel. In some embodiments, the surface of the channel comprises microstructures. In some embodiments, the flowing comprises a linear velocity of at least 2.5 mm/s. In some embodiments, the flowing comprises a linear velocity of at most 4 mm/s. In some embodiments, the two dimensional vortexes are generated in a non-random pattern along a length of the channel. In some embodiments, the two dimensional vortexes are generated at repeating intervals along a length of the channel. In some embodiments, the two dimensional vortex directs the particles of interest to a surface of the channel. In some embodiments, the method further comprises releasing the particles of interest from the microstructures.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A microfluidic channel comprising:

a plurality of microstructures within the channel; wherein the plurality of microstructures is arranged in a plurality of columns substantially parallel to one another, wherein the plurality of columns comprise at least four columns comprising a first column adjacent to a second column, the second column adjacent to a third column, and the third column adjacent to a fourth column; wherein the number of microstructures in the first column is greater than the number of microstructures in the second column or the third column; and wherein the number of microstructures in the fourth column is greater than the number of microstructures in the second column or the third column; and a plurality of vortex regions at which one or more vortexes are generated in response to fluid flow, wherein each vortex region of the plurality is substantially free of the plurality of microstructures and comprises at least a cylindrical volume having (1) a height of the channel and (2) a base having a diameter at least 20% a width of the channel, wherein the plurality of vortex regions of the plurality are separated from each other by at least one microstructure along a length of the channel; and wherein said vortex regions are configured to increase the mixing of particles of interest and thereby to increase the likelihood of binding particles of interest to a microstructure.

2. The channel of claim 1, wherein each vortex region of the plurality comprises at least a rectangular volume having (1) a height of the channel, (2) a width equal to the diameter, and (3) a length at least 30% a width of the channel.

3. The channel of claim 1, wherein the plurality of vortex regions are positioned in a palindromic pattern along the length of the channel.

4. The channel of claim 1, wherein the plurality of vortex regions are positioned in a repeating pattern along the length of the channel.

5. The channel of claim 1, wherein the plurality of microstructures are arranged in a plurality of columns substantially parallel to one another and wherein each column of the plurality of columns comprises a column length equal to a distance from an outermost edge of a first microstructure to an outermost edge of a last microstructure in the column.

6. The channel of claim 5, wherein the plurality of columns comprise columns having a first length and columns having a second length greater than the first length, and wherein the first length is equal to or less than 60% of the second length.

7. The channel of claim 5, wherein the plurality of columns comprise columns having a first length and columns having a second length greater than the first length, and wherein each column having the first length is adjacent to at least another column having the first length.

8. The channel of claim 1, wherein the channel comprises a minimum distance between ends of microstructures measured along an axis parallel to a channel width and a maximum distance between ends of microstructures measured along the axis parallel to the channel width, and wherein the minimum distance is equal to or less than 60% of the maximum distance.

9. The channel of claim 5, wherein the each column of the plurality comprises a linear arrangement of microstructures perpendicular to the fluid flow pathway.

10. The channel of claim 7, wherein the plurality of columns are arranged in pattern of columns having 3, 2, 1, 1, 2, 3, 2, 1, 1, 2, 3 microstructures.

11. The channel of claim 1, wherein the channel is coated with a non-fouling layer and a set of binding moieties configured to selectively bind particles of interest.

12. The channel of claim 1, wherein the one or more vortexes are two dimensional vortexes.

13. The channel of claim 1, wherein the one or more vortexes are three dimensional vortexes.

14. The channel of claim 5, wherein a center of each column of the plurality of columns aligns with one another within the channel.

15. The channel of claim 1, wherein the one or more vortexes are generated at regular intervals along the length of the channel.

16. The channel of claim 5, wherein the column length is measured along a width of the channel, and wherein the plurality of columns comprise columns having a minimum length and columns having a maximum length greater than the minimum length.

17. The channel of claim 16, wherein each column having the minimum length comprises a single microstructure.

18. The channel of claim 16, wherein each column having the maximum length comprises three microstructures.

19. The channel of claim 1, wherein each of the plurality of vortex regions is separated from another by at least one whole microstructure along the length of the channel.

20. The microfluidic device of claim 1, wherein the number of microstructures in the second column is the same as the number of microstructures in the third column.

21. The microfluidic device of claim 1, wherein the number of microstructures in the first column is greater than the number of microstructures in the second column and the number of microstructures in the first column is greater than the number of microstructures in the third column.

22. The microfluidic device of claim 1, wherein the number of microstructures in the fourth column is greater than the number of microstructures in the second column and the number of microstructures in the fourth column is greater than the number of microstructures the third column.

23. The microfluidic device of claim 21, wherein the number of microstructures in the fourth column is greater than the number of microstructures in the second column and the number of microstructures in the fourth column is greater than the number of microstructures the third column.

24. The microfluidic device of claim 1, wherein the number of microstructures in the first column is greater than the number of microstructures in the third column and the number of microstructures in the first column is equal to the number of microstructures in the second column.

* * * * *